United States Patent [19]
Miyajima et al.

[11] Patent Number: 5,978,071
[45] Date of Patent: Nov. 2, 1999

[54] PROJECTION EXPOSURE APPARATUS AND METHOD IN WHICH MASK STAGE IS MOVED TO PROVIDE ALIGNMENT WITH A MOVING WAFER STAGE

[75] Inventors: Hideyuki Miyajima, Kawasaki; Susumu Makinouchi, Zama; Kazuya Ota, Tokyo, all of Japan

[73] Assignee: Nikon Corporation, Tokyo, Japan

[21] Appl. No.: 09/084,211

[22] Filed: May 26, 1998

Related U.S. Application Data

[63] Continuation of application No. 08/692,225, Aug. 7, 1996, abandoned, which is a continuation-in-part of application No. 08/569,929, Dec. 8, 1995, abandoned, which is a continuation-in-part of application No. 08/382,495, Feb. 2, 1995, abandoned, which is a continuation-in-part of application No. 08/359,852, Dec. 20, 1994, abandoned, which is a continuation of application No. 08/178,805, Jan. 5, 1994, abandoned.

[30] Foreign Application Priority Data

| Jan. 7, 1993 | [JP] | Japan | 5-001135 |
| Feb. 3, 1994 | [JP] | Japan | 6-011666 |
| Dec. 8, 1994 | [JP] | Japan | 6-304697 |
| Aug. 8, 1995 | [JP] | Japan | 7-201991 |

[51] Int. Cl.$^6$ ............................ G03B 27/42; G03B 27/52; G03B 27/54; G03B 27/72
[52] U.S. Cl. .................... 355/53; 355/55; 355/67; 355/71; 355/77
[58] Field of Search .................. 355/53, 55, 67, 355/71, 77

[56] References Cited

U.S. PATENT DOCUMENTS

| Re. 33,836 | 3/1992 | Resor, III et al. | 355/42 |
| 4,057,347 | 11/1977 | Moriyama et al. | 355/67 |
| 4,362,385 | 12/1982 | Lobach | 355/77 O |
| 4,659,225 | 4/1987 | Takahashi | 356/358 |
| 4,669,867 | 6/1987 | Uda et al. | 355/53 |
| 4,711,567 | 12/1987 | Tanimoto | 355/53 |
| 4,769,680 | 9/1988 | Resor, III et al. | 355/43 |
| 4,780,617 | 10/1988 | Umatate et al. | 250/548 |
| 4,803,524 | 2/1989 | Ohno et al. | 355/53 |
| 5,137,349 | 8/1992 | Taniguchi et al. | 353/122 |
| 5,194,893 | 3/1993 | Nishi | 355/53 O |
| 5,214,489 | 5/1993 | Mizutani et al. | 356/400 X |
| 5,227,839 | 7/1993 | Allen | 355/53 |
| 5,255,051 | 10/1993 | Allen | 355/77 |
| 5,270,771 | 12/1993 | Sato | 355/53 |
| 5,309,197 | 5/1994 | Mori et al. | 355/53 |
| 5,477,304 | 12/1995 | Nishi | 355/53 |
| 5,734,478 | 3/1998 | Magome et al. | 356/401 |

FOREIGN PATENT DOCUMENTS

| 2-15614 | 1/1990 | Japan . |
| 2-133913 | 5/1990 | Japan . |
| 5-114544 | 5/1993 | Japan . |
| 5-152190 | 6/1993 | Japan . |

*Primary Examiner*—Richard Moses
*Assistant Examiner*—Shival Virmani
*Attorney, Agent, or Firm*—Vorys, Sater, Seymour and Pease LLP

[57] ABSTRACT

A projection exposure apparatus for positioning, for each shot provided on a wafer, a pattern formed on a mask with respect to the wafer and also for exposing the pattern on the wafer includes a wafer stage carrying the wafer and movable stepwise for each shot, a mask stage carrying the mask and movable, a stage control unit for making relative positioning between the wafer and the pattern of the mask and maintaining the relative positioning so that the stage control unit moves the mask stage to make the relative positioning before the wafer stage stops for each shot, and an exposure control unit for performing exposure while the relative positioning is maintained.

53 Claims, 20 Drawing Sheets

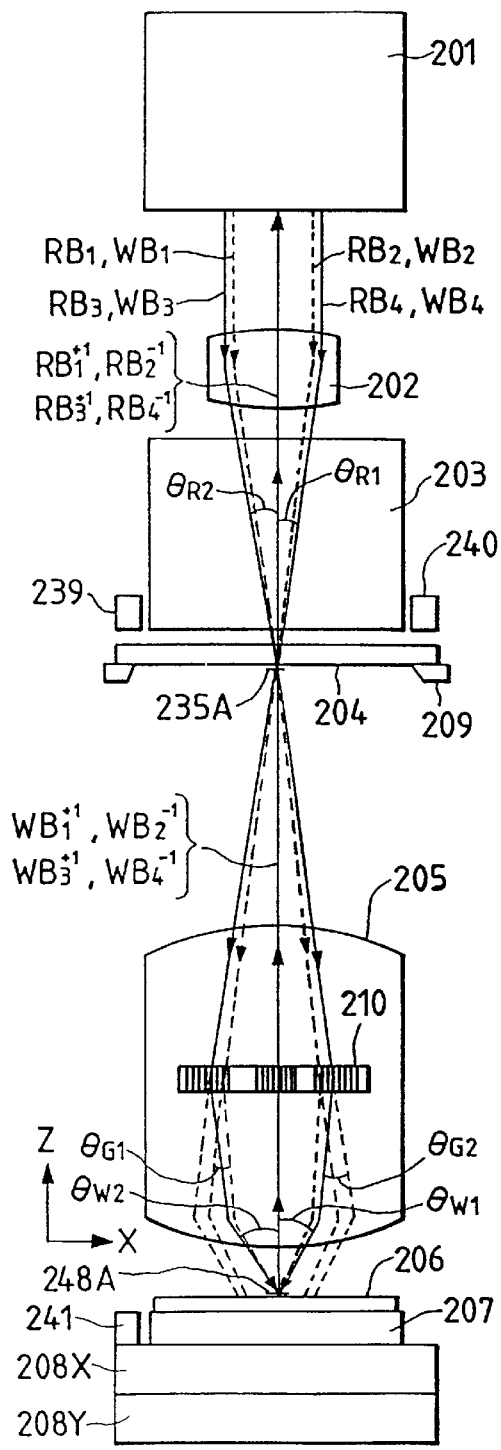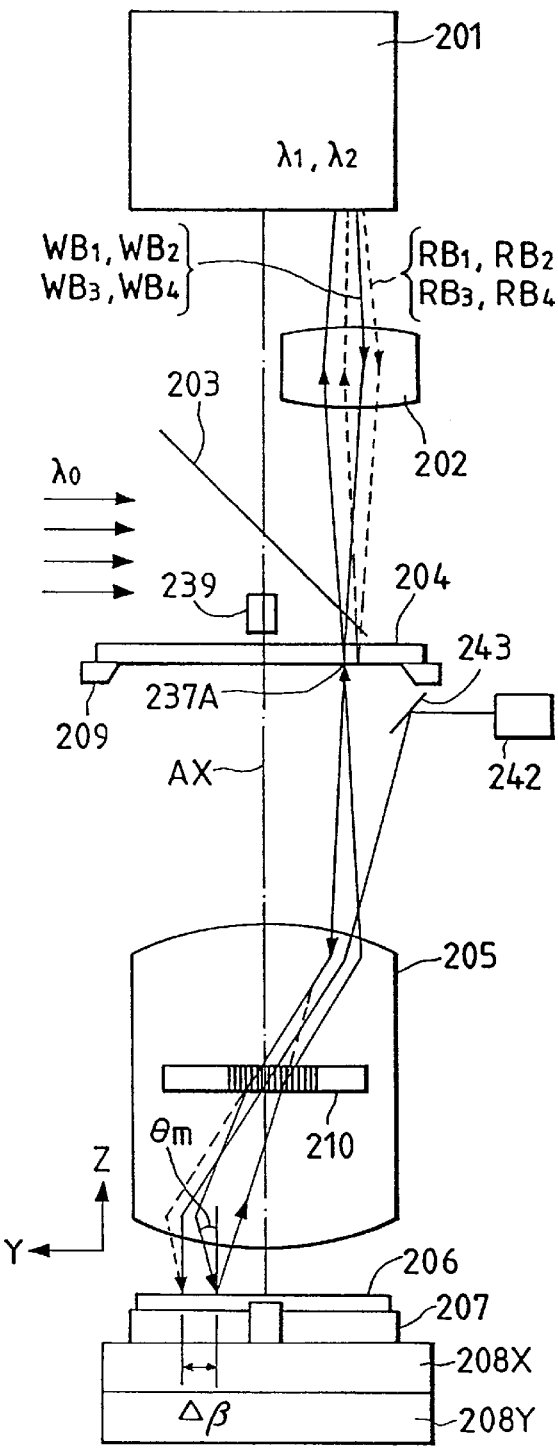

FIG. 18A FIG. 18B
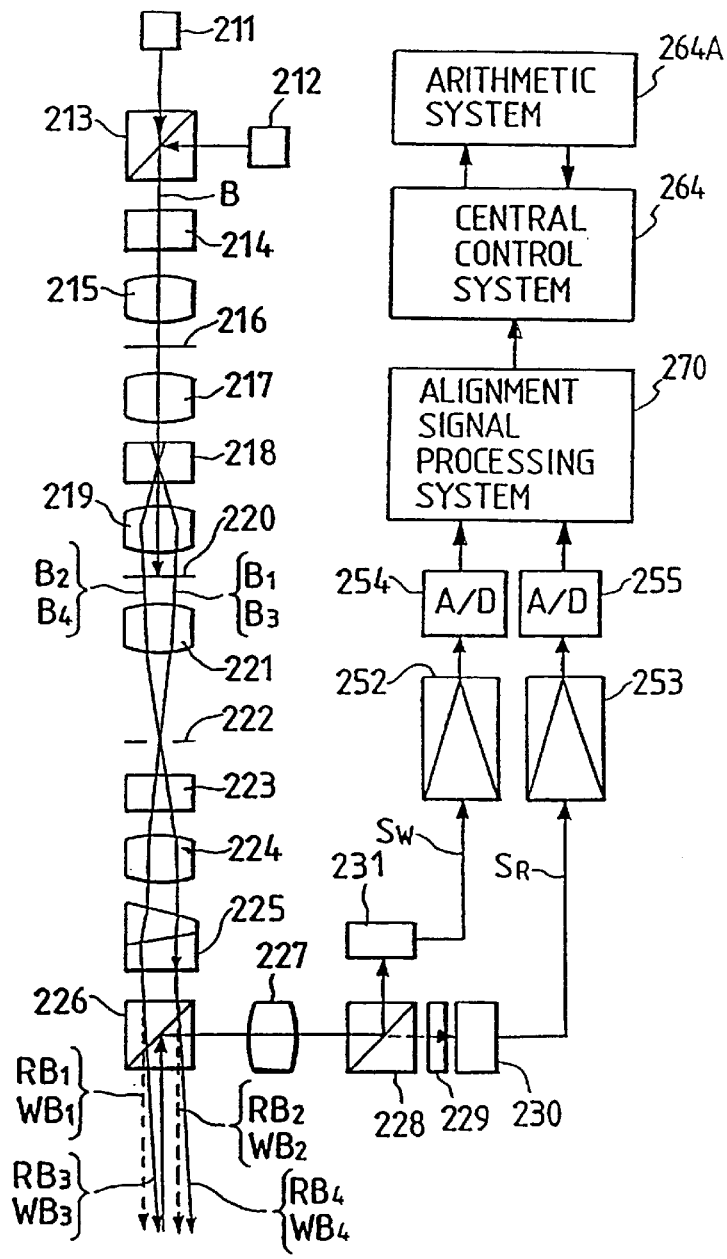
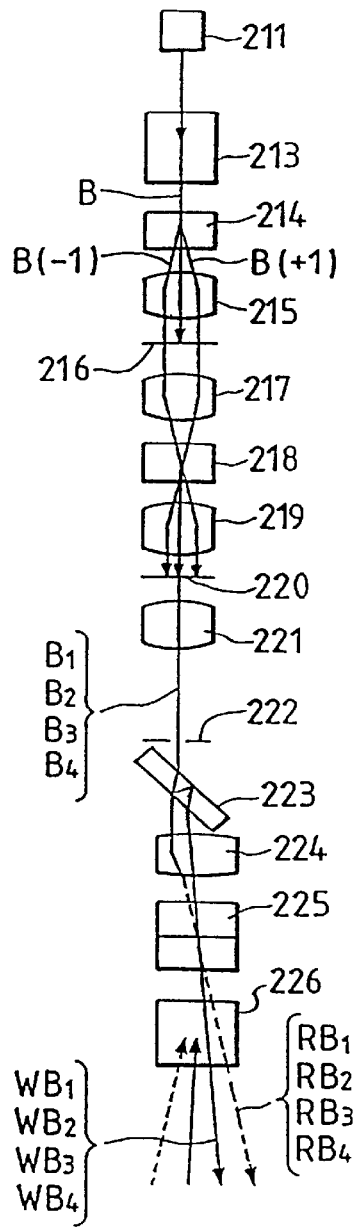
FIG. 18C
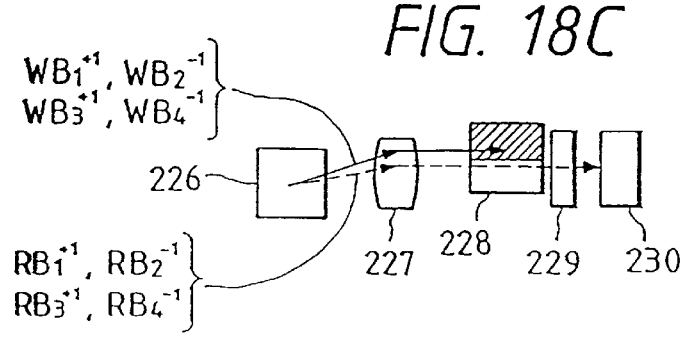

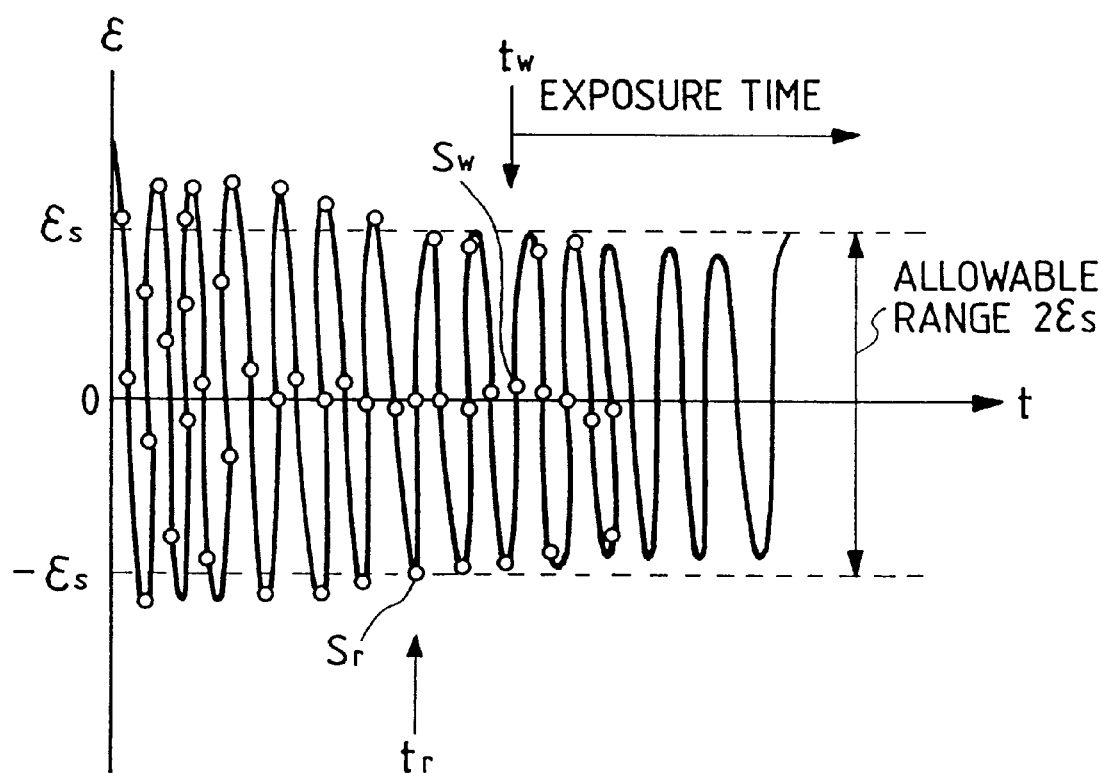

PROJECTION EXPOSURE APPARATUS AND METHOD IN WHICH MASK STAGE IS MOVED TO PROVIDE ALIGNMENT WITH A MOVING WAFER STAGE

This application is a continuation of application Ser. No. 08/692,225 filed Aug. 7, 1996 (abandoned), which is a continuation-in-part of application Ser. No. 08/596,929 filed Dec. 8, 1995 (abandoned), which is a continuation-in-part of application Ser. No. 08/382,495 filed Feb. 2, 1995 (abandoned), which is a continuation-in-part of application Ser. No. 08/359,852 filed Dec. 20, 1994 (abandoned), which is a continuation of application Ser. No. 08/178,805 filed Jan. 5, 1994 (abandoned).

BACKGROUND OF THE INVENTION

1. Field of the Invention

The present invention relates to a projection exposure apparatus and an exposure method and more particularly to a projection exposure apparatus and an exposure method of a step and repeat type used for manufacturing semiconductors, liquid crystal substrates, magnetic heads and the like by a lithographical process.

2. Related Background Art

In order to manufacture semiconductors, liquid crystal substrates by the lithographical process, a projection exposure apparatus of a step and repeat type known as a stepper is used which projects the pattern image of a mask of a photomask, a reticles or the like on a light sensitive substrate mounted on a stage through a projection optical system. With the projection exposure apparatus of a step and repeat type, a wafer stage on which a light sensitive substrate such as a wafer is mounted is moved to and set at a predetermined position, and exposure is repeated to transfer a mask pattern onto a wafer after the wafer stage has stopped.

In the projection exposure apparatus, it has recently been required that a movable stage carrying a wafer or the like be stopped at the required position more accurately at a higher efficiency. Generally, the wafer stage mechanism of the exposure apparatus comprises a supporting mechanism for a wafer including a stage and a driving mechanism for the stage and forms a specific vibration system.

FIG. 7 shows a conventional projection exposure apparatus of this type which will now be described briefly. Illuminating light L1 emitted from a light source (not shown) such as a mercury lamp is incident on a reticle 5 such as a photomask through an illuminating system (not shown). The reticle 5 is mounted on a reticle stage 6 and positioned so that the center of the reticle substantially coincides with the optical axis AX of a projection optical system 8. The illuminating light IL which has passed through the reticle 5 arrives at a wafer 10 through the optical system 8 and focuses, on the wafer 10, the pattern formed on the reticle 5. The wafer 10 is loaded on a wafer stage 11. The wafer stage 11 can make stepping movement two-dimensionally in a plane substantially perpendicular to the optical axis AX and is finely adjustable along the optical axis AX. The wafer stage 11 is moved by a motor 9. A wafer stage control system (WS control system) 15 outputs a signal S1 for controlling the motor 9 based on aimed position information from a host computer 16. The motor control signal S1 is inputted to the motor 9 through a digital-analog converter (DAC) 14 and a power amplifier 13. The WS control system 15 detects the position of the wafer stage 11 at a predetermined resolving power (for example, 0.01 μm as a unit) by a wafer stage interferometer (WS interferometer) 12. The WS control system 15 moves the wafer stage to the aimed position and performs exposure. The aimed position is obtained by a method disclosed in the specification of U.S. Pat. No. 4,780,617 or the like. Namely, the aimed position is obtained by measuring several shots on the wafer as sample shots by means of an alignment sensor and obtaining arrangement coordinates of each shot by the use of statistical arithmetic analysis.

If the positional accuracy of only the wafer stage increases when the wafer stage is moved to the aimed position in the conventional technology, positioning reproduction accuracy and throughput are likely to be lowered.

Namely, when fine-positioning is made, dynamic characteristic factors such as fluctuation of the wafer stage and play of bolts are likely to vary. Thus, it is difficult to improve positioning reproduction accuracy per shot. For this reason, it is difficult to enhance the positioning reproduction accuracy for only the wafer stage.

Damped oscillation occurs to the wafer stage by an inertia produced by the speed reduction and stoppage of the wafer stage. Thus, exposure cannot be performed until the oscillation is attenuated fully and the wafer stage stops completely, and waiting time for attenuation lowers throughput.

If response of the wafer stage to the motor is improved in order to increase the positioning reproduction accuracy, the damping-force for the oscillation becomes insufficient. Thus, the waiting time for oscillation attenuation increases and the throughput is lowered.

There has been proposed a method for servo-controlling only the mask stage and the wafer stage by using the same length measuring system for measuring the positions of the mask stage and the wafer stage. When, however, deviation between the mask stage and the wafer stage is large, the servo control cannot be performed until the oscillation of the wafer stage is attenuated fully because of the limitation of the driving stroke of the mask stage and the response speed.

In the projection exposure apparatus used for manufacturing semiconductors or the liquid crystal display devices and so forth, especially when forming a circuit pattern on the second and subsequent layers on a wafer (or a glass plate, etc.), it is required that a reticle be aligned with the wafer at a high accuracy. A global alignment conceived as a typical alignment operation involves a step of measuring a position of the wafer (or a relative position of the wafer to the reticle) by use of an alignment sensor and a step of positioning the wafer on the basis of a measured result given by the alignment sensor and exposing it. Even when the alignment sensor performs a correct measurement, it follows that a positional deviation between the reticle and the wafer is caused if positioning of the wafer in a target position can not be effected exactly on the occasion of positioning of the wafer in an exposing position.

Generally, after measuring a position of each shot area on the wafer by, e.g., a TTL (Through The Lens) method or an off-axis alignment sensor, and when positioning of an exposing target shot area in the exposing position is effected, a laser interferometer monitors a position of a wafer stage in a state where the reticle is made static. Then, it is confirmed that the wafer stage exists within a given allowable value with respect to the target position, and, thereafter, the exposure is started. Specifically, for a predetermined fixed time, there is checked whether or not a deviation from the target position of the wafer stage (this may also be conceived as a relative position to the reticle) enters a predetermined window (two-dimensional allowable zone). For example, this is determined by knowing whether or not the deviation falls within ±40 nm for a time of 20 ms.

Further, in a projection exposure apparatus equipped with an alignment sensor base on a TTR (Through The Reticle) method, which is capable of directly viewing the relative position of the wafer to the reticle through the reticle and a projection optical system, the TTR alignment sensor detects a deviation in the relative position of the wafer to the reticle, and it is confirmed that the deviation falls within a given allowable value with respect to a target value for a fixed time as in the case of the laser interferometer. Thereafter, the exposure is started.

As explained above, according to the prior art, the exposure is not started if the deviation in the relative position between the reticle and the wafer does not fall within a 100% allowable value for the fixed time. For this reason, if mechanical vibrations are applied to the whole projection exposure apparatus, or if hunting of the stage system is produced, arise problems in which the exposure can not be started for a long time, or the positioning process is remarkably time-consuming.

To avoid this, for instance, even if the positioning allowable value is set larger so as not to reduce the throughput (the number of wafers processed per unit time), the deviation in the relative position between the reticle and the wafer does not invariably converge at a target range during the exposure under a great-vibration environment. It can be also considered that the wafer is located in a deviated position as the case may be.

SUMMARY OF THE INVENTION

In order to solve the above-mentioned problems, the present invention provides a projection exposure apparatus including a wafer stage carrying a wafer and movable stepwise two-dimensionally, wafer stage position detecting means for detecting the position of the wafer stage, a mask stage carrying a mask formed with a predetermined mask pattern and movable two-dimensionally, mask stage position detecting means for detecting the position of the mask stage, and a projection optical system for projecting the image of the mask pattern on the wafer so that the image of the mask pattern is made to align with the predetermined area of the wafer to form the mask pattern on the wafer for each shot, the projection exposure apparatus further comprising first control means for stepwise moving the wafer stage so as to cause each shot to coincide with the predetermined position, memory means for memorizing the drive parameters of the mask stage based on the moving characteristic of the wafer stage per shot and the deviation tolerance of the wafer stage from the predetermined position, and second control means for moving the mask stage based on the drive parameters before the wafer stage stops at the predetermined position and initiating the servo control when the position of the wafer stage substantially coincides with the mask stage so that the exposure starts substantially in synchronism with the servo control before the wafer stage stops at the predetermined position.

The positioning reproduction accuracy of the wafer stage is determined by the tolerance at the time of the positioning of the wafer stage. For example, the apparatus, which normally terminates positioning when the wafer stage arrives at the position separated by less than 0.1 $\mu$m from the aimed position, can be used for terminating the positioning of the wafer stage when the wafer stage is separated by more than 1$\mu$from the predetermined aimed position. The positioning at a larger tolerance than the normally required tolerance is hereinafter called "rough positioning". When the wafer stage is roughly positioned in the predetermined direction in the present invention, the reticle stage is previously set to a position corresponding to the tolerance with respect to the direction to quicken the positioning (the direction corresponding to the direction of the deviation of the wafer stage). Since the wafer stage is roughly positioned in this case, the positioning reproduction accuracy is not so strict and the positioning time (the time interval during which the wafer stage moves stepwise from the starting position to the position within the tolerance from the aimed position) becomes short.

Since, however, the reticle stage is moved in such a direction that it is positioned faster, an actually required positioning accuracy is reproduced. If the reticle stage waits at the position anticipated by the stepping distance and the stepping direction, the positioning time can be more shortened.

When the wafer stage is deviated slightly from the aimed position due to the external disturbances such as fluctuation of the wafer stage and play of bolts after the wafer stage has been set in position, the deviation of the wafer stage is eliminated because the reticle stage follows the deviation.

With the present invention, the drive parameters for positioning the reticle at the waiting position can be changed.

According to the present invention, the reticle is moved in such a direction that the wafer stage is positioned faster. Thus, the positioning accuracy can be improved without lowering the throughput regardless of the stepping distance of the wafer stage and the direction of its movement.

Another object of the present invention is to provide an exposure apparatus for performing transfer exposure in each shot area of a reticle pattern on a substrate, in which time required for positioning each shot area on the substrate at the respective exposure position is shortened so as to improve the throughput of the exposure process.

It is an object of the present invention, which was devised in view of the above points, to provide an alignment apparatus capable of aligning a wafer with a reticle at a high speed and a high accuracy even when vibrations are applied to a reticle stage or a wafer stage.

A first alignment apparatus according to the present invention is provided on a projection exposure apparatus for projecting an image of a transfer pattern formed on a mask through a projection optical system onto a photosensitive substrate placed on a two-dimensionally-movable substrate stage. The first alignment apparatus aligns the substrate with the mask. The first alignment apparatus comprises a position detecting unit for detecting a relative positional deviation quantity between the mask and the substrate and an arithmetic unit for sequentially obtaining an average value, per predetermined time, of the relative positional deviation quantity detected by the position detecting unit. When this average value falls within a predetermined allowable range, it is determined that a positioning process is completed.

A second alignment apparatus according to the present invention, on the same premise as that of the first alignment apparatus, comprises a position detecting unit for detecting a relative positional deviation quantity between a mask and a substrate and an arithmetic unit for sequentially obtaining a scatter and an average value, per predetermined time, of the relative positional deviation quantity detected by the position detecting unit. When the average value falls within a predetermined allowable range, and when the scatter comes to a predetermined allowable value or under, it is determined that the positioning process is completed.

In those cases, the position detecting unit comprises, by way of one example, a mask-side laser interferometer for detecting a moving quantity of a mask stage mounted with the mask, a substrate-side laser interferometer for detecting a moving quantity of a substrate stage and a difference unit for obtaining a difference between a measured value of the mask-side laser interferometer and a mask-side converted measured value of the substrate-side laser interferometer, which is a converted value from a measured value of the substrate-side laser interferometer to a mask-side value.

Further, the position detecting unit may be, by way of another example, a mark detecting unit for detecting a positional deviation quantity between an alignment mark formed on the mask and an alignment mark formed on the substrate through a projection optical system thereof.

Moreover, the position detecting unit may be, by way of still another example, an alignment system based on a heterodyne interference method, the alignment system comprising an irradiation optical system for irradiating a diffraction grating alignment mark formed on the mask and a diffraction grating alignment mark formed on the substrate with a couple of light beams having frequencies different from each other. The alignment system further comprises a photoelectric detecting unit for generating mask-side beat signals and substrate-side beat signals by converting heterodyne beams $RB_1^{+1}$, $RB_2^{-1}$, $WB_1^{+1}$, $WB_2^{-1}$ respectively generated by the diffractions at the mask-side alignment mark and the substrate-side alignment mark. The alignment system further comprises a phase comparing unit for detecting a phase difference between the mask-side beat signal and the substrate-side beat signal.

According to the thus constructed first alignment apparatus of the present invention, it is determined from the average position for the fixed time that the mask and the photosensitive substrate are relatively located in the target positions. Hence, even when the mechanical vibrations are produced in the exposure apparatus, and if a vibrating center exists in the target position, the exposure can be started. Therefore, the alignment can be performed at a high speed, and, as a result, the throughput is enhanced. Further, as compared with setting the allowable value (window) counting in even the mechanical vibrations in the prior art, a smaller window can be set, and therefore the alignment accuracy is also enhanced.

Furthermore, according to the second alignment apparatus, as in the first apparatus, a time till the alignment is done is reduced, and the alignment accuracy is enhanced. Moreover, if a phenomenon such as hunting, etc. is produced in the exposure apparatus, irrespective of up-and-down vibrations being large, the average value within the fixed time falls within the allowable value from the very beginning of the measurement in some cases. Accordingly, there exists a possibility in which a mal-positioning process is to be done merely from a judgement using only the average value according to the first invention. According to the present invention, however, in addition to the average value within the fixed time, a judgement criterion includes a scatter (standard deviation, etc.) within the fixed time. Hence, when the mask and the substrate deviate while vibrating in a predetermined direction, and if an average value of the vibrating center exists in a target position, the processing never shifts to the exposing operation with a recognition that the positioning process is not finished, and the mal-positioning process is not carried out at all.

Further, the position detecting unit comprises the mask-side laser interferometer for detecting the moving quantity of the mask stage mounted with the mask, the substrate-side laser interferometer for detecting the moving quantity of the substrate stage and the difference unit for obtaining the difference between the measured value of the mask-side laser interferometer and the mask-side converted measured value of the substrate-side laser interferometer. In this case, the difference unit calculates the difference therebetween on the basis of the measured values detected by the mask- and substrate-side laser interferometers, thereby making it possible to obtain the positional deviation between the mask and the substrate.

Furthermore, if the position detecting unit is the mark detecting unit for detecting the positional deviation quantity between the alignment mark formed on the mask and the alignment mark formed on the substrate through the projection optical system, the alignment can be made by directly viewing the marks on the mask and the substrate as well.

In addition, if the position detecting unit is the alignment system based on the heterodyne interference method, the mask can be accurately aligned with the substrate by the TTR method.

According to the first alignment apparatus of the present invention, even if the mask or the substrate oscillates due to the mechanical vibrations of the stage or the like of the exposure apparatus in which the above alignment apparatus is employed, the average value, per predetermined time, of the positional deviation between the mask and the substrate is compared with the preset allowable value. The positioning process can be therefore done in a short time, and the throughput of the exposure process can be enhanced. Also, the allowable value has hitherto counted in a large margin in terms of considering the mechanical vibrations. According to the present invention, however, this margin can be decreased, and the alignment accuracy is also enhanced.

Moreover, according to the second alignment apparatus of the present invention, not only the average value but also the scatter in the standard deviation of the positional deviation quantity are added to the judgement criterion, and, therefore, the alignment can be exactly performed even in such a case that there are oscillations caused not by the mechanical vibrations but by, e.g., the hunting of the stage.

In those cases, the position detecting unit comprises the mask-side laser interferometer for detecting the moving quantity of the mask stage mounted with the mask, the substrate-side laser interferometer for detecting the moving quantity of the substrate stage and the difference unit for obtaining the difference between the measured value of the mask-side laser interferometer and the mask-side converted measured value of the substrate-side laser interferometer. In this case, the positional deviation between the mask and the substrate can be obtained from the difference between the measured values detected by the mask- and substrate-side laser interferometers.

Furthermore, if the position detecting unit is the mark detecting unit for detecting the positional deviation quantity between the alignment mark formed on the mask and the alignment mark formed on the substrate through the projection optical system, the alignment can be made by directly viewing the marks on the mask and the substrate as well.

In addition, if the position detecting unit is the alignment system based on the heterodyne interference method, there is provided a considerably fine resolution of the positional deviation quantity that is obtained by processing the beat signals outputted, and hence, as in the present invention, the method of making a determination from the average (and the scatter) thereof is particularly effective.

BRIEF DESCRIPTION OF THE DRAWINGS

FIG. 15A is a front view chiefly showing a stage system and an alignment optical system of the projection exposure apparatus used in the embodiment; FIG. 15B is a side view of FIG. 15A;

FIG. 18A is a diagram illustrating a signal processing system and an alignment optical system 201 in FIGS. 15A and 15B; FIG. 18B is a side view of the optical system of FIG. 18A; FIG. 18C is a bottom view of the optical system of FIG. 18A;

FIG. 26 is a graph showing another example of the variations in the positional relative difference between the reticle and the wafer when the positioning is effected in the embodiment described last.

DESCRIPTION OF THE PREFERRED EMBODIMENTS

Figure 1:
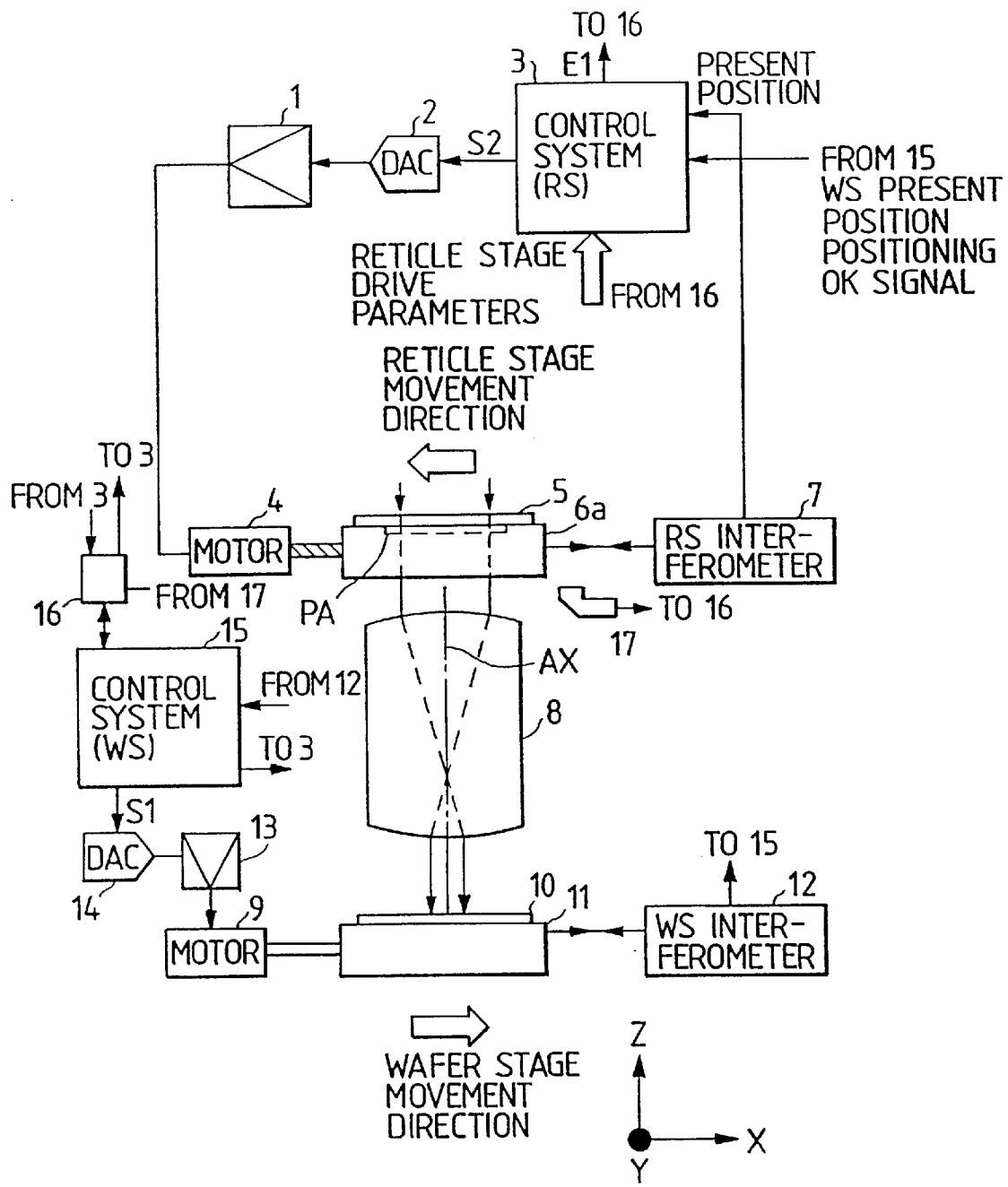
FIG. 1 shows a general structure of a projection exposure apparatus according to one embodiment of the present invention.
Figure 7:
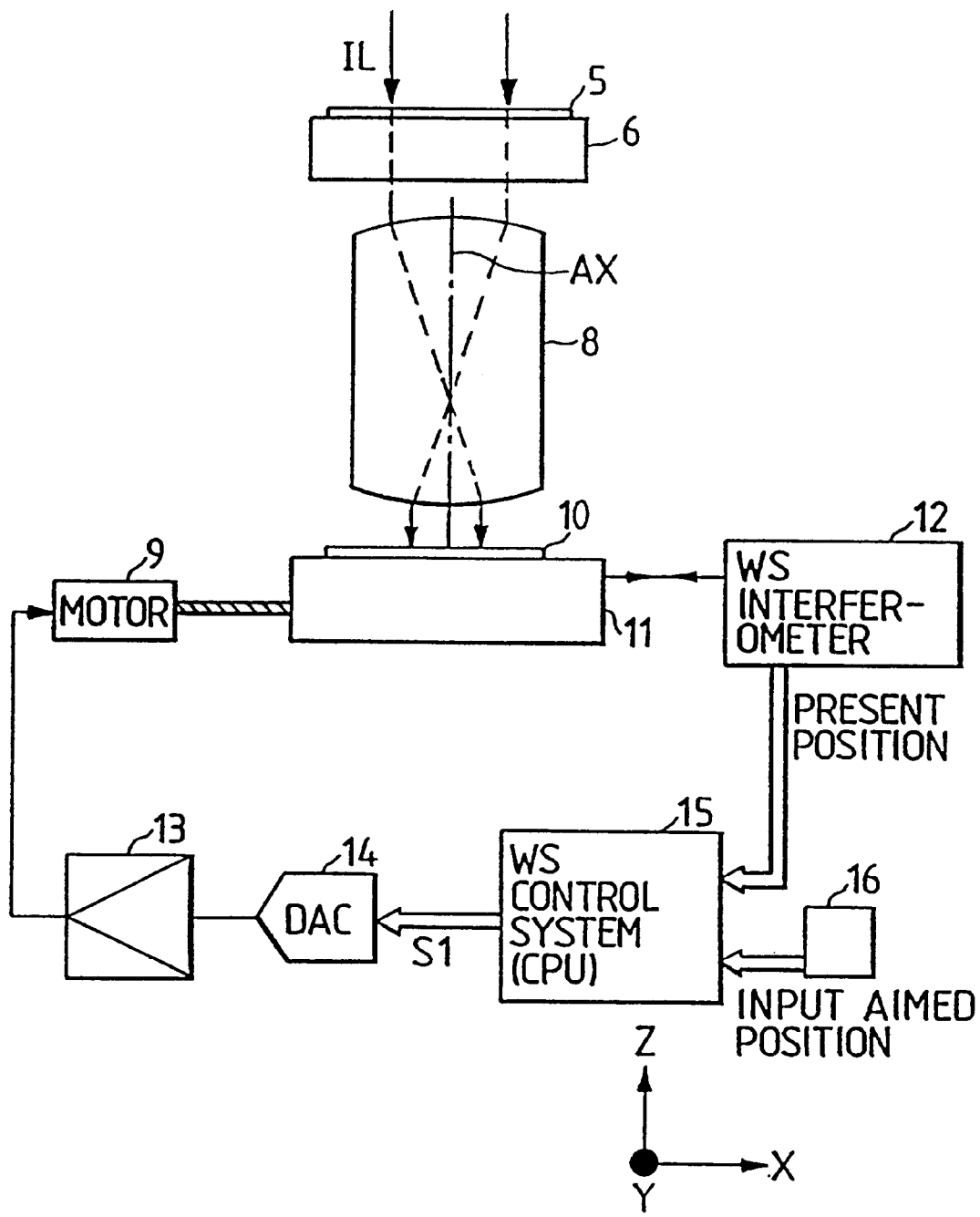
FIG. 7 shows a general structure of a conventional projection exposure apparatus.

Embodiments of the present invention will be described with reference to the drawings. FIG. 1 shows a general structure of the projection exposure apparatus of a first embodiment of the present invention. The same reference numerals are allotted to the same elements of this embodiment as those of the conventional apparatus as shown in FIG. 7. Illuminating light IL emitted from a light source (not shown) such as a mercury lamp or excimer laser is incident on a reticle 5 (such as a photomask) through an illuminating system (not shown). The reticle 5 is mounted on a reticle stage 6a which can be moved two-dimensionally by means of a motor 4 on a plane substantially perpendicular to the optical axis AX of a projection optical system 8. A reticle control system (RS control system) 3 such as a microcomputer (MPU) inputs reticle stage drive control signals S2 to the motor 4 through a digital-analog converter (DAC) 2 and a power amplifier 1. The position of the reticle stage 6a is detected by a reticle stage interferometer (RS interferometer) 7 at a predetermined resolving power (for example, 0.1 μm as a unit). The RS interferometer 7 inputs the detected position of the reticle stage 6a to the RS control system 3. A host computer 16 previously inputs, to the RS control system 3, drive parameters (which will be described in detail) of the reticle stage 6a corresponding to the drive characteristics of the wafer stage 11 in accordance with a stepping distance and the aimed position of the wafer stage 11.

The illuminating light IL which has passed through the reticle 5 arrives at the upper surface of a wafer 10 through the optical system 8 and focuses on the wafer 10 a pattern PA formed on the reticle 5. The wafer stage 11 carries the wafer 10 and can be moved stepwise two-dimensionally in a plane substantially perpendicular to the optical axis AX. The wafer stage 11 can be adjusted finely along the optical axis AX and moves the wafer 10 in the Z directions.

In this embodiment, arrangement coordinates for each shot are previously obtained by the host computer 16 by using the statistical arithmetic analysis as disclosed in the above-mentioned United States Patent. The host computer 16 previously memorizes the arrangement coordinates as aimed position information of the wafer stage 11. The host computer 16 inputs the aimed position information of the wafer stage 11 to a wafer stage control system (WS control system) 15. The WS control system 15 inputs a motor control signal S1 to the motor 9 through a digital-analog converter (DAC) 14 and a power amplifier 13, based on the aimed position information from the host computer 16. In accordance with this control signal, the WS control system 15 moves the wafer stage 11 to the aimed position. The position of the wafer stage 11 is detected by a wafer stage interferometer (WS interferometer) 12 at a resolving power (for example, 0.1 μm as a unit). The WS interferometer 12 inputs the detected position of the wafer stage 11 to the RS control system 3 through the WS control system 15.

The host computer 16 inputs, to the RS control system 3, position information of the reticle stage 6a corresponding to the aimed position information of the wafer stage 11. When the reticle stage 6a and the wafer stage 11 exhibits a predetermined positional relationship (as will be described in detail), the RS control system 3 inputs an exposure signal E1 to the host computer 16.

The reticle 5 is provided with a bar code for recording a reticle number and the like which can be read by a bar code reader 17.

Figure 2:
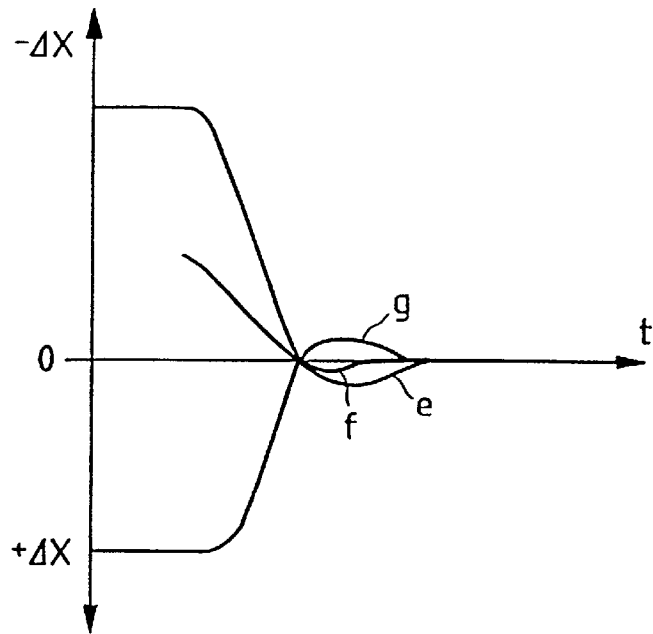
FIG. 2 shows the drive characteristics of the wafer stage.

Dynamic characteristics of the wafer stage 11 and drive parameters of the reticle stage 6a will be described with reference to FIG. 2 which shows position data per shot from the WS interferometer 12 when the wafer stage 11 is positioned. In the figure, deviations ΔX from the aimed position of the wafer stage 11 are shown by the ordinate, and time t is shown by the abscissa. The aimed position is on the abscissa, which is zero on the ordinate. In this embodiment, the aimed position is on the optical axis of the projection optical system 8. When the center of the shot on the wafer 10 does not arrive at the optical axis AX as viewed from the predetermined stepping direction, the deviations on the ordinate are expressed by a − (minus) sign. On the other hand, after the center of the shot on the wafer 10 has passed the optical axis AX as viewed from the predetermined stepping direction, the deviations are indicated by a + (plus) sign. As shown in the figure, when the stage makes a stepping movement in the + direction and stops at a position close to the aimed position, the stepping movement shown by the characteristic e requires a larger stepping distance, while the stepping movement shown by the characteristic f requires a smaller stepping distance. The stepping movement shown by the characteristic g takes place in the opposite direction to that of the stepping movements shown by the characteristics e and f. The polarity or the sign of the deviations for the characteristic g is reverse to those of the characteristics e and f. Since the stepping distance for the characteristic e is longer than that for the characteristic f, the deviations from the aimed position in the case of the characteristic e is much larger than those in the case of the characteristic f. Thus, the amount of the movement of the reticle stage 6a in the case of the characteristic e must be larger than that in the case of the characteristic f. As the stepping directions in the case of the characteristics e and g are reverse to each other, the moving directions of the reticle stage in the case of the characteristics e and g are also reverse to each other (as will be described in detail)

The RS control system 3 controls the motor 4 so as to move the reticle stage 6a to the aimed position, by considering the deviations of the characteristics e, f and g. In the host computer 16 are previously memorized the drive characteristics corresponding to the stepping distances and stepping directions for all shots of the wafer stage 11. To the RS control system 3 are inputted the drive parameters of the reticle stage 6a corresponding to the stepping distances and directions of the wafer stage 11 and the deviation tolerances of the wafer stage 11. The moving direction of the reticle stage 6a is reverse to the moving direction of the wafer stage 11, because the reticle 5 and the wafer 10 are arranged in a mirror image relationship with respect to the projection optical system 8.

Figure 3:
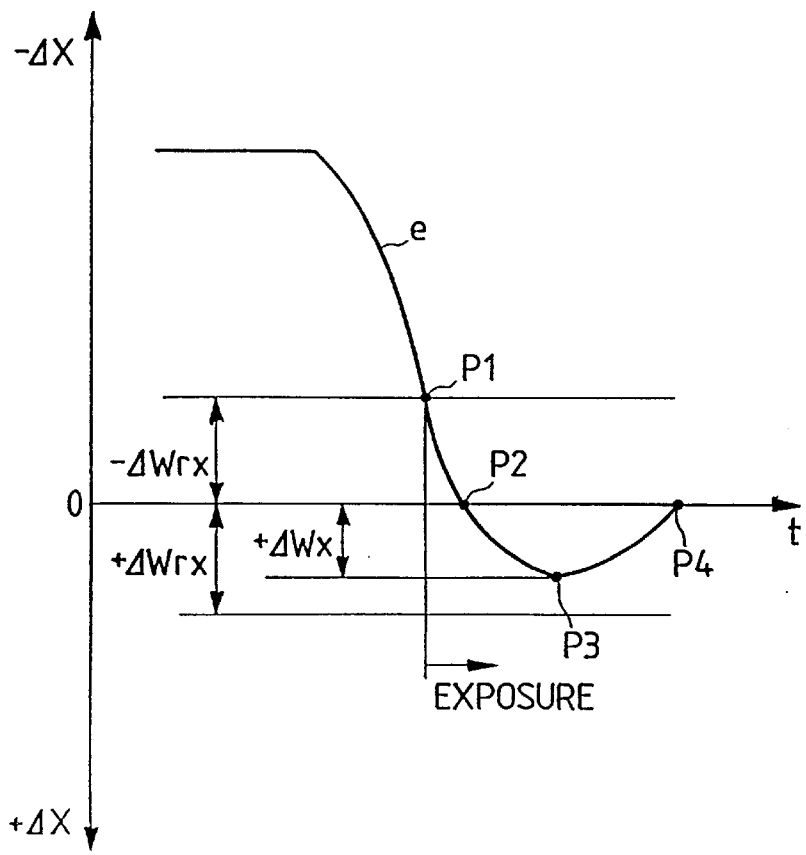
FIG. 3 shows the relationship between the drive characteristics and the deviations of the wafer stage.

The relationship between the aimed position of the reticle stage 6a and the positions of the wafer stage 11 will be described with reference to FIG. 3. FIG. 3 shows the position data of the wafer stage 11 in the case of the characteristics e. The coordinates are the same as those of FIG. 2. In the figure, ΔWrx indicates a deviation tolerance from the aimed position of the wafer stage 11. The tolerance is determined by the drive stroke and response of the reticle stage 6a. In the figure, ΔWx shows the maximum deviation from the aimed position of the wafer stage 11 after the wafer stage 11 has passed the aimed position. Point P1 shows the coordinates of the wafer stage 11 when it is displaced from the aimed position by the tolerance "−ΔWrx", and point P2 shows the coordinates of the wafer stage 11 when it arrives at the aimed position for the first time. Point P3 shows the coordinates of the wafer stage 11 when it is deviated from the aimed position by the maximum deviation "+ΔWx" after the wafer stage 11 has passed the aimed position, and point P4 shows the coordinates of the wafer stage 11 when it takes the aimed position again. Between the points P3 and P4, the wafer stage 11 is moved in a reverse direction to its direction between the points P1 and P2. Since the deviations ΔWrx (tolerance) of the wafer stage 11 from the aimed position are taken to be large, the deviations ΔWrx become the positional displacement errors in the actual exposure when the image of the reticle pattern PA overlaps with the pattern area of the wafer 10. However, the reticle stage 6a is previously moved by a distance corresponding to "−ΔWrx" which is the deviation at the time when the wafer 11 is at the point P1. As the wafer stage 11 has not yet arrived at the aimed position, this means that the reticle stage 6a is in a state moved in the + direction (in the reverse direction to the deviation of the wafer stage 11 from the optical axis AX), i.e., in the direction in which the alignment is made faster. The projection optical system 8 used in this embodiment has a reduction rate of 1/5. Thus, it is preferred that the moving distance of the reticle stage 6a be five times of the deviation ΔWrx. In this arrangement, no deviation occurs between the reticle pattern PA and the pattern area on the wafer 10 at the point P1. If, therefore, the exposure is initiated when the wafer stage 11 comes to the point P1, the exposure can be performed before the wafer stage 11 arrives at the point P4, and the throughput is improved.

Figure 4:
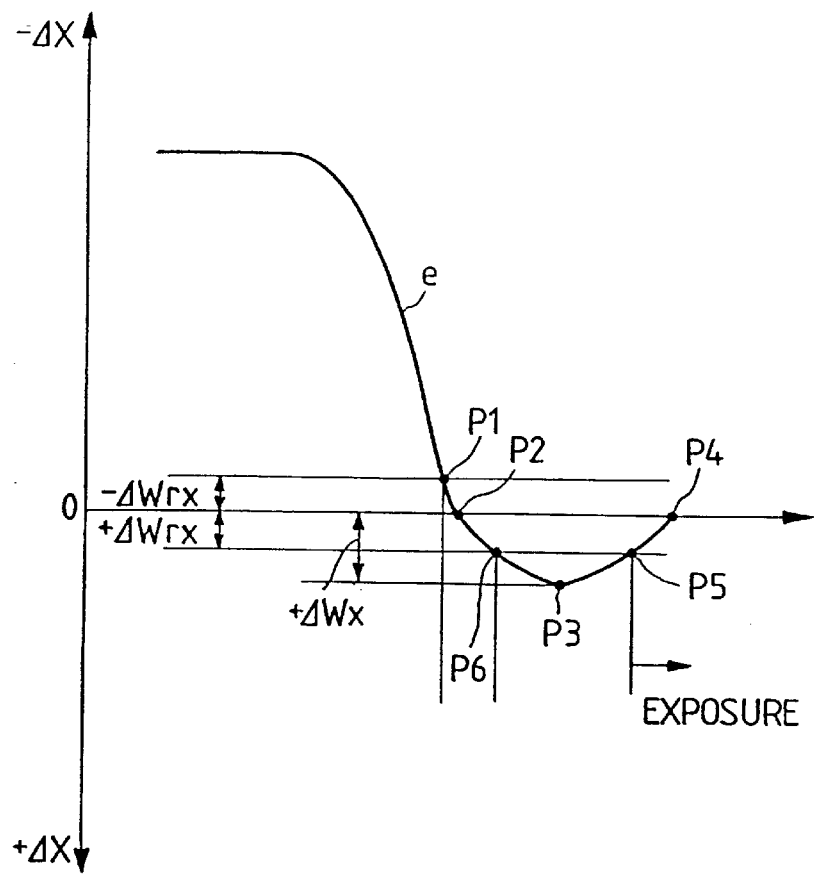
FIG. 4 shows the relationship between the drive characteristics and the deviations of the wafer stage.

Referring to FIG. 4 there will be described the case in which the deviation ΔWx is larger than the tolerance ΔWrx when the displacement between the position of the wafer stage 11 and the aimed position becomes the maximum. FIG. 4 shows the position data similarly to that of FIG. 3 when the maximum deviation ΔWx between the position of the wafer stage 11 and the aimed position exceeds the tolerance ΔWrx. In FIG. 4, the coordinates and the signs are shown in the same way as those in FIG. 3. Point P5 shows the coordinates of the wafer stage 11 when the deviation between the position of the wafer stage 11 and the aimed position becomes less than the tolerance ΔWrx again.

In the case of FIG. 4, it is preferred that the exposure begins at point P1. It is also preferred in this case that the reticle stage 6a be moved by −ΔWrx/5.

Referring to FIG. 4, preferable exposure processes will be described. The exposure is initiated at the point P1 during the movement of the reticle stage 6a as similarly shown in FIG. 3 and interrupted in a range from the point P6 to the point P5 in which range the deviation of the wafer stage 11 from the aimed position exceeds the tolerance ΔWrx. Then, the reticle stage 6a is moved in the reverse direction to the direction in which the reticle stage 6a was moved to coincide with the point P1 as mentioned above and the exposure is initiated again at the point P5.

In this way, the drive parameters of the reticle stage 6a corresponding to the tolerance for each shot and the drive characteristics of the reticle stage 6a are previously determined by the arithmetic operation or manual inputs, and the drive parameters are previously memorized in the host computer 16 as described above.

It is preferred that the tolerance be approximately twice the maximum deviation ΔWx between the wafer stage 11 and the aimed position.

Figure 5:
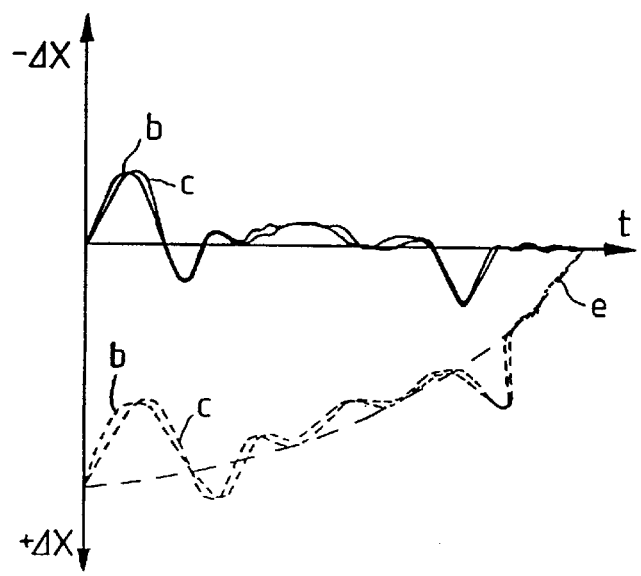
FIG. 5 shows the servo operations of the wafer stage and the reticle stage.

FIG. 5 shows the deviations from the aimed position when the wafer stage is subjected to external disturbances such as fluctuation of the wafer stage and play of bolts. In the figure, the ordinate shows the deviations of the wafer stage from the ideal position (the zero position) after termination of the wafer positioning, and the abscissa indicates time. The characteristic b indicates a curve formed by plotting the deviations of the wafer stage 11 from the aimed position when the wafer stage 11 is subjected to the external disturbances. The RS control system 3 can detect the current positions of the reticle stage and the wafer stage based on the information from the RS interferometer and the WS interferometer. From the obtained values is calculated the deviation between the reticle stage and the wafer stage. Speed data corresponding to the deviation is supplied to the DAC 2. The DAC 2 outputs the analog signal to a servo amplifier so that the servo amplifier controls a motor to rotate it at a predetermined speed. In FIG. 5, the characteristic c indicates how the reticle stage 6a follows the wafer stage 11 which is deviated from the aimed position as shown by the characteristic b. The reticle stage 6a and the wafer stage 11 are servo-controlled in this way. In this embodiment, the positioning of the wafer stage 11 is terminated when the deviation of the wafer stage 11 from the aimed position is less than the tolerance ΔWrx. Thus, the total deviations are obtained by making the characteristics b and c shown by the solid lines overlap with the characteristic e in FIG. 4. To indicate the total deviations, the ordinate is shifted by the deviations given by the characteristic e. The resultant total deviations are shown by the curves b and c indicated by broken lines in FIG. 5.

As the wafer stage has specific moving characteristics, the positions to be inputted are not always the same even if the stepping distances are the same. Thus, the stepping characteristics for all strokes are previously memorized in the host computer 16.

The drive characteristics of the wafer stage 11 sometimes change as exposure time passes. It is preferred that the drive characteristic of the wafer stage 11 per shot be measured when the treatment of several lots of wafers is finished and the operation and the operation parameters of the reticle stages 6a be changed based on the drive characteristics.

The servo control of the reticle stage 6a and the wafer stage 11 may start at the point P2 as shown in FIGS. 3 and 4. In this case, it is unnecessary to set previously the reticle stage 6a at a position displaced in advance of the wafer stage 11 (i.e., at the position shown by the point P1 in FIGS. 3 and 4).

Figure 6:
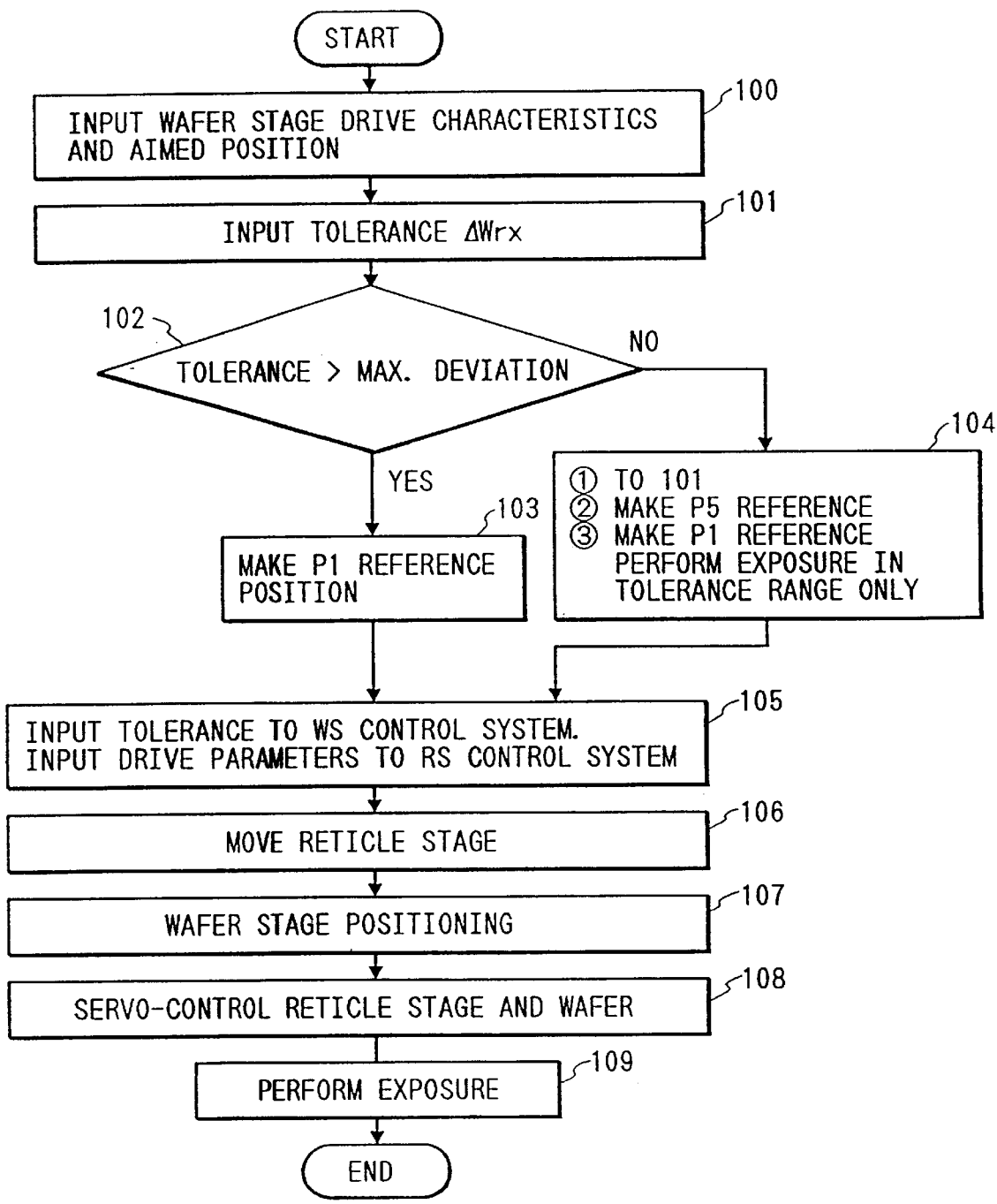
FIG. 6 is a flow chart showing the operation of the embodiment according to the present invention.

A specific operation will now be described with reference to a flow chart in FIG. 6.

(Step 100)

The drive characteristic of the wafer stage 11 per shot is inputted to the host computer 16 which previously memorizes the aimed position and the shot arrangement information and the like.

(Step 101)

The tolerances ΔWrx are inputted to the host computer 16.

(Step 102)

The step 103 is performed when the tolerance ΔWrx is larger than the maximum deviation ΔWx, while the step 104 is carried out in case the tolerance ΔWrx is smaller than the maximum deviation ΔWx.

(Step 103)

The drive parameters of the reticle stage 6a are calculated so that the wafer stage 11 comes to the position shown by the point P1 which is deviated from the aimed position by less than the tolerance, before the wafer stage 11 arrives at the aimed position.

(Step 104)

The operator selects one of the following three processes:

(1) The process goes to Step 101 and different tolerance is inputted.
(2) After the wafer stage 11 has passed the aimed position, the drive characteristics of the reticle stage 6a are calculated so that the wafer stage 11 comes to a position shown by the point P5 which is deviated from the aimed position by less than the tolerance.
(3) Before the wafer stage 11 passes the aimed position, the drive characteristics of the reticle stage 6a are calculated so that the wafer stage 11 comes to a position shown by the point P1 which is deviated from the aimed position by less than the tolerance. If, however, the deviation of the wafer stage 11 exceeds the tolerance, the exposure is not carried out.

(Step 105)

The host computer 16 inputs the shot arrangement coordinates and the tolerances ΔWrx to the WS control system 15, and the drive parameters of the reticle stage 6a to the RS control system 3.

(Step 106)

The reticle stage 6a is set at the predetermined position based on the drive parameters, and the set position is measured by the RS interferometer 7.

(Step 107)

The WS interferometer 12 inputs the position of the wafer stage 11 to the host computer 16, and the host computer 16 compares the deviation between the position of the wafer stage 11 and the aimed position with the tolerance ΔWrx. When the deviation becomes less than the tolerance, the host computer decides that the positioning is finished and inputs the positioning OK signal to the RS control system 3.

(Step 108)

The WS control system 15 inputs the current position of the wafer stage 11 to the RS control system 3. The RS control system 3 compares the current position of the reticle stage 6a with the current position of the wafer stage 11 and compensates the difference if any.

(Step 109)

During the servo operation, the RS control system 3 supplies an exposure signal E1 to the host computer 15, and the exposure is carried out. However, the exposure is stopped when the process (3) in Step 104 is selected and the deviation of the wafer stage 11 exceeds the tolerance.

As apparent from the above-mentioned description of the operation of the wafer stage and the reticle stage, the exposure can be performed before the wafer stage 1 stops, thereby preventing the throughput from being lowered.

The drive parameters of the reticle stage may be previously obtained, and the tolerances at Step 105 and the drive parameters of the reticle stage may be inputted together with both the drive characteristics and the aimed position of the wafer stage at Step 100. The moving instructions of the reticle stage 106 at Step 106 and the wafer stage at Step 107 may be executed in parallel with each other.

Figure 8:
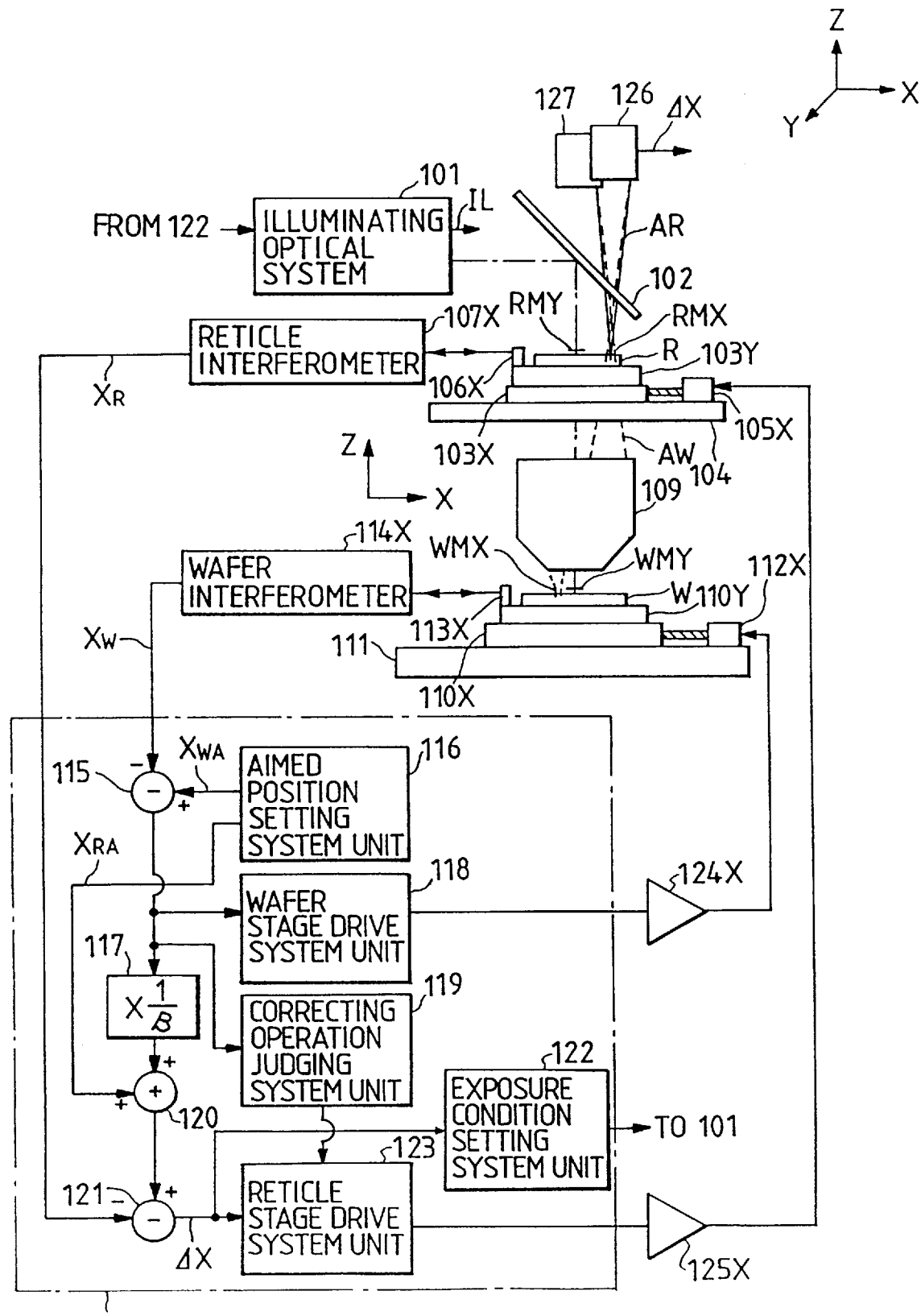
FIG. 8 is a diagram showing a general structure of a second embodiment of an exposure apparatus according to the present invention.

In FIG. 8 is shown a second embodiment of a stepper according to the present invention, in which exposure light IL (such as the i line, KrF excimer laser beams) from an illuminating optical system 101 is reflected by a dichroic mirror 102 and is incident on the pattern area of a reticle R forming a mask. A Z axis is taken in parallel with the optical axis of the exposure light IL reflected by the dichroic mirror 102. An X axis is taken in parallel with the paper surface of FIG. 8 in a two-dimensional plane perpendicular to the Z axis, and a Y axis is taken in a direction perpendicular to the paper surface of FIG. 8.

The reticle R is mounted on a reticle base 104 through a reticle side Y stage 103Y and a reticle side X stage 103X. The reticle side X stage 103X is driven in the X directions with respect to a reticle base 104 by a driving motor 105X, and the reticle side Y stage 103Y is driven in the Y directions with respect to the reticle side X stage 103X by a driving motor (not shown). A movable mirror 106X for the X axis and a movable mirror for the Y axis (not shown) are fixed onto the reticle side Y stage 103Y. The coordinate $X_R$ of the reticle side X stage 103X is measured by the movable mirror 106X and an externally provided reticle side laser interferometer 107X for the X axis (hereinafter referred to as the "reticle interferometer"), and the Y coordinate of the reticle side Y stage 103Y is measured by the movable mirror for the Y axis (not shown) and a reticle interferometer for the Y axis (not shown). The measured X coordinate $X_R$ and the Y coordinate are supplied to a main control system 108.

The pattern image of the reticle R illuminated with the exposure light IL is reduced at a projection magnification β (β being 1/5, for example) by a projection optical system 109 and is projection exposed in each shot area on a wafer W constituting a substrate. The wafer W is mounted on a wafer base 111 through a wafer side Y stage 110Y and a wafer side X stage 110X. The wafer side X stage 110X is driven in the X directions with respect to the wafer base 111 by a driving motor 112X, and the wafer side Y stage 110Y is driven in the Y directions with respect to the wafer side X stage 110X by a driving motor (not shown). A movable mirror 113X for the X axis and a movable mirror for the Y axis (not shown) are fixed onto the wafer Y stage 110Y. An X coordinate $X_W$ of the wafer side X stage 110X is measured by the movable mirror 113X and an externally provided wafer side laser interferometer 114X for the X axis (hereinafter referred to as the "wafer interferometer"), and a Y coordinate of the wafer Y stage 110Y is measured by a movable mirror (not shown) and a wafer interferometer for the Y axis (not shown). The measured X coordinate $X_W$ and Y coordinate are supplied to the main control system 108.

This embodiment employs a TTR system (a through-the-reticle system) on the reticle R as disclosed in the documents such as Japanese Patent Application Laid-open No. 5-114544 and Japanese Patent Application Laid-open No. 5-152190 (U.S. Ser. No. 963399 filed on Oct. 16, 1992.) and uses so-called two-beam interfering type alignment systems 126 and 127. In the two-beam interfering system, two interferable light beams AR (such as He-Ne laser beams having a wavelength of 63 nm and a wavelength close thereto), which are emitted from the alignment system 126 for the X axis and have slightly different frequencies, pass through the dichroic mirror 102 and are incident on diffraction grating type alignment marks (reticle marks) RMX for the X axis on the reticle R at a predetermined intersecting angle. The ±primary diffraction beams of the two laser beams are emitted from the reticle marks RMX in parallel or in the same direction. The reticle marks RMX are diffraction grating type marks formed at predetermined pitches in an X direction. The ±primary interference beams, i.e., the heterodyne beams having predetermined beat frequencies are converted photo-electrically through the dichroic mirror 102 by a system unit of a light receiving element for the reticle in the light alignment system 126, and reticle mark signals for the X axis are obtained.

Two interferable laser beams AW, which are emitted from the alignment system 126 for the X axis and have slightly different frequencies, pass through the dichroic mirror 102 and a passing window (not shown) on the reticle R and then are incident on alignment marks (wafer marks) WMX for the X axis of a diffraction grating type provided in predetermined shot areas on the wafer W through the projection optical system 109 at a predetermined intersecting angle. The primary diffraction laser beams comprising the two laser beams AW are emitted in parallel from the wafer mark WMX. The wafer marks are of a diffraction grating type formed at predetermined pitches. The ±primary interference light beams, i.e., the heterodyne beams having predetermined beat frequencies are converted photo-electrically by wafer light receiving elements in the alignment system 126 through the projection optical system 109, the reticle R and the dichroic mirror 102 to obtain wafer mark signals for the X axis. The positional displacements between the shot areas in which the wafer marks WMX exist and the pattern image of the reticle R in the X directions are detected from the phase differences between the wafer mark signals for the X axis and the reticle mark signals.

Similarly, an alignment system 127 of the two-beam interfering system for the Y axis provides reticle mark signals for the Y axis corresponding to the positions of reticle marks RMX for the Y axis on the reticle R and wafer mark signals for the Y axis corresponding to the positions of wafer marks WMY for the Y axis provided in a predetermined shot area on the wafer W. The positional displacements in the Y direction between the shot areas in which the wafer marks WMY exist and the pattern image of the reticle R are detected from the phase differences between the wafer marks WMY for the Y axis provided in the predetermined shot areas on the wafer W. In the process for performing exposure in each shot area on the wafer W in this embodiment, the positional displacement detected by the alignment systems 126 and 127 is not utilized. Instead, the alignment systems 126 and 127 are used for setting the positional relationship between the original point of the coordinate system on the wafer W and the original point of the coordinate on the reticle R to a predetermined state.

In order to set the positional relationship between the original point of the coordinate system on the wafer W and the original point of the coordinate on the reticle R to a predetermined state, an alignment telescope for detecting the positional relationship with respect to the reference position of the wafer side stage of the reticle R and an alignment system for detecting the positional relationship between the wafer marks on the wafer W and the reference position of the wafer side stage may be used instead of the alignment systems 126 and 127. The alignment system can employ a photographing method, a laser step alignment method, a two-beam interfering method or the like.

With reference to FIG. 8, a control section for the X axis of a main control system 108 will be described. The main control system 108 includes a computer. FIG. 8 shows a functional block diagram of the main control system 108. The X coordinate $X_W$ of the wafer side X stage 110X measured by the wafer interferometer 114X is supplied to a reduction system unit 115 in the main control system 108. An aimed coordinate $X_{WA}$, i.e., the coordinate for setting shot areas on the wafer W to be exposed to the projection position (exposure position) of the pattern image of the reticle R is supplied from an aimed position setting system unit 116 to the addition side input portion of the reduction system unit 115. The inverted value $(X_{WA}-X_W)$ of the positional error of the wafer side X stage 110 outputted from the reduction system unit 115 is supplied to multiplication system unit 117, wafer stage driving system unit 118 and correcting operation judging system unit 119.

The wafer stage drive system unit 118 controls the operation of the driving motor 112X through an amplifier 124X so that the positional error of the wafer side X stage 110X is reduced to zero. On the other hand, the correcting operation judging system unit 119 starts the movement of the reticle side X stage 103X when the positional error becomes a predetermined value, as will be described later. The multiplication system unit 117 supplies an error corresponding to the inverted value of the inputted positional error of the wafer side X stage 110X multiplied by the inverse of the projection magnification $(1/\beta)$ to one of the input portions of an addition system unit 120. The initial aimed corrdinate $X_R$ (normally zero) is supplied from the aimed position setting system unit 116 to the other input portion of the addition system unit 120, and the actual aimed position $(X_{RA}+(X_{WA}-X_W)/\beta)$ of the reticle side X stage 103X calculated by the addition means 120 is supplied to the addition side input portion of reduction system unit 121.

The X coordinate $X_R$ of the reticle side X stage 103X measured by the reticle interferometer 107X is supplied to the reduction side input portion of the reduction system unit 121, and the relative error $\Delta X$ in the X direction calculated by the reduction means 121 is represented by the following equation:

$$\Delta X = X_{RA} + (X_{WA}-X_W)/\beta - X_R$$
$$= -(X_R-X_{RA})-(X_W-X_{WA})/\beta \quad (1)$$

The relative error $\Delta X$ corresponds to the positional displacement in the X direction between the position of the pattern of the reticle R and the position on the reticle R of the shot area converted from the position on the wafer W. In Equation (1), the term of $(X_W-X_{WA})/\beta$ is added by a negative sign, because the projection image formed by the projection optical system 109 is an inverted image. The relative error $\Delta X$ is supplied to exposure condition setting system unit 122 and reticle stage driving system unit 123. The reticle stage driving system unit 123 controls the operation of the driving motor 105X through an amplifier 125X so that the relative error $\Delta X$ corresponding to the inverted value of the positional error of the reticle side X stage 103X is reduced to zero. The reticle stage driving system unit 123 starts the drive of the reticle side X stage 103X when the starting command of the positioning is supplied from the correcting operation judging system unit 119 after the positional error of the wafer side X stage 110X has become a predetermined value.

The exposure condition setting system unit 122 generates a control signal when the relative error $\Delta X$ retains a value lower than a predetermined tolerance for a predetermined time and the separately occurring positional displacement in the Y direction retains a value lower than a predetermined tolerance for a predetermined time. In this way, the pattern of the reticle R is exposed in the corresponding shot area on the wafer W. More concretely, when the light source of the illuminating optical system 101 is a mercury lamp, for example, the exposure condition setting system unit 122 controls the on and off operation of the exposure by opening and closing a shutter in the illuminating optical system 101. On the other hand, when the illuminating optical system 101 uses a pulse laser light source such as an excimer laser light source, the exposure condition setting system unit 122 controls the on and off operation of the exposure by the control of the light emission trigger signal of the excimer laser light source in the illuminating optical system 101.

Since the control systems of the reticle side Y stage 103Y and the wafer side Y stage 110Y are the same as that of the stage for the X axis as shown in FIG. 8, their description will be omitted. Alternatively, two wafer interferometers 114X may be arranged in parallel in the Y direction so as to detect the rotational angle of the wafer W due to the measured value of the wafer interferometers, and two reticle interferometers 107X may be arranged in parallel in the Y direction so as to detect the rotational angle of the reticle R from the measured value of the reticle interferometers. In this case, control may be made so that the difference between the rotational angle of the reticle R and the rotational angle of the wafer W is smaller than a predetermined tolerance. When the difference between the rotational angles of the reticle R and the wafer W is controlled, another alignment system for detecting the rotational angles is provided in addition to the alignment system 126 for the X axis and the alignment system 127 for the Y axis.

Figure 9:
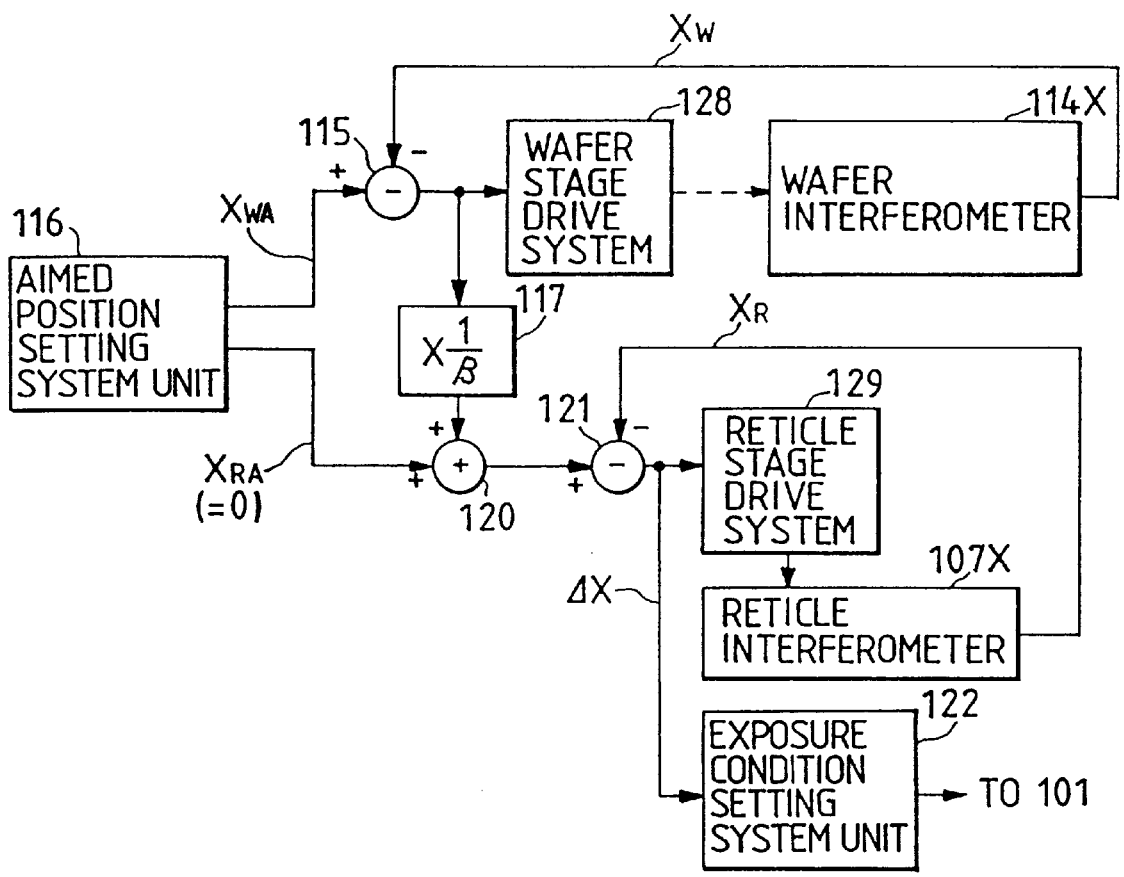
FIG. 9 is a functional block diagram showing the function of the exposure apparatus of FIG. 8 when it is moved by a reticle side X stage.

When a command for starting the positioning is supplied from the correction operation judging system unit 119 as shown in FIG. 8, the reticle stage driving system unit 123 starts to move the driving motor 105X and two closed loop systems are formed as shown in FIG. 9. In FIG. 9 in which the parts corresponding to those in FIG. 8 are shown by the same reference numerals, a wafer stage drive system 128 corresponds to the wafer stage drive system 118, the power amplifier 124X and the driving motor 112X in FIG. 8, and the X coordinate $X_W$ measured by the wafer interferometer 114X changes as the wafer stage drive system 128 operates. The wafer stage driving system 128 operates so as to make zero the positional error which is the difference between the aimed coordinate $X_{WA}$ and the X coordinate $X_W$ of the wafer side X stage 110X.

In FIG. 9, on the other hand, a reticle stage drive system 129 corresponds to the reticle driving system unit 123, the power amplifier 125X and the driving motor 105X, and the X coordinate $X_R$ of the reticle side X stage 103X changes as the reticle stage drive system 129 operates. The reticle stage drive system 129 operates so as to make zero the relative error $\Delta X$ expressed by Equation (1).

The exposure operation of the second embodiment will be described. As shown in FIG. 8, the reticle R and the wafer W are moved in the direction of the X and Y axes, i.e., two dimensionally. For simplicity, however, only the movement in the X directions will be described. First, emission of illuminating light IL on the illuminating optical system 101 is interrupted, and the positional relationship of the reticle R with respect to the reference position on the wafer side Y stage 110Y is detected by a system unit of an alignment microscope for the reticle (not shown). When the reticle R is fixed to the initial exposure position having a predetermined positional relationship with respect to the reference position on the wafer side Y stage 110Y, the measured value of a reticle interferometer 107X is set to zero. In this way, the coordinate of the reticle side X stage 103X, i.e., the initial aimed coordinate $X_{RA}$ is made zero when the reticle R is fixed to the initial exposure position.

Next, the wafer W to be exposed is mounted on the wafer side Y stage 110Y, and the positional relationship of the wafer W with respect to the reference position on the wafer side Y stage 110Y is detected by an alignment system of an off-axis type. The positional relationship between the position of the projecting image formed by the projection optical system 109 of the pattern of the reticle R and the corresponding shot areas of the wafer W is found, and the aimed coordinate of the wafer side X stage 110X for setting the shot area of the wafer W to its exposure position is calculated. Alternatively, the positional. relationship between the reticle R and the predetermined shot areas on the wafer W may be directly detected by a system unit of a TTR type alignment system 126. In this case, the aimed coordinates of the wafer side X stage 110X for setting the initial exposure position of the reticle R and setting the respective shot area on the wafer W to the exposure position may be calculated from the detected result.

Figure 10:
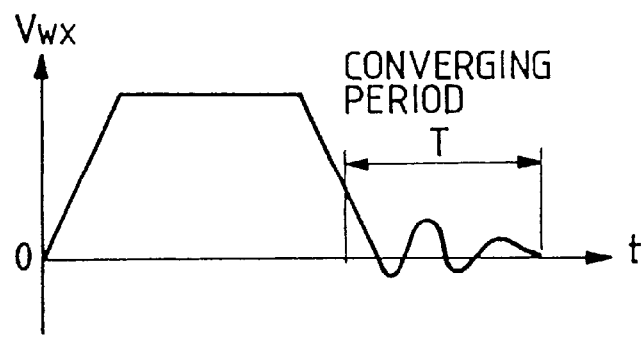
FIG. 10 is a graph showing a speed characteristic of a wafer side X stage when the exposure apparatus of FIG. 8 is set to a required position.

The aimed position setting system unit 116 supplies the aimed coordinate $X_{WA}$ of the wafer side X stage 110X to the reduction system unit 115 and also supplies the aimed coordinate $X_{RA}$ (=0) of the reticle side X stage 103X to the addition system unit 120. Thereafter, the wafer stage drive system unit 118 operates the driving motor 112 to move the wafer side X stage 110X in a stepped manner in the X directions at a speed characteristic as shown in FIG. 10, thereby causing the X coordinate of the wafer side X stage 110X to approach the aimed coordinate $X_{WA}$ of the wafer side X stage 110X. As shown in FIG. 10, the speed $V_{WX}$ is accelerated at first, then becomes constant and finally is reduced so that the curve of the speed $V_{WX}$ forms a trapezoidal shape. During the convering time T in which the wafer side X stage 110X is approaching the aimed coordinate, the speed $V_{WX}$ is reduced to zero in a wave way. In other words, the final operation for setting the final positioning is performed during the converging time.

Figure 11:
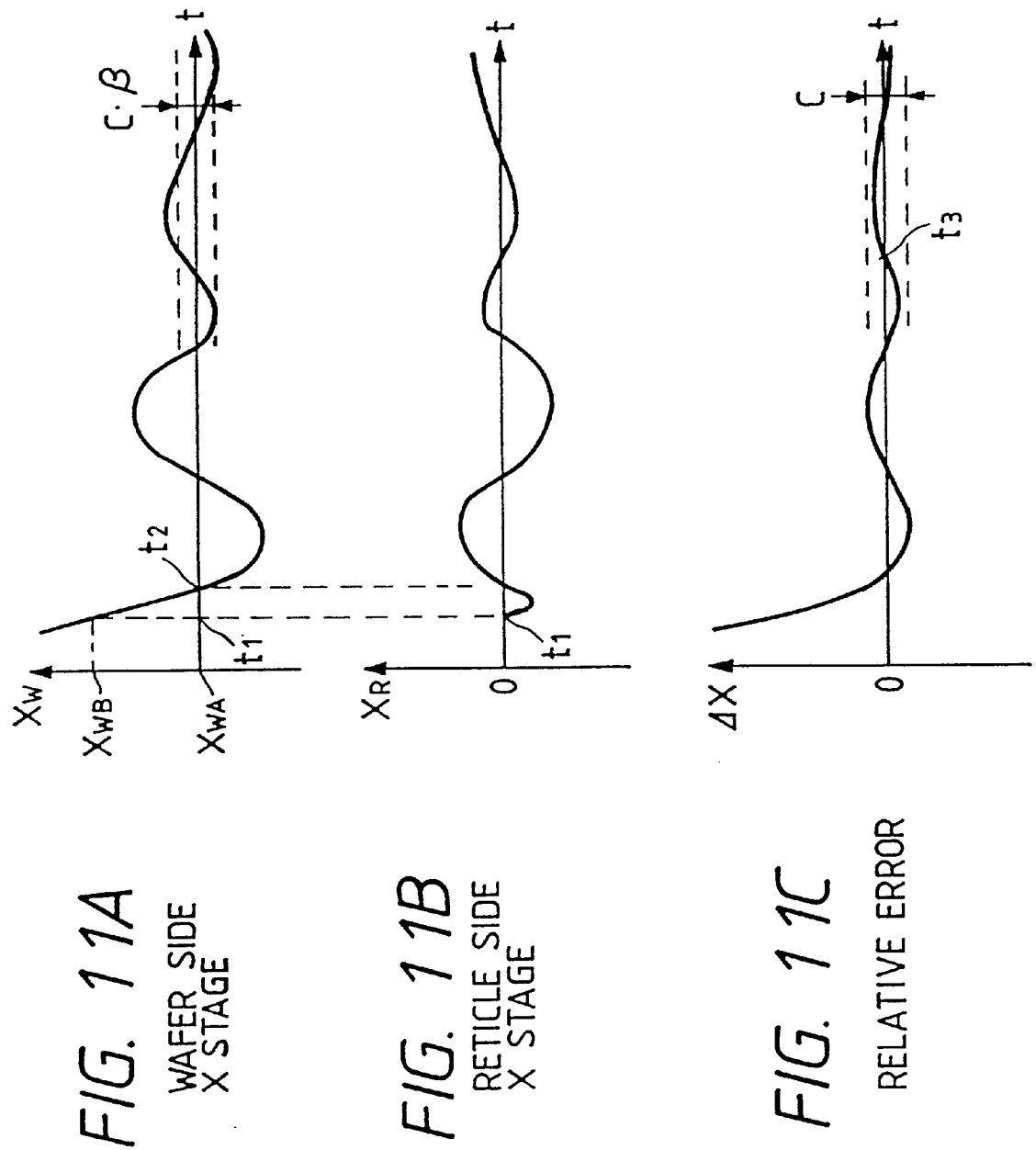
FIGS. 11A, 11B and 11C are graphs showing X coordinates of the wafer side X stage, X coordinates of the reticle side X stage and variations of relative errors, respectively.

FIGS. 11A, 11B and 11C show the X coordinates $X_W$ of the wafer side X stage 110X, the X coordinates $X_R$ of the reticle side X stage 103X and the relative errors ΔX expressed by Equation (1), respectively. At the time $t_1$ at which the coordinate $X_W$ of the wafer side X stage 110X reaches the coordinate $X_{WB}$ separated by a predetermined distance from the aimed coordinate $X_{WA}$ as shown in FIG. 11A, the correction operation judging system unit 119 as shown in FIG. 8 starts the operation of reticle stage driving system unit 123. When the initial position of the reticle side X stage 103X is $X_R$ including a value other than 0, correction operation setting system unit 119 controls the drive starting timing of reticle stage driving system unit 123 according to the stroke or the like of the reticle side X stage 103X. In other words, it is preferred that the drive of the reticle be initiated when the displacement of $|X_{WA}-X_W|/\beta$ of the wafer side X stage 103X is in a movable range at which the X coordinate of the reticle side X stage 103X is $X_R$. In this case, the overall shot areas are not necessarily in the image field (projection field) of the projection optical system 109. What is necessary is to start the drive of the reticle at the timing at which the overall shot areas are in the image field. It does not create any special problem whether at least a part of the shot areas is in the image field or not. Two closed loops are operated in parallel as shown by the function block diagrams in FIGS. 8 and 9, and the X coordinate $X_R$ of the reticle side X stage 103X changes so as to make the relative error ΔX zero, as shown in FIG. 11B. By making zero the initial aimed coordinate $X_{RA}$ of the reticle side X stage 103X and the relative error ΔX approximately zero, the following expression is obtained:

$$X_R \approx -(X_W-X_{WA})/\beta \quad (2)$$

The X coordinate $X_R$ of the reticle side X stage 103X changes at a characteristic in which the positional error $(X_W-X_{WA})$ is substantially inverted, except for the conversion coefficient $(1/\beta)$ for the projection magnification of the projection optical system 109. Thus, the X coordinate $X_R$ shown in FIG. 11B is also changed by following the characteristic obtained from substantially inverted positional error $(X_W-X_{WA})$. Thus, the X coordinate $X_R$ also changes by following the characteristic obtained from the substantially inverted positional error $(X_W-X_{WA})$ of FIG. 11A after the time $t_1$. The characteristic of the X coordinate $X_R$ is shown in FIG. 11B, when the projection magnification β is conveniently selected as 1.

As understood from Equation (1), the relative error ΔX is the difference between the converted value of the positional error $(X_W-X_{WA})$ of the wafer side X stage 110X in FIG. 11A and the positional error $X_R$ ($X_{RA}$=0) of the reticle side X stage 103X in FIG. 11B. When the projection magnification β is 1, the relative error ΔX shows the characteristic obtained from the sum of FIG. 11A and FIG. 11B, as shown FIG. 11C. In FIG. 8, the reticle side X stage 103X is lighter than the wafer side X stage 110X, and the moving distance of the former is shorter than the latter. The response speed of the reticle side X stage 103X is faster than that of the wafer side X stage 110X. Thus, the relative error ΔX is converged more quickly than the X coordinate $X_W$ of the wafer side X stage 110X in FIG. 11A.

Exposure condition setting system unit 122 shown in FIG. 9 determines that exposure is possible when the relative error ΔX is in a range of a predetermined width c, which is a separation from zero, for more than a predetermined time interval. In superposing exposure for more than two layers, the predetermined width c corresponds to a superposition accuracy determined by the minimum line width of the reticle pattern to be transferred to the wafer. In exposure for the first layer, on the other hand, the predetermined width c corresponds to the arrangement accuracy (required value) of the circuit pattern formed on the wafer. Since these conditions are satisfied at the time $t_3$ in FIG. 11C, exposure condition sensing system unit 122 emits exposure light IL to the illuminating optical system 101 shown in FIG. 8 for a predetermined exposure time. Exposure is performed under the condition that the positional displacement between the projection image of the pattern of the reticle R and the corresponding shot area of the wafer W is smaller than the predetermined width c, i.e., the superposition error of the reticle R and the wafer W is substantially zero. During exposure, the wafer side X stage 110X is continuously driven so that its position approaches the aimed position $X_{WA}$, and the reticle side X stage 103X is also continuously driven so that the relative error ΔX is reduced to zero. The position of the reticle in the field of the projection optical system 109 is deviated from the aimed position at the beginning of the exposure. When the optical characteristics of the projection optical system 109 such as distortion, magnification, focal position, curvature of field which are produced according to the displacement cannot be neglected, the optical characteristics may be changed continuously or intermittently just before or after the beginning of exposure, whereby the reticle pattern is always transferred onto the wafer at the best focussing condition. In this case, the relationship between the displacements and the characteristics is stored in memories and the characteristics may be controlled based on the relationship.

The magnification and the curvature of field can be changed by moving at least one of optical elements (an optical element close to the reticle R in particular) constituting the projection optical system 109. Distortion can be changed by moving the reticle in the optical axis directions.

The focal position can be set by moving the wafer along the optical axis according to its change by using a focal sensor for oblique ray directions. Alternatively, when an allowed displacement which can ignore the changes of the optical characteristics is previously set, the timing of starting the drive of the reticle may be determined based on the displacement. In other words, the reticle may be driven when the relative error $\Delta X$ is smaller than the allowed displacement.

To the contrary, it is assumed that exposure is performed at the aimed coordinate $X_{WA}$ for more than a predetermined time interval in a state in which the reticle side X stage 103X is fixed after the X coordinate $X_W$ of the wafer side X stage 110X is in the range of a predetermined width $c \cdot \beta$ in the conventional way. The response speed of the wafer side X stage 110X is lowered and the width $c \cdot \beta$ is reduced because the projection magnification $\beta$ is generally smaller than 1. Thus, the exposure cannot be performed even after the time $t_3$. In this embodiment according to the present invention, the time required for the final operation of positioning the reticle R and the wafer W can be made shorter than in the conventional case and the throughput of the exposure process is improved.

In this embodiment, the reticle stage driving means 123 shown in FIG. 8 begins operating at the time $t_1$ when the X coordinate $X_W$ arrives at the coordinate $X_{WB}$ separated by a predetermined distance from the aimed coordinate $X_{WA}$. Thus, the moving range of the reticle side X stage 103X can be made small, and the reticle side X stage 103X has a simple structure and is controlled easily. As the positioning operation in the X directions is performed according to the measured values given by the wafer interferometer 114X and the reticle interferometer 107X, this embodiment has an advantage that the response speed is high.

The positional accuracy of the reticle side X stage 103X can be set to the same degree as the positional accuracy required for the conventional wafer side X stage 110X, whereby the superposition accuracy of the reticle R and the wafer W can be made higher than the conventional case.

When the positional accuracy required for the reticle side X stage 103X in this embodiment is made $1/\beta$ times (for example, 5 times) of the positional accuracy required for the positioning operation made by driving only the wafer side X stage 110X, the control system of the reticle side X stage 103X can be made relatively simple in structure and can be manufactured at a low cost. Since the wafer side X stage 110X of this embodiment can be roughly positioned, the wafer side X stage 110X can be made simple in structure and can be manufactured at a low cost.

In this embodiment, the positioning operation of a wafer stage drive system 128 and a reticle stage drive system 129 continues after exposing time passes the time $t_3$ at which the exposure is initiated. In this way, if the positional displacement happens to occur by movement of the whole apparatus due to external disturbance, the reticle side X stage 103X follows at a high response speed so that the positional displacements cancel out. In this way, the superposition accuracy can be maintained at a high degree. Further, when the reticle pattern of the first layer is transferred onto the wafer in this embodiment, the throughput of the exposure process can be improved.

The drive of the reticle side X stage 103X starts at the time $t_1$ at which the X coordinate $X_W$ of the wafer side X stage 110X is lower than the coordinate $X_{WB}$ in FIGS. 11A, 11B and 11C. However, the drive of the reticle side X stage 103X may start at the time $t_2$ at which the X coordinate $X_W$ of the wafer side X stage 110X first crosses the aimed coordinate $X_{WA}$. In some cases, the moving range of the reticle side X stage 103X can be made smaller, and the preparing time for starting the exposure can be shortened.

In place of the reticle interferometer 107X, a mark detecting system, for example, may be used for detecting the mark on the reticle R. In this case, it is necessary that the coordinates of the detecting reference position of the mark detecting system be previously selected as the coordinate values of the coordinates (X, Y) on the wafer stage. The detecting reference position of the mark detecting system may be selected as the aimed position of the reticle, and the reticle stage may be driven according to the detecting signals of the mark detecting system in the same way as this embodiment. The drive of the reticle may start at the time when the mark on the reticle enters the mark detectable area of the mark detecting system. Instead, the reticle drive may be initiated by using the output of the reticle interferometer 107X when the mark does not enter the detectable range. In this case, the signal inputted to reduction system unit 121 may be switched from the output of the reticle interferometer 107X to the output of the mark detecting system when the mark enters the detectable area after the drive of the reticle interferometer starts.

A third embodiment of the present invention, which is a stepper, will be described with reference to FIGS. 12, 13A and 13B. The stepper has substantially the same structure as the one shown in FIG. 8 except that the positioning of the reticle side X stage 103X is determined by the calculated value of the alignment system 126 of a TTR type in place of the calculated value of the reticle interferometer 107X.

Figure 12:
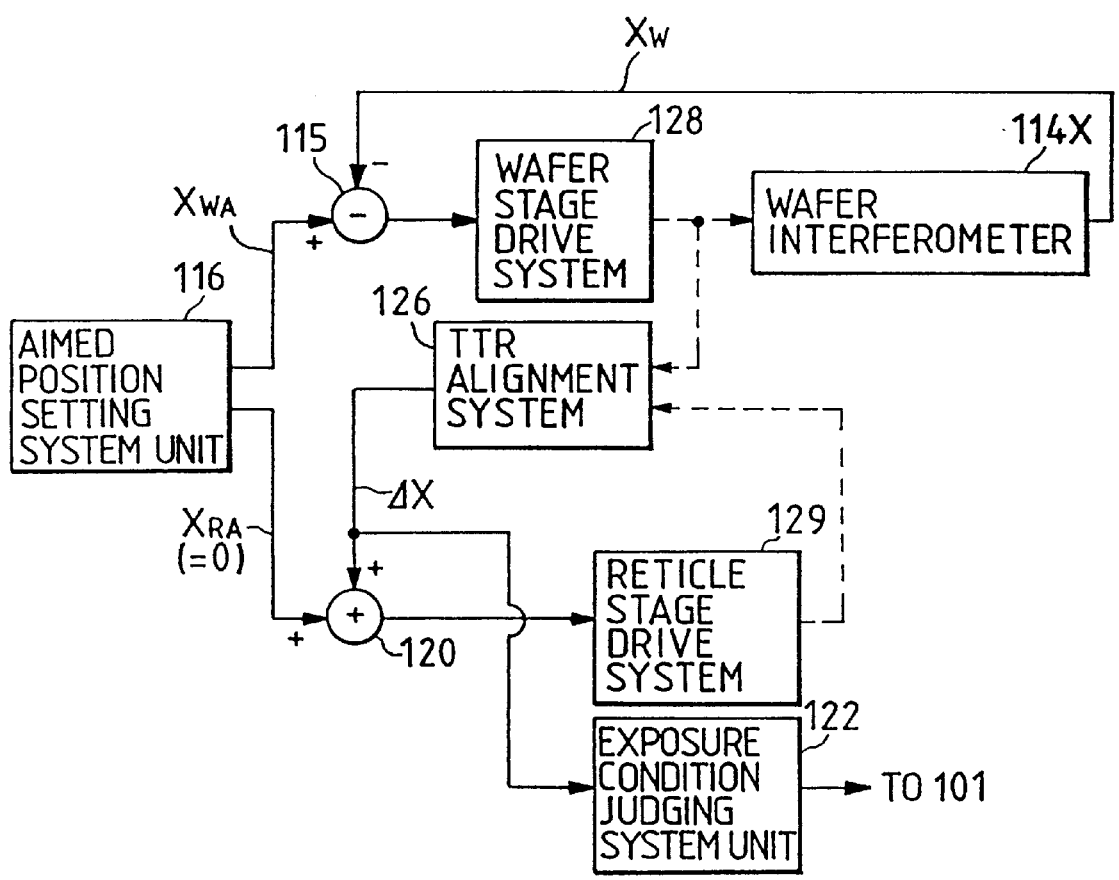
FIG. 12 is a functional block diagram showing the function of a third embodiment of an exposure apparatus according to the present invention when it is moved by a reticle side X stage.
Figures 13A, 13B:
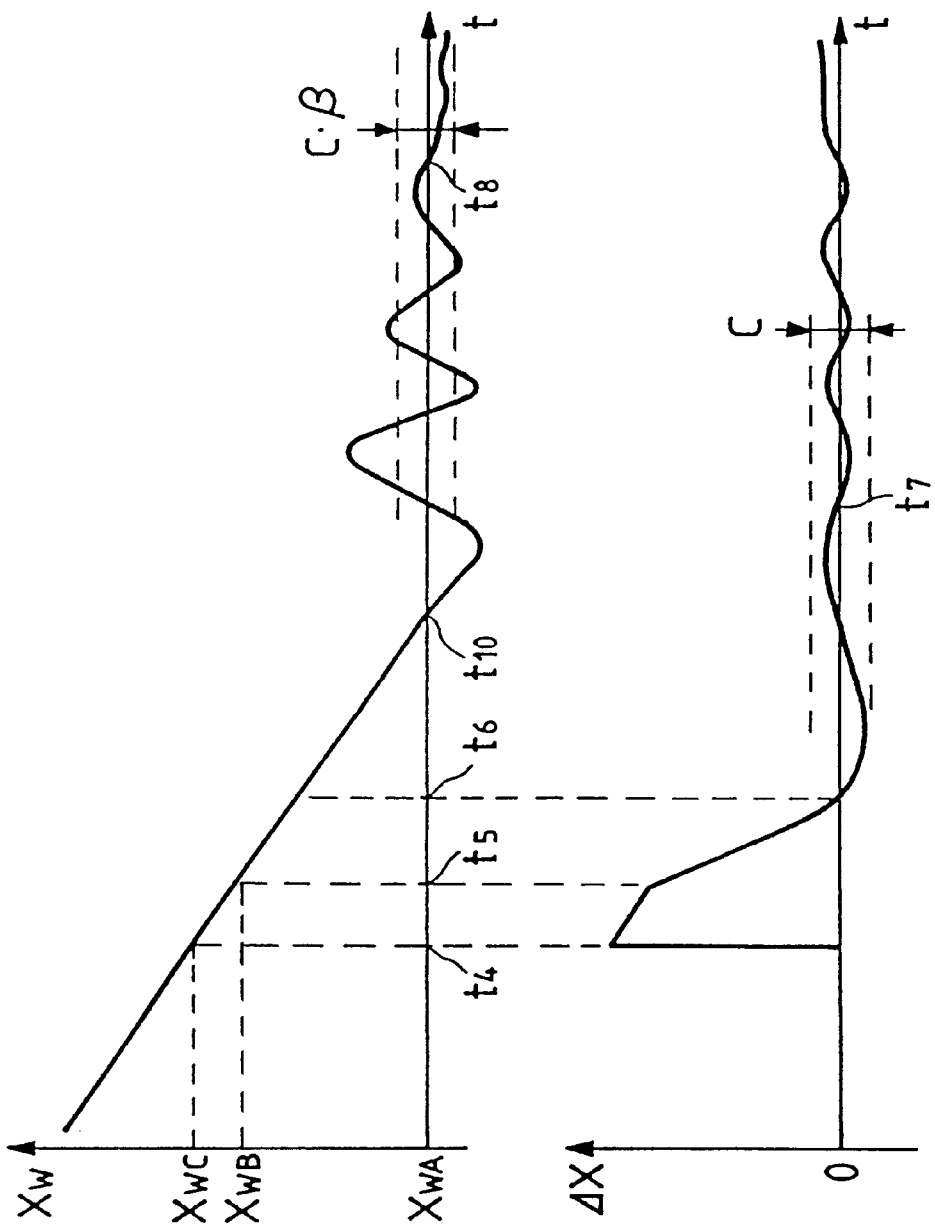
FIGS. 13A and 13B are graphs showing X coordinates of the wafer side stage when the exposure apparatus of FIG. 12 is set to a required position.

When the drive of the reticle side X stage 103X starts to perform the X direction positioning, two closed loops are formed in the functional block diagram shown in FIG. 12. Referring to FIG. 12 in which the parts and elements of the third embodiment corresponding to the ones in FIGS. 8 and 9 are designated by the same reference numerals, the aimed coordinate $X_{WA}$ of the wafer side X stage 110X and the aimed coordinate $X_{RA}$ (0 in this embodiment) of the reticle side X stage 103X are supplied from the correction operation judging system unit 119 to the reduction system unit 115 and the addition system unit 120, respectively.

The X coordinate $X_W$ measured by the wafer interferometer 114X is also supplied to the reduction system unit 115, and the inverted value $(X_{WA}-X_W)$ of the positional error of the wafer side X stage 110X obtained from the reduction system unit 115 is supplied to the wafer stage driving system 128. In the wafer stage driving system 128, the wafer side X stage 110X is driven so that the inverted value of the positional error is reduced to zero.

The relative error $\Delta X$ in the direction X measured by the alignment system 126 shown in FIG. 8, i.e., the positional displacement in the X direction (the converted value on the reticle R) between the reticle mark RMX on the reticle R and the wafer mark WMX formed in the to-be-exposed shot area on the wafer W is supplied to the addition means 120. The relative error $\Delta X$ is also supplied to exposure condition setting system unit 122 which starts the exposure of the illuminating optical system 101 in FIG. 8 when the relative error $\Delta X$ is retained in a predetermined allowed area for a predetermined time interval.

The relative error $\Delta X$ obtained from the addition system unit 120 is supplied to the reticle stage driving system 129 which drives the reticle side X stage 103X in FIG. 8 so that the relative error $\Delta X$ is reduced to zero. In this embodiment, the correction operation judging system unit 119 as shown in FIG. 8 is also used, and the drive of the reticle stage driving system 129 in FIG. 12 starts when the positional error of the wafer side X stage 110X is lower than a predetermined tolerance.

The exposure operation of the third embodiment will be described. In a state in which the emission of exposure light IL on the illuminating optical system 101 is interrupted, the reticle R is positioned based on the detected result obtained by the alignment telescope for the reticle (not shown). The reticle side X stage 103X is fixed and the measured value given by the reticle interferometer 107X is reset to zero.

The wafer W for exposure is mounted on the wafer side Y stage 110Y, and the relationship between the wafer W and the reference position on the wafer side Y stage 110Y is detected by the alignment system of an off-axis type. From this is found the relationship between the position (exposure position) of the projection image formed by the projection optical system 109 of the pattern of the reticle R and the position of the corresponding shot area on the wafer W. The aimed coordinate of the wafer side X state 110X is calculated for setting the corresponding shot area to its exposure position. Alternatively, the positional relationship between the reticle R and the predetermined shot area on the wafer W may be detected directly, and the aimed coordinate of the wafer side X stage 110X for setting the initial exposure position of the reticle R and setting the corresponding shot area on the wafer W to the exposure position may be calculated from the detected result.

Next, the aimed position setting system unit 116 in FIG. 8 supplies the aimed coordinate $X_{WA}$ of the wafer side X stage 110X to the reduction system unit 115 and the aimed coordinate $X_{RA}$ (=0) of the reticle side X stage 103X. Thereafter, the wafer stage drive system 128 moves the wafer side X stage 110X in the X directions in a stepped way and causes the X coordinate $X_W$ to approach the aimed coordinate $X_{WA}$, as shown in FIG. 13A.

Position measurement by the alignment system 126 in FIG. 8 starts at the time $t_4$ at which the X coordinate $X_W$ of the wafer side X stage 110X arrives at the coordinate $X_{WC}$ separated by a predetermined distance from the aimed coordinate $X_{WA}$. Thereafter, the correction operation judging system unit 119 in FIG. 8 starts the operation of the reticle stage drive system 129 in FIG. 12 at the time $t_5$ at which the X coordinate $X_W$ arrives at the $X_{WB}$ separated from the aimed coordinate $X_{WA}$. In the final operation, the relative error $\Delta X$ approaches zero, as shown in FIG. 13B. The alignment system 126 of a two-light bundle interfering type can detect the positional displacement between the reticle mark and the wafer mark accurately after the time $t_6$ delayed from the time $t_5$.

The reticle drive starting timing ($t_5$) takes place when the wafer mark WMX shown in FIG. 8 enters the mark detectable area of the alignment system 126. As the positional displacement between the marks WMX and RMX can be detected accurately when the wafer mark WMX enters the width of a half of the pitch P of the interference fringes formed by the two light bundles (i.e., ±P/4), the drive of the reticle starts when the wafer mark enters the range of ±P/4. When the mark detecting range of the alignment system 126 is large, it is preferred that the timing of the reticle drive be determined in accordance with the stroke, the mark detectable range and the like of the reticle side stage as described in the above embodiments. The other conditions are determined in the same way as in the above-mentioned embodiments.

In this case, the reticle side X stage 103X is lighter than the wafer side X stage 110X and has a shorter moving distance than the wafer side X stage 110X. The response speed of the reticle side X stage 103X is higher than the wafer side X stage 110X. Thus, the relative error $\Delta X$ in FIG. 13B is converged more quickly than the X coordinate $X_W$ of the wafer side X stage 110X in FIG. 13A. The exposure condition setting system unit 122 determines that exposure is possible when the relative error $\Delta X$ enters the predetermined width c separated from zero for more than the predetermined time interval. As shown in FIG. 13B, this condition is satisfied at the time $t_7$. Thus, the exposure condition setting system unit 122 emits exposure light IL of the illuminating optical system 101 in FIG. 8 for a predetermined time interval. Exposure is performed under the condition that the relative error $\Delta X$ corresponding to the positional displacement between the projection image of the pattern of the reticle R and the shot area of the wafer W becomes smaller than the predetermined width c, i.e., the superposition error of the reticle R and the wafer W is reduced to substantially zero. During the exposure operation, the wafer is moved so as to be set to the aimed position, and the reticle is moved so that the relative error $\Delta X$ is reduced to zero. Alternatively, the output of the wafer interferometer 114X may be cut just before start of the exposure, and the reticle and the wafer may be moved relatively based on the output of the alignment system 126.

To the contrary, it is assumed that exposure is performed at the aimed coordinate $X_{WA}$ for more than a predetermined time interval in a state in which the reticle side X stage 103X is fixed after the X coordinate $X_W$ of the wafer side X stage 110X is in the range of a predetermined width c·β in the conventional way. The response speed of the wafer side X stage 110X is lowered and the width c·β is reduced because the projection magnification β is generally smaller than 1. Thus, the exposure can be performed after the time $t_8$ much after the time $t_7$. In this embodiment according to the present invention, the time required for the final operation of positioning the reticle R and the wafer W can be made shorter than in the conventional case and the throughput of the exposure process is improved. Even if the reticle side X stage 103X is driven in the final step, the positioning is performed so that the relative error $\Delta X$ between the reticle R and the wafer W is reduced to zero. Thus, this embodiment has a special advantage that the superposition accuracy is enhanced. The drive of the reticle of this embodiment may start before the wafer mark WMX enters the detectable area of the alignment system 126. In other words, the drive of the reticle may start by the use of the output of the reticle interferometer in the same way as by the above-mentioned embodiments before the wafer mark WMX enters the detectable area, and the signal inputted to the addition system unit 120 may be changed to the output of the alignment system 126 after the wafer mark WMX has entered the detectable area.

The drive of the reticle stage drive system 129 may start at the time $t_{10}$ at which the X coordinate $X_W$ of the wafer side X stage 110X first crosses the aimed coordinate $X_{WA}$ to drive the reticle side X stage 103X. By doing so, the time for positioning is further shortened in some cases.

In this embodiment, the present invention is applied to a stepper. However, the present application is similarly applicable to a projection exposure apparatus which does not use a projection optical system, such as proximity exposure type. When the present invention is applied to a projection exposure apparatus using a projection optical system such as a stepper, the projection magnification may be several times of a unity, for example. Since the responsibility of the reticle side stage in this case is high, the throughput of the exposure process is improved. The wafer is moved toward the aimed position and the reticle is moved so that the relative error $\Delta X$ becomes zero in each embodiment. Thus, the reticle is set to a position corresponding to the positioning aimed position of the wafer after the exposure of a shot area has been finished, i.e., just before the next shot area is exposed. The drive of the reticle starts in the same way as in the above-mentioned embodiments to expose the next shot area by selecting the position as a reference. The wafer stage is moved in a stepped way to expose the next shot area. At the same time, the reticle may be previously moved in the field of the projection optical system to improve the throughput further before the drive of the reticle drive starts. In other words, when the wafer w steps in the +X direction, the reticle R is shifted from the original point by $R_1$ in the +X direction or by $R_2$ in the –X direction along the stepping direction. In this arrangement, the time required for converging the relative error $\Delta X$ to a value less than a predetermined value c by driving the reticle R can be shortened.

The present invention is not limited to the above-mentioned embodiments, but is applicable to various modifications as long as they do not depart from the scope of the present invention.

According to the present invention, the mask stage is moved in response to the positioning error of the substrate stage so that the time interval from the time at which the positioning of the predetermined exposure area of the substrate starts to the time at which the exposure operation of the mask pattern on the exposure area starts can be shortened. Thus, the present invention has a technical advantage that the throughput of the exposure process is improved.

When the present invention is applied to a projection exposure apparatus, the projection magnification from the mask of the projection exposure apparatus to the substrate is generally smaller than 1 (⅕, for example), and the positional accuracy required for the mask may be rougher than the positional accuracy required for the substrate. Thus, the time required for the final positioning operation is shortened further by moving the mask stage side. When the positioning accuracy of the mask stage side is set to the same degree of the positioning accuracy required for the substrate, however, the positioning accuracy becomes shorter than that of the conventional case and the positioning accuracy (superposition accuracy) can be improved.

Even when the overall exposure apparatus is moved by external disturbance and the positional displacement of the substrate stage occurs, the superposition accuracy of the expose area on the substrate and the mask pattern can be maintained at a high value by performing the correction operation of the mask stage during the exposure.

According to the present invention, the mask stage side is moved by the alignment system unit in response to the detected positional displacement. The time interval from the time at which the positioning of the predetermined exposure area of the substrate starts to the time at which the exposure operation of the mask pattern on the exposure area can be shortened. Thus, the present invention has the technical advantage that the throughput of the exposure process is improved.

When the drive of the mask stage is initiated in the above-mentioned exposure apparatus after the substrate stage error, which is the difference between the aimed position of the substrate stage and detected substrate stage side position, has been in the predetermined allowed area, the moving area of the mask stage can be reduced. Thus, the structure of the mask stage can be simplified and the mask stage can be controlled easily.

When the drive of the mask stage starts after the substrate stage error first crosses 0, the moving area of the mask stage can also be reduced. Thus, the structure of the mask stage can be simplified and the mask stage can be controlled easily.

Hereinafter, one embodiment of an alignment apparatus according to the present invention will be discussed with reference to the drawings. In accordance with this embodiment, the present invention is applied to a construction using an alignment sensor based on a heterodyne interference method as well as on a TTR method in the projection exposure apparatus for exposing a reticle pattern onto each shot area on the wafer through the projection optical system.

Figure 14:
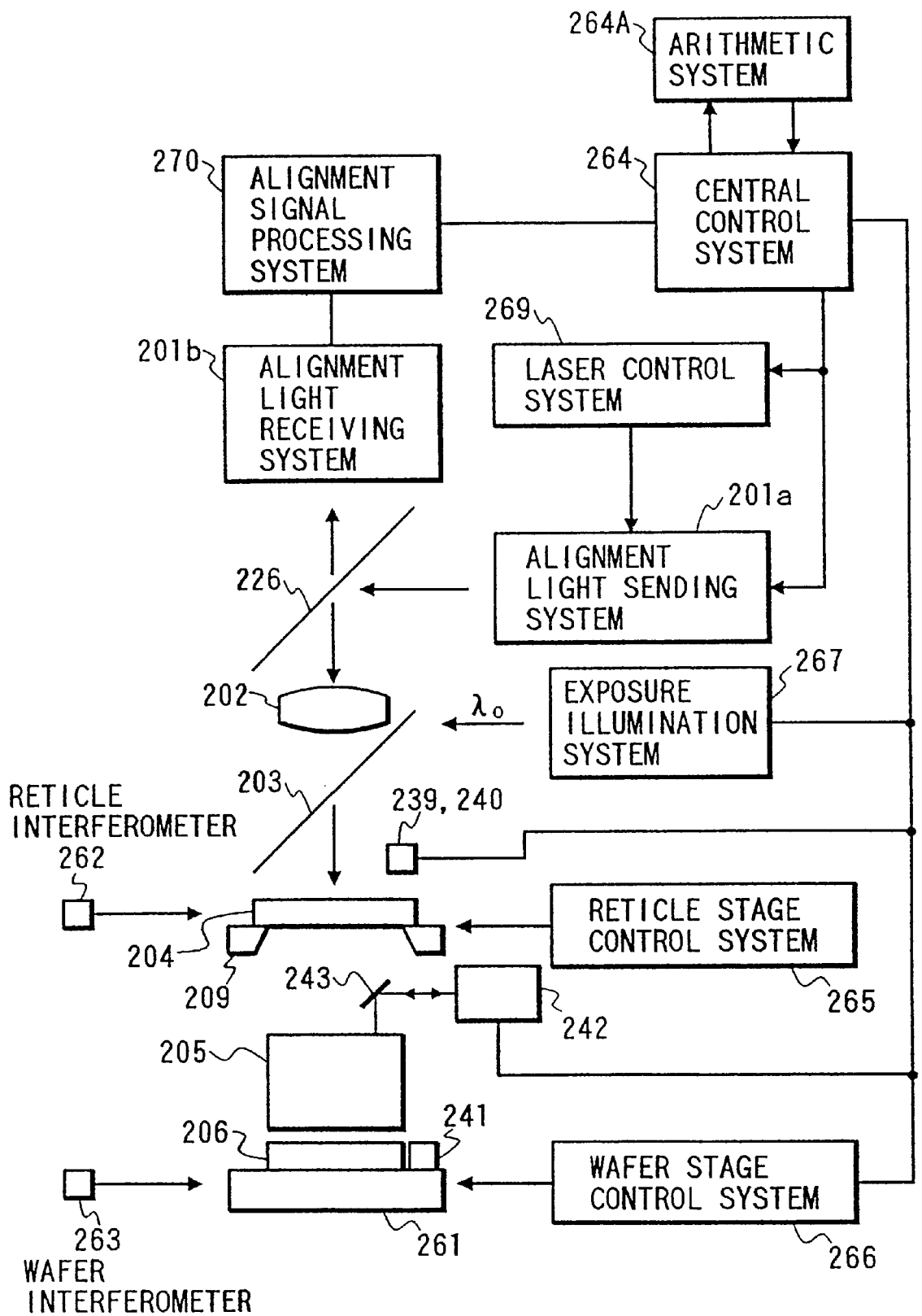
FIG. 14 is a schematic block diagram illustrating the whole projection exposure apparatus used in one embodiment of the present invention.

FIG. 14 schematically shows a construction of the projection exposure apparatus as a whole in this embodiment. Referring to FIG. 14, a reticle 204 is held on a reticle stage 209, while a wafer 206 is held on a wafer stage 261. The reticle 204 is irradiated with a beam of illumination light having a wavelength $\lambda_0$ for an exposure through a dichroic mirror 203, the beam having travelled from an exposure illumination system 267 when effecting an exposure. A pattern of the reticle 204 is demagnified down or reduced to, e.g., ⅕ under the illumination light through a projection optical system 205 and then exposed onto each shot area on the wafer 206 coated with a photoresist. The reticle stage 209 and the wafer stage 261 work to effect positioning of the reticle 204 and the wafer 206 respectively on a plane perpendicular to an optical axis of the projection optical system 205. Two-dimensional coordinates of the reticle stage 209 and the wafer stage 261 are detected respectively by a reticle-side interferometer 262 and a wafer-side interferometer 263, and detected results are supplied to a central control system 264. The central control system 264 controls operations of the reticle stage 209 and the wafer stage 261 via a wafer stage control system 266 as well as via a reticle stage control system 265.

Next, a TTL (Through The Lens) type prealignment sensor 242 for a prealignment is disposed in the vicinity of a side surface of the projection optical system 205. The prealignment sensor 242 emits laser beams converged slit-wise at an area vicinal to the wafer mark on the wafer 206 through the projection optical system 205 and a mirror 243 disposed between the reticle 204 and the projection optical system 205. In this state, the wafer 206 is scanned in a measuring direction by driving the wafer stage 261. Hereupon, beams of diffracted light are generated in a predetermined direction just when the wafer mark receives the laser beams. The diffracted light falls on a light receiving element of the prealignment sensor 242 via the projection optical system 205 and the mirror 243. A photoelectric conversion signal transmitted from this light receiving element 242 is supplied to the central control system 264. The central control system 264 obtains two-dimensional coordinates of the wafer mark when the photoelectric conversion signal comes to a maximum level thereof from a measured value of the wafer-side interferometer 263. The prealignment of the relevant shot area on the wafer 206 is conducted based on this detected result. Although the prealignment sensor 242 in this embodiment is based on a laser step alignment method, an imaging method, etc. is also, as a matter of course, usable.

Fixed also onto the wafer stage 261 is a fiducial mark member 241 formed with a fiducial mark and a fiducial diffraction grating mark. When performing the reticle alignment, the fiducial mark member 241 is moved into an exposure field of the projection optical system 205, and the fiducial mark is irradiated with a beam of illumination light having the same wavelength $\lambda_0$ as that of the illumination light for the exposure from a bottom surface side. The illumination light passing through the fiducial mark is projected via the projection optical system 205 to form a fiducial mark image on the alignment mark on a lower surface of the reticle 204. The alignment mark and the fiducial mark are imaged by reticle alignment microscopes 239, 240 disposed upwardly of the reticle 204, and image signals are supplied to the central control system 264. The central control system 264 processes the thus supplied image signals, thereby obtaining a positional deviation quantity of the alignment mark from the fiducial mark.

Furthermore, an alignment sensor based on the TTR method and the heterodyne interference method as well is provided for effecting a final alignment. This alignment sensor is constructed of a laser control system 269, an alignment light sending system 201a, a beam splitter 226, an objective lens 202, an alignment light receiving system 201b and an alignment signal processing system 270. When performing the alignment, the central control system 264 causes two laser beam sources in the alignment light sending system 201a to emit laser beams through the laser control system 269. The laser beams emitted from the laser beam sources in the alignment light sending system 201a travel toward the beam splitter 226 in the form of alignment laser beams while undergoing a predetermined frequency modulation. The laser beams reflected from the beam splitter 226 penetrate the objective lens 202 and the dichroic mirror 203 and fall on the reticle 4. The laser beams passing through the reticle 204 then strike on the fiducial diffraction grating mark (or the wafer mark on the wafer 206) of the fiducial mark member 241.

Then, a heterodyne beam generated by a diffraction at the fiducial mark member 241 (or the wafer mark) and a heterodyne beam generated by a diffraction at the reticle mark are incident on the alignment light receiving system 201b via the dichroic mirror 203, the objective lens 202 and the beam splitter 226, and two beat signals are thereby generated in the alignment light receiving system. These beat signals are supplied to the alignment signal processing system 270, wherein a phase difference between the two beat signals is detected. The thus detected phase difference is supplied to the central control system 264. Based on the detected phase difference, the central control system 264 obtains a target phase difference when aligned or performs the final alignment.

Further, in accordance with this embodiment, when conducting the final alignment by use of the alignment sensor based on the heterodyne interference method, an arithmetic system 264A calculates a standard deviation as a scatter and an average value, per predetermined time, of a difference between the positional deviation of the reticle 204 from the wafer mark and a target value which will be mentioned later on the basis of the phase difference given from the alignment signal processing system 270. A result of this calculation is supplied to the central control system 264.

Given next is a detailed explanation of the reticle alignment microscope and the alignment sensor by the heterodyne method.

FIGS. 15A and 15B show the alignment optical system and the stage system of the projection exposure apparatus in this embodiment, wherein a Z-axis is taken in parallel to an optical axis AX of the projection optical system 205, and a rectangular coordinate system of the plane perpendicular to the Z-axis is set on X- and Y-axes. In this case, FIG. 15A is a front view of the projection exposure apparatus as viewed in a Y-direction. FIG. 15B is a side view of FIG. 15A. The alignment optical system 201 corresponds to the alignment light sending system 201a, the beam splitter 226 and the alignment light receiving system 201b in FIG. 14. The wafer stage 261 in FIG. 14 corresponds to X- and Y-stages 208X, 208Y for positioning the wafer 206 in X- and Y-directions. Further, referring to FIGS. 15A and 15B, a wafer holder 207 for holding the wafer 206 is provided between the wafer stage and the wafer 206. As a matter of fact, a Z-stage for positioning the wafer 206 in a Z-direction is mounted on the X-stage 208X, and the fiducial mark member 241 is provided on this Z-stage.

Emitted from the alignment optical system 201 are reticle alignment illumination beams $RB_1$, $RB_2$ at an average wavelength $\lambda_1$ different from the exposure wavelength $\lambda_0$ but having a frequency difference $\Delta f$ (50 kHz in this embodiment), wafer alignment illumination beams $WB_1$, $WB_2$, reticle alignment illumination beams $PB_3$, $PB_4$ at an average wavelength $\lambda_2$ approximate to the wavelength $\lambda_1$ but having a frequency difference $\Delta f$ (=50 kHz) and wafer alignment illumination beams $WB_3$, $WB_4$.

As illustrated in FIGS. 15A and 15B, the reticle alignment illumination beams $PB_1$, $PB_2$ are converged on the reticle 204 through the objective lens 202 and are respectively incident at incidence angles $-\theta_{R1}$, $\theta_{R1}$ on the diffraction grating reticle mark 235A on the lower surface of the reticle 204.

Figure 16:
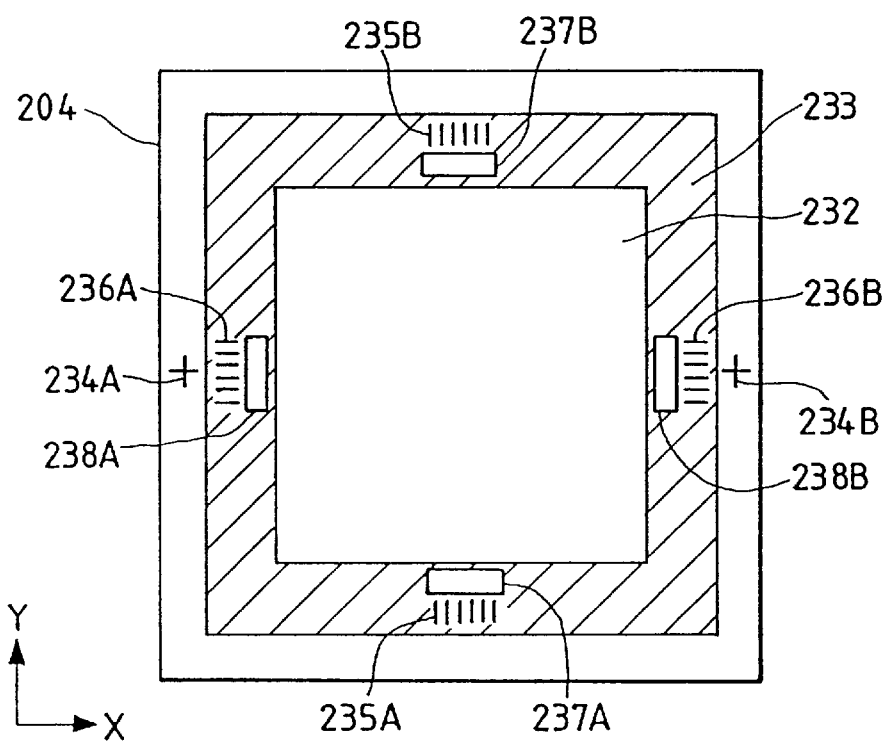
FIG. 16 is a plan view illustrating a pattern layout on a reticle 204 in FIGS. 15A and 15B.

FIG. 16 illustrates a pattern layout of the reticle 4 in this embodiment. Referring to FIG. 16, a masking zone 233 is formed along a perimeter of a pattern area 232 disposed at the central portion of the reticle 204. Formed in X-directionally-extended sides of the masking zone 233 are Y-axis reticle marks 236A, 236B composed of diffraction gratings formed at Y-directional pitches $P_R$. Formed in Y-directionally-extended sides thereof are X-axis reticle marks 235A, 235B composed of the diffraction gratings formed at X-directional pitches $P_R$. Transmitting windows (hereinafter referred to as [reticle windows]) 237A, 237B transmitting the alignment beams traveling toward the wafer are formed inwardly of the reticle marks 235A, 235B. Reticle windows 238A, 238B transmitting the alignment beams traveling toward the wafer are formed inwardly of the reticle marks 236A, 236B. Further, cross alignment marks 234A, 234B are formed so that the masking zone 233 is interposed therebetween in the X-direction.

Figure 20:
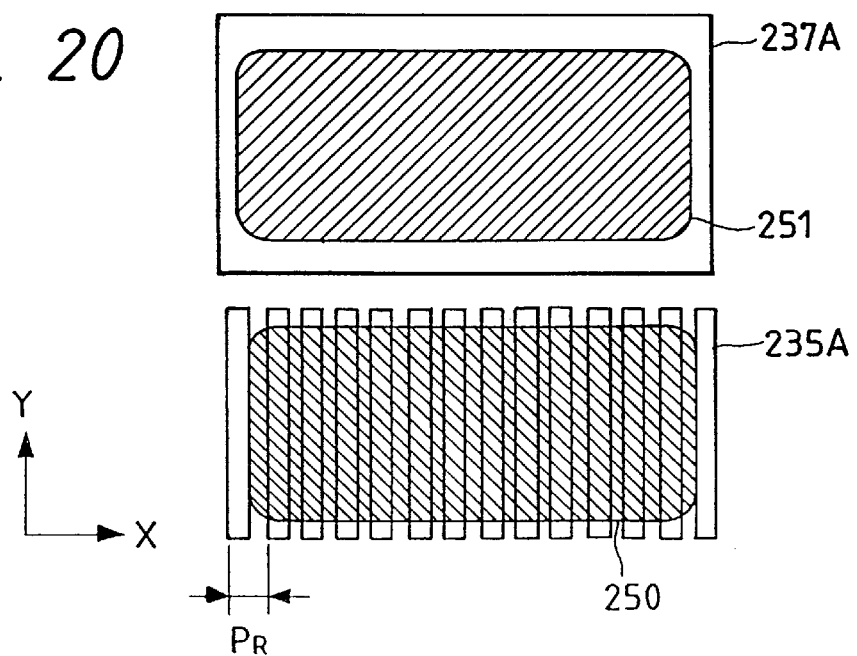
FIG. 20 is an enlarged plan view illustrating a reticle mark 235A and a reticle window 237A.

FIG. 20 is an enlarged view showing the reticle mark 235A and the reticle window 237A of FIG. 16. The reticle mark 235A is irradiated with a beam flux 250 composed of the illumination beams $PB_1$, $PB_2$, $PB_3$, $PB_4$, while the reticle window 237A transmits a beam flux 251 composed of the illumination beams $WB_1$, $WB_2$, $WB_3$, $WB_4$.

Referring back to FIGS. 15A and 15B, the incidence angles $-\theta_{R1}$, $\theta_{R1}$ and the grating pitch $P_R$ of the reticle mark 235A are in a relationship given by the following equation, and a +1st-order diffracted light beam $RB_1^{+1}$ of the illumination light beam $RB_1$ and a 1st-order diffracted light beam $RB_2^{-1}$ of the illumination light beam $RB_2$ are individually generated just above it and travel back to the alignment optical system 201 in the form of alignment detection beams (heterodyne beams) via the objective lens 202.

$$\sin(\theta_{R1}) = \lambda_1/P_R \qquad (3)$$

Similarly, the reticle alignment illumination beams $PB_3$, $PB_4$ are also converged on the reticle 204 through the objective lens 202 and then fall at incidence angles $-\theta_{R2}$, $\theta_{R2}$ on the reticle mark 235A on the reticle 204. At this time, a +1st-order diffracted light beam $RB_3^{+1}$ of the illumination light beam $PB_3$ and a −1st-order diffracted light beam $RB_4^{-1}$ of the illumination light beam $RB_4$ are individually generated just above it and travel back to the alignment optical system 201 via the objective lens 202.

On the other hand, the wafer alignment illumination beams $WB_1$, $WB_2$ travel through the reticle window 237A on the reticle 204 and reach the chromatic aberration control plate 210 in the projection optical system 205. The chromatic aberration control plate 210 comprises a plurality of axial chromatic aberration control elements formed on a transmitting substrate which is made of glass substrate. This chromatic aberration control plate 210 is used for deflecting wafer alignment illuminating light beam and the alignment detection beam of the alignment optical system 201 shown in FIGS. 15A and 15B. Axial chromatic control elements $G1_A$, $G1_B$ (see FIG. 19) assuming a diffraction-grating-like configuration are respectively formed in portions transmitting the illumination beams $WB_1$, $WB_2$ of the chromatic aberration control plate 210. The illumination beams $WB_1$, $WB_2$ are respectively deflected at angles $-\theta_{G1}$, $\theta_{G1}$ and then incident at incidence angles $-\theta_{W1}$, $\theta_{W1}$ on the diffraction grating wafer mark 248A.

Figure 17:
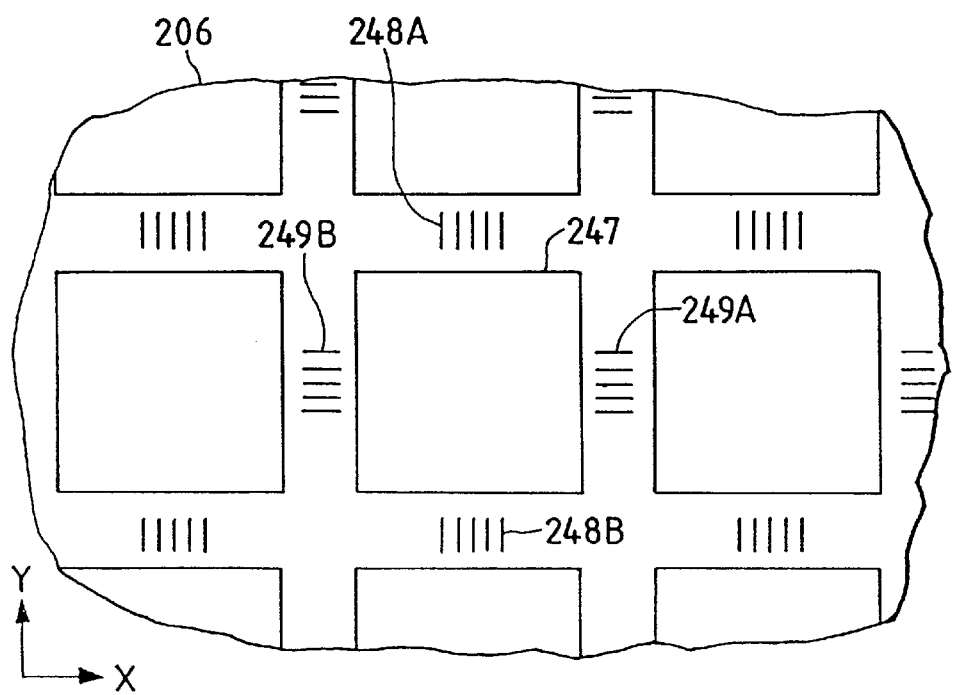
FIG. 17 is an enlarged plan view showing shot areas and wafer marks of a wafer 206 in FIGS. 15A and 15B.

FIG. 17 illustrates part of a shot array on the wafer 206. Referring to FIG. 17, there are formed Y-axis wafer marks 249A, 249B composed of the diffraction gratings formed at Y-directional pitch $P_W$ so that an exposure target shot area 247 is interposed therebetween in the X-direction. Formed also are X-axis wafer marks 248A, 248B composed of the diffraction gratings formed at X-directional pitch $P_W$ so that the shot area 247 is interposed therebetween in the Y-direction. Wafer marks are also attached to other shot areas.

Figure 21:
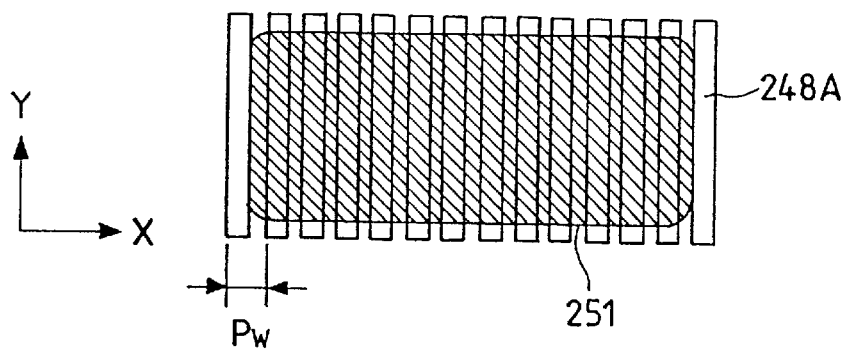
FIG. 21 is an enlarged plan view showing a wafer mark 248A.

FIG. 21 is an enlarged view of the wafer mark 248A of FIG. 4. Referring to FIG. 21, the wafer mark 248A is irradiated with a beam flux composed of the illumination beams $WB_1$, $WB_2$, $WB_3$, $WB_4$.

Referring back to FIG. 15A, the incidence angles $-\theta_{W1}$, $\theta_{W1}$ and the grating pitch $P_W$ of the wafer mark 248A are in a relationship given by the following equation, and a +1st-order diffracted light beam $WB_1^{+1}$ of the illumination light beam $WB_1$ and a −1st-order diffracted light beam $WB_2^{-1}$ of the illumination light beam $WB_2$ are individually generated just above it. Then, these two diffracted beams turn out alignment detection beams (heterodyne beams).

$$\sin(\theta_{W1}) = \lambda_1 / P_W \qquad (4)$$

On this occasion, the wafer alignment illumination beams $WB_3$, $WB_4$ have their wavelengths approximate to those of the illumination beams $WB_1$, $WB_2$, and it can be therefore considered that passing positions on the chromatic aberration control plate 210 individually exist substantially on the axial chromatic aberration control elements $G1_A$, $G1_B$. Therefore, the illumination beams $WB_3$, $WB_4$ are respectively deflected at angles $-\theta_{G2}$, $\theta_{G2}$ and then incident at incidence angles $-\theta_{W2}$, $\theta_{W2}$ on the diffraction grating wafer mark 248A. Then, a +1st-order diffracted light beam $WB_3^{+1}$ of the illumination light beam $WB_3$ and a −1st-order diffracted light beam $WB_4^{-1}$ of the illumination light beam $WB_4$ are individually generated just above it and turn out alignment detection beams.

In this case, as illustrated in FIG. 15B, the wafer alignment illumination beam is inclined at the angle $\theta_m$ and thus incident on the wafer 206 in the non-measuring direction (Y-direction) by the deflecting action of the chromatic aberration control plate 210. Hence, the position where each of the above alignment detection beams passes by on the chromatic aberration control plate 210 is different from the passing position when falling thereon. The alignment detection beam from the wafer mark 248A passes through the axial chromatic aberration control element $G1_C$ (see FIG. 19) on the chromatic aberration control plate 210, and a chromatic aberration in a horizontal direction is thereby corrected. Then the alignment detection beam travels toward the reticle window 237A. Thereafter, each detection beam again travels back to the alignment optical system 201 via the reticle window 237A and the objective lens 202. Further, a position deviating by $\Delta\beta$ in the Y-direction on the surface of the wafer 206 is illuminated with the wafer alignment illumination in contrast with a case where the chromatic aberration control plate 210 is not disposed.

Figure 19:
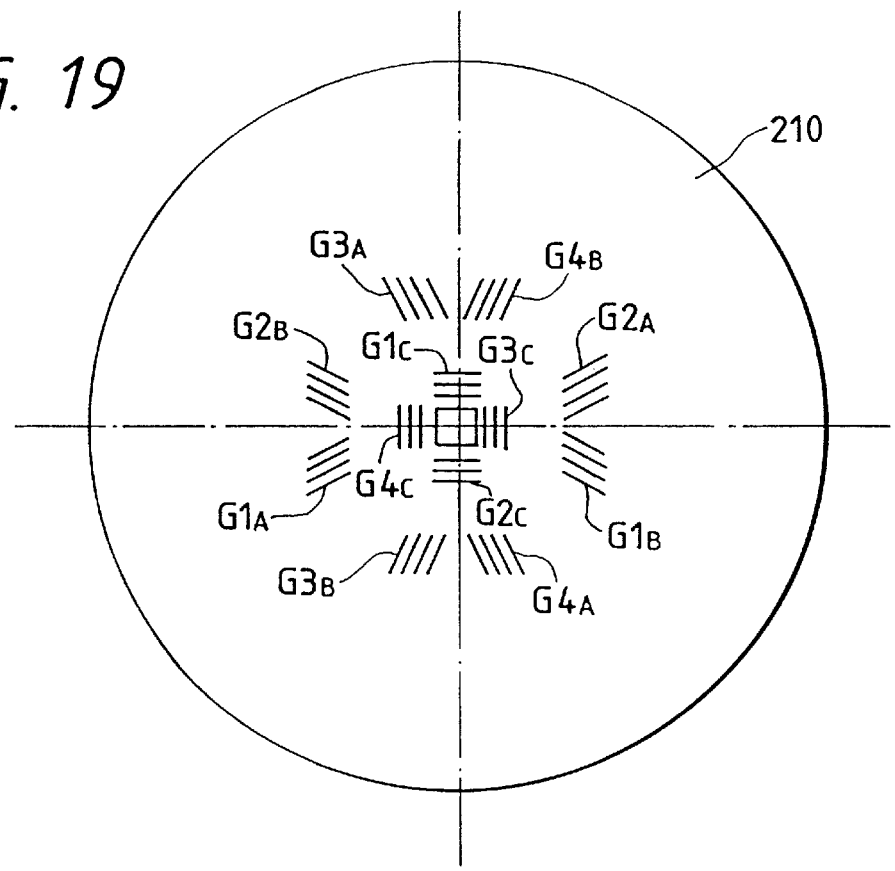
FIG. 19 is a plan view showing a layout of axial chromatic aberration control elements on a chromatic aberration control plate 210 in FIGS. 15A and 15B.

FIG. 19 shows the chromatic aberration control plate 210. Referring to FIG. 19, twelve axial chromatic aberration control elements are formed on a transmissive substrate composed of a glass substrate. Then, the three axial chromatic aberration control elements $G1_A$, $G1_B$, $G1_C$ are used for deflecting the alignment detection beam and the wafer alignment illumination beam of the alignment optical system 201 of FIGS. 15A and 15B. As a matter of fact, there is additionally a 3-axis alignment optical system, and, therefore, totally 12 (=3×4) pieces of axial chromatic aberration control elements $G1_A$, $G1_B$, $G1_C$ to $G4_A$, $G4_B$, $G4_C$ are formed on the chromatic aberration control plate 210.

Herein, the alignment optical system 201 will be explained in greater detail with reference to FIGS. 18A and 18B. FIG. 18B is a view of the alignment optical system 201 as viewed in the same direction as that in FIG. 15B. FIG. 18A is a view of the alignment optical system 201 as viewed in the same direction as that in FIG. 15A. FIG. 18C is a bottom view of FIG. 18A.

Referring to FIGS. 18A, 18B and 18C, a laser beam having a wavelength $\lambda_1$ is emitted from a first laser beam source 211 composed of, e.g., a laser diode, and a laser beam having a wavelength $\lambda_2$ is emitted from a second laser beam source 212 constructed of, e.g., an He—Ne laser beam source. Those laser beams are synthesized into an illumination beam B by use of a beam synthesizing prism 213. Then, the illumination beam B is incident on an acoustic optical modulation element (hereinafter abbreviated to [AOM]) 214 driven at a frequency $F_1$. The AOM 214 is defined as a Raman-Nath AOM for uniformly obtaining the ±1st-order diffracted beams by a Raman-Nath diffraction by making the beam vertically incident. Since the two laser beams among the illumination beams are slightly different in terms of their wavelengths, and hence the diffracted beams are generated at angles a bit different from each other by the AOM 214. Those + and −1st-order diffracted beams have frequency differences $+F_1$, $-F_1$ with respect to the basic frequencies.

The laser beam emitted from the AOM 214 passes through a lens 215 and falls on a spatial filter 216, and only the +1st-order diffracted beams are selected by the spatial filter 216. The selected diffracted beams penetrate a lens 217 and are incident on an AOM 218 to intersect each other, the AOM 218 being rotated through 45° with respect to the AOM 214 and thus disposed and also driven at a frequency $F_2$. The AOM 218 is classified as a Bragg AOM, and an incidence angle is set at 1/sin 45° of a Bragg angle. Accordingly, as viewed on the plane rotating through 45° about the optical axis, the incidence angle of the diffracted beam is the Bragg angle. In this case, the −1st-order diffracted beams are intensively generated in the AOM 218 with respect to the laser beams undergoing a $+F_1$ frequency modulation in the AOM 214 and then subjected to a $-F_2$ frequency modulation in the AOM 218. The −1st-order diffracted beams turn out alignment beams $B_1$, $B_3$ undergoing a $+(F_1-F_2)$ frequency modulation when emitted from the laser beam sources 211, 212. Similarly, the +1st-order diffracted beams are intensively generated in the AOM 218 with respect to the laser beams undergoing a $-F_1$ frequency modulation in the AOM 214 and then subjected to the $-F_2$ frequency modulation in the AOM 218. The +1st-order diffracted beams turn out alignment beams $B_2$, $B_4$ undergoing a $-(F_1-F_2)$ frequency modulation when emitted from the laser beam sources 211, 212. As a result, a frequency difference $\Delta f$ between the alignment beams $B_1$, $B_3$ and the alignment beams $B_2$, $B_4$ is expressed by 2 $(F_1-F_2)$, and, in this example, it is assumed that $\Delta f$ be set at 50 kHz. The laser beams passing through the AOM 218 are incident on a spatial filter 220 via a lens 219, and the alignment beams $B_1-B_4$ selected by the spatial filter 220 are led to a posterior stage.

The alignment beams $B_1-B_4$ are converged on a field stop 222 via a lens 221 and, after a beam shape on the reticle or the wafer has been determined, split into the reticle alignment illumination beams $RB_1-RB_4$ and the wafer alignment illumination beams $WB_1-WB_4$ by a reticle/wafer beam splitting prism 223. Thereafter, the alignment illumination beams reach a direct vision prism 225 via a lens 224. The direct vision prism 225 is rotatable about the optical axis and driven by an unillustrated motor in response to an indication given from the central control system of FIG. 14. When the direct vision prism 225 is rotated, two-color illumination beams having wavelengths $\lambda_1$, $\lambda_2$ change in terms of their relative angle, and the illumination beams $RB_3$, $WB_3$, $RB_4$, $WB_4$ each having the wavelength $\lambda_2$ are split with respect to the illumination beams $RB_1$, $WB_1$, $RB_2$, $WB_2$ each having the wavelength $\lambda_1$. Thus, the illumination beams with the changed relative angle travel toward the objective lens 202 of FIGS. 15A and 15B via a beam splitter 226. With the change in the relative angle, there varies a relative relationship between the irradiating positions of the two-color illumination beams having the wavelengths $\lambda_1$, $\lambda_2$ on the reticle and the wafer.

On the other hand, the alignment detection beams from the reticle mark 235A and the wafer mark 248A of FIGS. 15A and 15B travel back to the alignment optical axis 201 of FIGS. 18A and 18B and are, thereafter, reflected by the beam splitter 226. The alignment detection beams are, after passing through a lens 227, then split into a reticle detection beam and a wafer detection beam by a detection beam splitting prism 228 disposed in a position conjugate to the reticle and the wafer. A reticle detection beam $RB_1^{+1}$, $RB_2^{-1}$ and $RB_3^{+1}$, $RB_4^{-1}$ penetrate a detection beam splitting prism 228, and there are selected only the detection beams $RB_{1+1}$, $RB_2^{-1}$ by a color filter 229 which transmits only a beam flux having the wavelength $\lambda_1$. The wafer detection beams $WB_1^{+1}$, $WB_2^{-1}$, $WB_3^{+1}$, $WB_4^{-1}$ received by a photoelectric detecting element 230 are reflected by the detection beam splitting prism 228 and then received by a photoelectric detecting element 231. The photoelectric detecting element 230 outputs a reticle beat signal $S_R$ corresponding to a position of the reticle mark, while the photoelectric detecting element 231 outputs a wafer beat signal $S_W$ corresponding to a position of the wafer mark.

The reticle beat signal $S_R$ is defined as wave-like beat signal having the frequency $\Delta f$ relative to the detection beams $RB_1^{+1}$, $RB_2^{-1}$, while the wafer beat signal $S_W$ is a sine wave-like beat signal having the frequency $\Delta f$ relative to the detection beams $WB_1^{+1}$, $WB_2^{-1}$, $WB_3^{+1}$, $WB_4^{-1}$. A phase difference $\Delta\phi$ [rad] therebetween changes depending on the X-directional relative moving quantities with respect to the reticle 204 and the wafer 206, and relative moving quantities $\Delta x$ thereof are given by the following equations:

$$\Delta x \text{ (on the reticle)} = P_R \cdot \Delta\phi/(4\pi) \quad (5)$$

$$\Delta x \text{ (on the wafer)} = P_W \cdot \Delta\phi/(4\pi) \quad (6)$$

It is to be noted that the beat signals corresponding to the Y-axis reticle mark and wafer mark are obtained by the Y-directional alignment sensor.

The reticle beat signals $S_R$ and the wafer beat signals $S_W$ are respectively adjusted in terms of signal intensities (amplitudes) by amplifiers 253, 252. Those reticle and wafer beat signals are then supplied to an alignment signal processing system 270 via analog/digital (A/D) converters 255, 254, wherein a phase difference between the two signals $S_R$, $S_W$ is detected. The detected phase difference is supplied to the central control system 264. An arithmetic system 264X belonging to the central control system 264 calculates a standard deviation as a scatter and an average value, per fixed time, of a difference between a positional deviation of the reticle 204 from the wafer mark and a target value which will be mentioned later and supplies a result of this calculation to the central control system 264.

As stated above, in the alignment optical system 201, there are provided two light sources which emit two laser beams having wavelengths slightly different from each other, a heterodyne beam generation system which contains acoustic optical modulation elements, and the like, and a heterodyne beam detection system.

Note that positioning of the wafer mark is effected under the projection optical system 205 in FIGS. 15A and 15B, but the diffraction grating mark on the fiducial mark member 241 is illuminated with the wafer alignment illumination beam by moving the fiducial mark member 241 to under the projection optical system when performing an adjustment (calibration) of the alignment optical system 201.

Next, there will be explained two examples of the positioning and exposing operations. In the following discussion, the X-directional positioning operation will be explained, but the Y-directional positioning operation is also conducted.

Method Using Measured Value of Interferometer

At first, the reticle 204 in FIG. 14 is carried onto the reticle stage 209. Viewed through the reticle alignment microscopes 239, 240 are the alignment marks 234A, 234B of the reticle 204 shown in FIG. 14 and the frame-like fiducial mark (unillustrated) on the fiducial mark member 241 on the wafer stage 261 (X-stage 208X, Y-stage 208Y). The reticle 204 is thus positioned. Next, the wafer 206 is carried onto the wafer stage 261 by an unillustrated wafer auto loader. Formed on this occasion on the wafer 206 is an alignment mark (global alignment mark) for the prealignment sensor 242 of FIG. 14 separately from the wafer mark for the alignment sensor based on the heterodyne interference method, the wafer mark being attached to each shot area. Then, referring to FIG. 14, there is monitored a result of subtracting a $\beta$-multiplied ($\beta$ is a projection magnification of the projection optical system 205, and e.g., $\beta=\frac{1}{5}$) measured value of the reticle-side interferometer 262 from the measured value of the wafer-side interferometer 263 while driving the wafer stage 261. The prealignment sensor 242 thereby measures coordinate positions (X, Y) of four or more global alignment marks on the wafer 206.

On this occasion, since a relationship between the global alignment mark and each shot area on the wafer is previously known, the coordinate positions $(X_i, Y_i)$ $(i=1, 2, 3, \ldots)$ of the respective shot areas are calculated by use of the measured results thereof.

Thereafter, the processing shifts to an exposing step. When exposing, e.g., an (i)th shot 247 area on the wafer 206, the (i)th shot area (the X coordinate thereof is set as $X_i$) is located in an exposure position by stepping the wafer stage 261. For this purpose, when paying attention to only the X-direction, a state in a target position can be expressed by the following equation:

$$I_W - I_R \cdot \beta - X_i - \epsilon = 0 \quad (7)$$

where $I_W$ is the measured value of the wafer-side interferometer 263, and $I_R$ is the measured value of the reticle-side interferometer 262.

In this case, $X_i$ can be also considered to be a target value (constant). Further, $I_R \cdot \beta$ is a value into which the position of the reticle 204 is converted on the side of the wafer stage 261, and hence the left side of the Equation (7) is a result of subtracting the target value from the relative positional deviation between the reticle 204 and the (i)th shot area on the wafer 206. Herein, this is termed a residual error e with respect to the target position. The central control system 264 calculates the residual error e with a period on the order of, e.g, 1 ms.

Herein, for satisfying the Equation (7), one of the wafer stage 261 (X-stage 208X, Y-stage 208Y) and the reticle stage 209 may be moved. That is, the X-stage 208X and the Y-stage 208Y are made static adequately in one position, thus effecting the control so as to obtain finally the target value on the side of the reticle stage 209, and vice versa.

Figure 22:
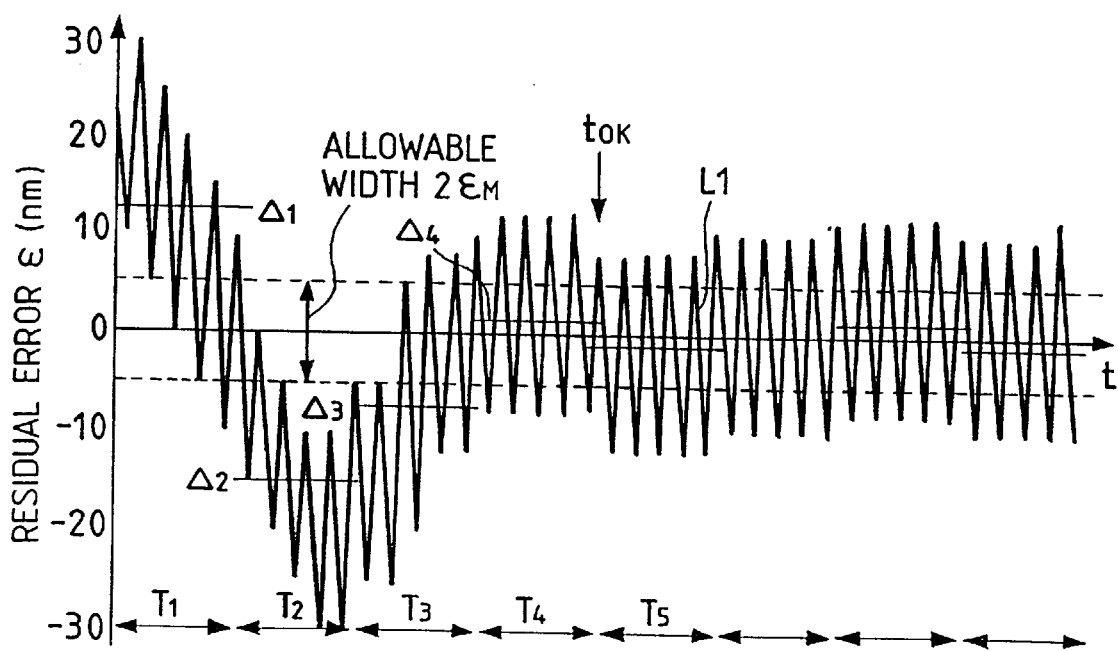
FIG. 22 is a graph showing one example of variations in residual error of a relative position between the reticle and the wafer when positioning is effected in one embodiment of the present invention.

FIG. 22 shows one example of time-variations of the residual error $\epsilon$. Outputs from the interferometers 262, 263 are given forth digitally per 1 ms, and, therefore, a residual error curve L1 is formed by consecutively plotting this versus the time. As illustrated in FIG. 22, the residual error curve L1 greatly fluctuates up and down as a whole while making high-speed oscillations at the beginning of the positioning process but comes to converge with a passage of time. If the mechanical vibrations are intensive, however, the up-and-down fluctuations do not converge within a fixed time, and the final alignment can not be started for a long time according to the prior art alignment apparatus as the case may be.

Then, in accordance with this embodiment, an average value $\Delta$ per predetermined fixed time is to be obtained. In FIG. 22, time intervals $T_1, T_2, \ldots, T_5, \ldots$ sequentially show time zones of a fixed time T. The average values $\Delta$ of the residual errors e at the time intervals $T_1, T_2, \ldots, T_5, \ldots$ are respectively expressed by $\Delta_1, \Delta_2, \ldots, \Delta_5, \ldots$. For instance, it is assumed that there are N-pieces of residual errors $\epsilon$ calculated from the measured values digitally outputted at the time interval $T_1$. Let $\epsilon_1 - \epsilon_N$ be the respective values of N-pieces of residual errors $\epsilon$, and the average value $\Delta_1$ is given by the following equation:

$$\text{Average Value } \Delta_1 = \left(\sum_{i=1}^{N} \epsilon_i\right) \bigg/ N \quad (8)$$

The average values $\Delta_2, \Delta_3, \ldots$ of the respective residual errors $\epsilon$ are sequentially calculated at the subsequent time intervals $T_2, T_3, \ldots$. Further, an allowable value $\epsilon_M$ (5 nm in this embodiment) of the residual error $\epsilon$ is preset, and, when an absolute value of the average value $\Delta_i$ comes to the allowable value $\epsilon_M$ or under, i.e., when the average value $\Delta_i$ falls within a range of an allowable width $2 \cdot \epsilon_M$ with 0 being centered, it is judged that the positioning process be finished. In the example of FIG. 22, the end of the positioning process is judged by the central control system 264 at a timing $t_{OK}$. The judgement may be actually made by one of the alignment signal processing system 270 and the central control system 264. With a finish of the alignment, the reticle 204 is irradiated with the exposure illumination beam in response to a command from the central control system 264, and a circuit pattern of the reticle 204 is transferred onto a target shot area of the wafer 206.

According to the thus constructed alignment apparatus in this embodiment, the error between the relative positional deviation of the wafer 206 from the reticle 204 and the target value is evaluated by the average value per fixed time. Hence, even if there are the mechanical vibrations of the projection exposure apparatus, the exposure can be started when the vibration center falls within the allowable range with respect to the target position. Therefore, an alignment time is reduced, and the throughput is enhanced. Further, as compared with such an arrangement that the allowable value (window) has hitherto been set relatively large counting in the mechanical vibrations, a smaller window can be set, and hence the positioning accuracy is also enhanced.

Method Using Measured Value of TTR Alignment Sensor

In this case also, as in the case of using the measured value of the interferometer, positioning of the reticle 204 is effected. Thereafter, the reticle mark 235A on the reticle 204 and the fiducial diffraction grating mark (not shown) on the fiducial mark member 241 are irradiated with the illumination beams from the alignment optical system 201 based on the heterodyne interference method. Then, the reticle beat signal $S_R$ and the wafer beat signal $S_W$ of FIG. 18A are taken in, and a phase difference $\Delta\phi_0$ between the two beat signals is stored as a target phase difference.

Thereafter, the wafer 206 is placed on the wafer stage 261, and a position of the global alignment mark is measured by use of the prealignment sensor 242 of FIG. 14. Coordinates $(X_i, Y_i)$ of each shot area on the wafer 206 is calculated from this measured value.

Then, for example, when exposing the (i)th shot area 247 on the wafer 206, positioning of the shot area 247 in the exposure position is effected at first with an accuracy of less than $\pm\frac{1}{4}$ of the diffraction grating pitch $P_W$ of wafer mark 248A on the basis of the measured value of the wafer mark 248A.

Thereafter, the reticle mark 235A and the wafer mark 248 of FIGS. 15A and 15B are illuminated with the alignment illumination beams by the heterodyne interference method, and the reticle beat signal $S_R$ and the wafer beat signal $S_W$ are outputted respectively from the photoelectric detecting elements 230, 231. The two beat signals $S_R$, $S_W$ are supplied to the alignment signal processing system 270, which in turn detects a phase difference $\Delta\phi$ therebetween. The central control system 264 converts the phase difference $\Delta\phi$ into a relative moving quantity $\Delta x$ on the wafer from the Equation (6). Then, the residual error $\epsilon$ is obtained by subtracting a target value $\Delta x_0$ with which the target phase difference $\Delta\phi_0$ into an on-wafer distance from this relative moving quantity $\Delta x$.

Figure 23:
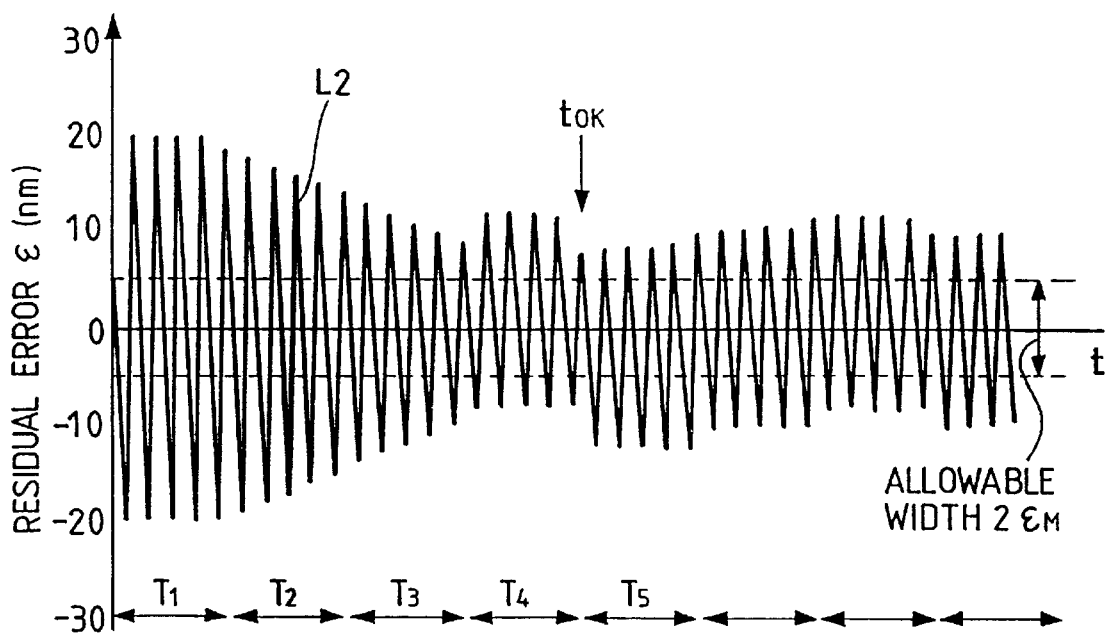
FIG. 23 is a graph showing another example of the variations in a residual error of the relative position between the reticle and the wafer when positioning is effected in one embodiment of the present invention.

FIG. 23 shows time-variations of the residual error $\epsilon$ in this case, wherein the axis of abscissas indicates the time t, while the axis of ordinates indicates the residual error $\epsilon$. Data pick-up conditions and others are the same as those in FIG. 22. In this case also, at first, the average values $\Delta_1, \Delta_2, \Delta_3, \ldots$ of the respective residual errors $\epsilon$ are sequentially obtained at a series of time intervals $T_1, T_2, T_3, \ldots$. FIG. 23 shows an example of great hunting, wherein the series of average values $\Delta_1, \Delta_2, \Delta_3, \ldots$ of a residual error curve L2 are substantially 0, but an amplitude of the fluctuations is large, because the wafer stage initially does not yet get static due to the hunting. Then, in this embodiment, for evaluating the amplitude of the fluctuations, a standard deviation S per fixed time T is calculated. Subsequently, the average value of the residual error $\epsilon$ per fixed time T falls within the allowable range (the width is 2ε), and the standard deviation S comes to a predetermined allowable value $\epsilon_S$ or under. At this time, it is judged that the alignment be finished. For example, supposing that N-pieces of residual errors $\epsilon_1$–$\epsilon_N$ are obtained at the time interval $T_1$, the standard deviation S is expressed by the following equation:

$$S = \sqrt{\frac{\sum_{i=1}^{N}(\varepsilon_i - \Delta_1)^2}{N}} \quad (9)$$

Turning to FIG. 23, it is confirmed by the central control system 264 that the standard deviation S decreases under the standard deviation allowable value $\epsilon_S$ at the timing $t_{OK}$ immediately after the time interval $T_4$, and the average value Δ of the residual error decreases under the allowable value $\epsilon_M$, and hence the alignment is to be finished. With the finish of the alignment, the reticle 204 is irradiated with the exposure illumination beam in response to the command from the central control system 264, and the circuit pattern of the reticle 204 is transferred onto the target shot area 247 of the wafer 206.

In the example as shown in FIG. 23, irrespective of the large up-and-down fluctuations, the average value in the fixed time falls within the allowable value $\epsilon_M$ from the beginning of the measurement. Accordingly, the exact positioning process can not be done only from the determination of the average value. As in this embodiment, however, the standard deviation in the fixed time is also added to the judgement criterion in addition to the average value in the fixed time. With this addition, even when the reticle 204 and the wafer stage 261 can not be set static, and if so-called hunting is caused, it is recognized that the positioning process is not yet finished even in such a case that the vibration center exists in the target position, and the processing never shifts to the exposing operation.

Note that a difference between a maximum value and a minimum value within the fixed time T may be obtained instead of obtaining the standard deviation S.

Method Using Average Value of n Pieces of Relative Difference and Standard Deviation According to the above-mentioned two methods, when a command for initiating an exposure is not issued for a certain period of time for verification after a quantity of the positional deviation of the wafer stage or a relative differences between the reticle and the wafer falls within the allowable range, and when said deviation quantity or the relative difference is deviated from the allowable range due to external disturbances and the like during said verification period, a judgement on the completion of the positioning process can not be obtained until the verification time has elapsed after the deviation quantity or the relative error falls within the allowable range again. Thus, there arises a problem that a timing for starting the exposure be delayed further.

Figure 27A:
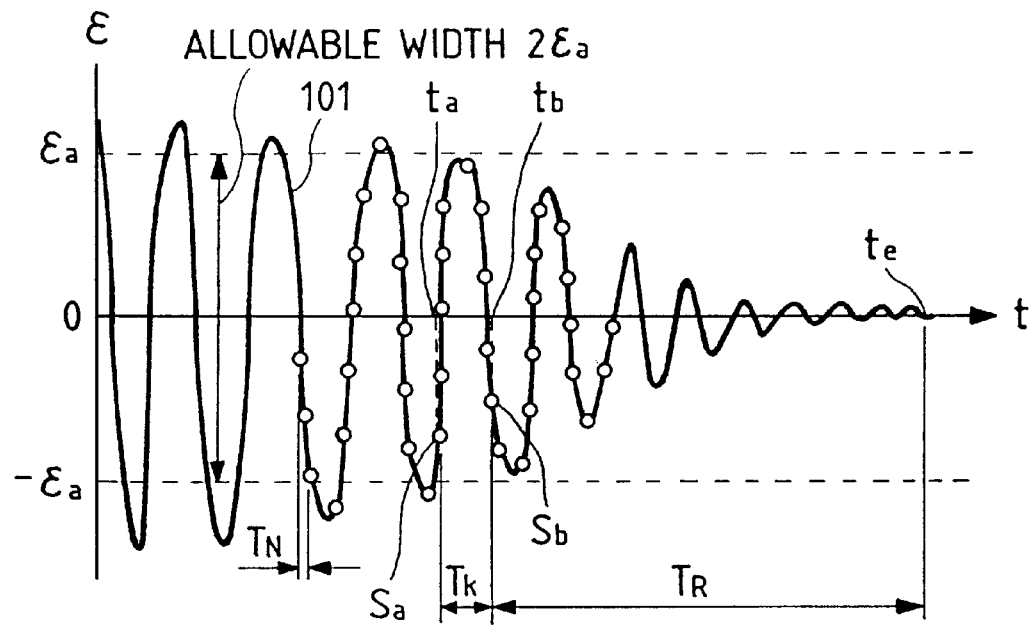
FIGS. 27A and 27B are graphs for explaining a timing for positioning the reticle and the wafer.
Figure 27B:
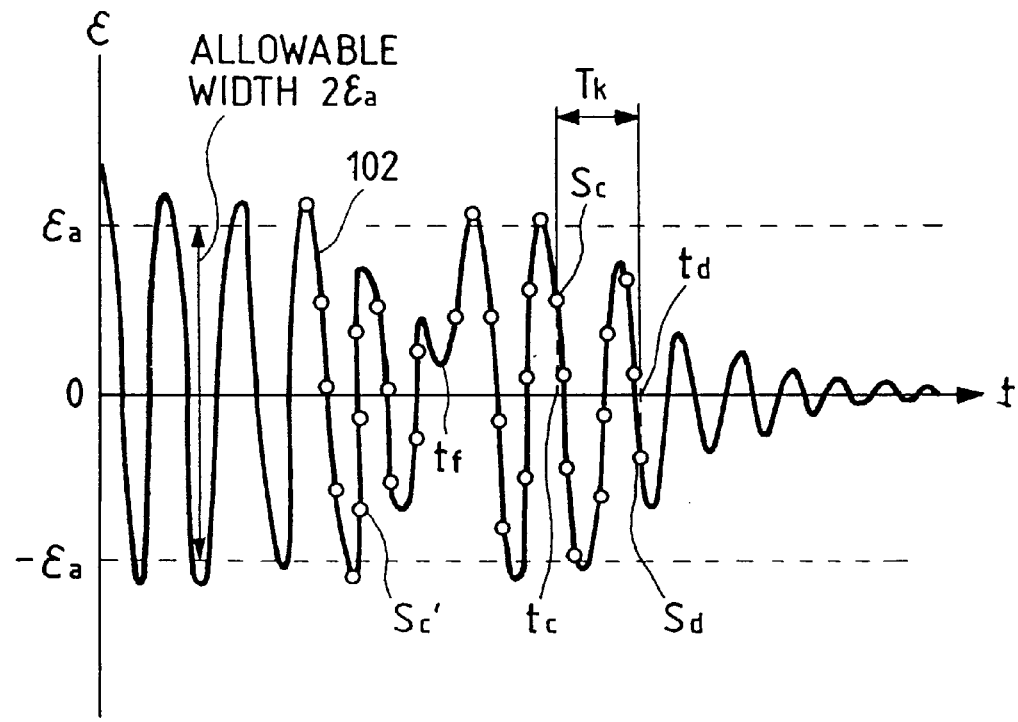

FIGS. 27A and 27B are graphs for explaining a timing of completion of the positioning process in the projection exposure apparatus which is provided with an alignment sensor of the TTR method. FIG. 27A shows a case in which there is no special external disturbance, while FIG. 27B shows a case in which there is external disturbance. In FIGS. 27A and 27B, the abscissa represents the time t and the ordinate the relative difference ε. The symbol 0 in the drawings represents a sampling point of the relative difference ε. The sampling is performed for every predetermined $T_N$ time, and the sampling points are distributed on the wave-like curves 101 and 102 in FIGS. 27A and 27B for showing actual relative differences.

As shown in FIG. 27A, when there is no special external disturbance, the curve 101 is gradually converged to fall within the allowable range $+\epsilon_a$ of the relative difference ε with time while virtually fluctuates. In this case, the time $t_a$ at the sampling point $S_a$ which comes immediately after the relative difference ε falls within the allowable range becomes a starting time for the verification time for the several-th time. The end of the positioning process is judged when the sampling values successively fall under the allowable range for a predetermined number of times (10 times in the case of FIG. 27A) from this verification start time. As a result, a time which is obtained by multiplying the sampling period by said predetermined number of times becomes the verification time $T_K$. Then, in the case shown in FIG. 27A, the positioning is not judged to be completed until at the time $t_b$ at the sampling point $S_b$ which is the predetermined number-th time sampling point from the time $t_a$, and the exposure is conducted during the exposure time $T_R$ from the time $t_b$ to the time $t_e$. Then, when the exposure is ended at the time $t_e$, the next shot area is positioned at the exposing position and the same steps are repeated again.

On the other hand, as shown in FIG. 27B, if external disturbances are applied at the time $t_f$, for example, when the positioning process is effected, if the verification is first started from the sampling point $S_C'$, the relative difference which was once converged is diverged, and exceeds the allowable range $\pm\epsilon_a$ for the second time at the time of the predetermined time-th sampling. Note that a scale of the time axis in FIG. 27B is different from that in FIG. 27A. Then, when the verification is started from the subsequent sampling point $S_C$ (at the time $t_C$), the positioning process is judged to be completed at the sampling point $S_d$ (at the time $t_d$) of the predetermined number-th time, so as to start the exposure. Therefore, it requires a considerable time to start the exposure.

With respect to this, after the wafer stage is driven to roughly position a predetermined shot area in an exposing position on the wafer, a processing time $T_T$ for one shot from the final positioning by driving, for example, the reticle stage to the completion of the exposure is expressed as follows if there are no external disturbances.

Processing time $T_T$ for one shot=Time for positioning the wafer stage+Time for positioning the reticle stage+Positioning verification time $T_K$+Exposure time $T_R$.

Further, since the total processing time per wafer is a product of the processing time $T_T$ for one shot and the number of shot areas on the wafer, a method in which the positioning verification time $T_K$ is required for each shot area has a problem that a lot of time is required for exposing one wafer.

Accordingly, an embodiment described next provides an alignment method in which a time required for judging an end of a positioning process can be reduced without lowering a positioning accuracy.

This method is an alignment method for effecting alignment of a mask with a substrate by driving at least one of a mask stage and a substrate stage in an exposure apparatus comprising the mask stage for holding said mask on which a transfer pattern is formed and the substrate stage for holding said substrate onto which the pattern of said mask is transferred. By said method, at least one of said mask stage and said substrate stage is driven in such as manner that a quantity of a positional displacement between said mask and said substrate reaches a predetermined aimed value, and the positioning process is judged to be completed when an average value of deviation of the positional displacement quantity between said mask and said substrate with respect to said predetermined aimed value falls within a first allowable range and a scatter of said deviation falls within a second allowable range.

According to such an alignment method, since the positioning is effected based on the average value and the scatter of the deviation, even if said deviation slightly exceeds the allowable value for the image deviation at some point, the influence of this point is ignored and a timing for positioning is quickened. Conventionally, when even one of deviations which were sampled during a predetermined verification time (e.g., a positional displacement quantity between the mask stage (9) and the substrate stage (8X, 8Y)) was out of the allowable range, the positioning process was not judged to be completed and a lot of time was required for the positioning process. However, according to the present method, such a verification time can be omitted, so as to improve a throughput (productivity). Also, when, for example, a phenomenon such as hunting occurs, an average value of the deviation for a predetermined time may fall within the allowable range in spite of large vertical vibrations, which causes a large positioning error. However, according to the present method, the end of the positioning process is judged based not only on the average value of the deviation, but also on the scatter thereof so that the alignment can be conducted at a high accuracy without erroneous verification.

In this case, said first allowable range and said second allowable range are preferably set in accordance with the exposure time for said substrate.

Figure 25:
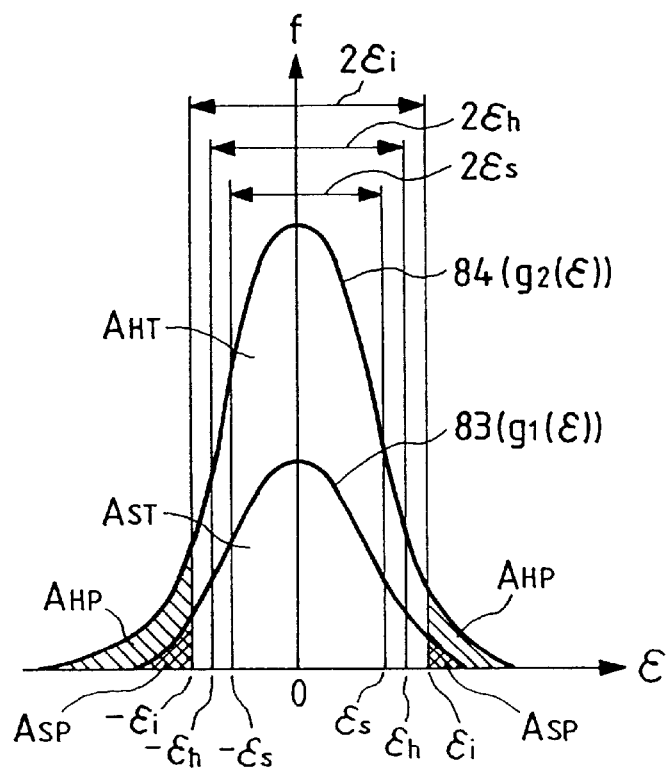
FIG. 25 is a graph showing variations in the distribution of the relative difference depending on the length of the exposure time in the embodiment described last.

For example, if a relative difference $\epsilon$ between the mask and the substrate is used as the deviation, a frequency distribution of the relative difference $\epsilon$ fluctuates in accordance with the exposure time, as shown in FIG. 25. The frequency distribution functions $g_1(\epsilon)$ and $g_2(\epsilon)$ indicate the frequency distributions in two cases in which the exposure time is long and in which it is short, respectively. When the exposure time is long, a rate of the relative difference $\epsilon$ being converged in the vicinity of zero becomes large. Since the exposure accuracy is determined based on the rate of the frequency within the allowable values of the image deviation with respect to the total frequency, if the required exposure accuracy is fixed, the second allowable range, for example, of the present invention can be enlarged when the exposure time is long. Since the allowable range for the scatter of the deviation is set in accordance with the exposure time in this way, the positioning time, for example, for waiting such scatter to be converged into an unnecessarily narrow allowable range is no longer required, so as to improve the throughput.

Also, when a deviation of the quantity of the positional displacement between said mask and said substrate from the predetermined aimed value has a tendency to be further converged, it is preferable to judge the positioning process to be completed.

In this way, the exposure is not started when the deviation has a tendency to be diverged at the time of judgment on the end of the positioning process and, as a result, an oscillation of the deviation is diverged so as to decrease the risk of generating an image deviation.

Next, positioning and exposure operations in this embodiment will be described below. In the following, though description is made only on an X-directional positioning operation, a Y-directional positioning operation is conducted in the same manner.

First, the reticle 204 in FIG. 15A is conveyed onto the reticle stage 209, and the alignment marks 234A, 234B of the reticle 204 shown in FIG. 16 and a frame-like fiducial mark (not shown) on the fiducial mark member 241 on the wafer stage 261 (the X stage 208X and the Y stage 208Y) in FIG. 14 are observed by the reticle alignment microscopes 239 and 240, so as to position the reticle 204. Then, an illuminating light beam is irradiated onto the reticle mark 235A on the reticle 204 and a fiducial diffraction grating mark (not shown) on the fiducial mark member 241 from the alignment optical system 201 of the heterodyne interference method, so as to take in a reticle beat signal $S_R$ and a wafer beat signal $S_W$ shown in FIG. 14. A phase difference $\Delta\phi_0$ between the both beat signals is stored in an aimed phase difference.

After that, the wafer 206 is mounted on the wafer stage 261, the position of a global alignment mark is measured by using the prealignment sensor 242 in FIG. 14, and the coordinates of each shot area on the wafer 206 are calculated from a result of this measurement. Then, the shot area 247, for example, is positioned in an exposing position with an accuracy of less than ±¼ of the grating pitch $P_W$ of the wafer mark 248, by stepping the wafer stage 261. After that, a final alignment is conducted by finely moving the reticle stage 209.

To this end, the reticle mark 235A and the wafer mark 248A in FIG. 15A are illuminated with the alignment illuminating beam light of the heterodyne interference method, and the reticle beat signal $S_R$ and the wafer beat signal $S_W$ are outputted, respectively. Both the beat signals $S_R$ and $S_W$ are supplied to the alignment signal processing system 270, which detects a phase difference $\Delta\phi$ between these signals. Then, the central control system 264 controls an operation of the reticle stage 209 via the reticle stage control system 265 in such manner that said phase difference $\Delta\phi$ is converged to the aimed phase difference $\Delta\phi_0$ stated above and, at the same time, supplies the thus obtained phase difference $\Delta\phi$ to the arithmetic processing system 264A successively. The arithmetic processing system 264A converts said phase difference $\Delta\phi$ into a relative moving quantity $\Delta x$ on the wafer. Then, an aimed value $\Delta x_0$ which is obtained by converting the aimed phase difference $\Delta\phi_0$ into a distance on the wafer is subtracted from said relative moving quantity $\Delta x$, so as to obtain the relative difference $\epsilon$. This operation is conducted at predetermined intervals until the relative difference $\epsilon$ falls within the allowable range and the exposure is ended. In this case, a target shot area 247 is positioned within +¼ of the grating pitch $P_W$ of the wafer mark 248, and the reticle stage 209 is driven so that the number j which indicates the order of sampling is set to 1 assuming that the starting time of a tracking toward the aimed value of the relative difference $\epsilon$ is a starting point of said sampling. Then, a relative difference $\epsilon_j$ (a j-th relative difference) is measured at predetermined intervals, and this relative difference $\epsilon_j$ is successively stored into a calculation buffer which is comprised of a memory in the arithmetic processing system 264A.

Then, when the number of sampling operations reaches a predetermined value n (n=10 in this embodiment), an average value $M_j$ and the standard deviation $\sigma_j$ of n pieces of relative differences $\epsilon_{j-(n-1)}$ to $\epsilon_j$ until that time are obtained successively in the following manner. Further, in order to verify a convergent tendency of the oscillation of the relative difference $\epsilon$, the convergent value $D_j$ is calculated by an equation $D_j=\sigma_j-\sigma_{j-1}$. These calculations are conducted in the arithmetic processing system 264A, and results of the calculations are supplied to the central control system 264. Note that in the following equations, the denominator n in the radical sign may be, for example, (n−1).

$$M_j = (\varepsilon_{j-(n-1)} + \varepsilon_{j-(n-2)} + \ldots + \varepsilon_j)/n \qquad (10)$$

$$\sigma_j = \sqrt{\frac{1}{n}\left\{\sum_{K=1}^{n}(\varepsilon_{j-(K-1)}^2) - nM_j^2\right\}} \qquad (11)$$

Figure 24:
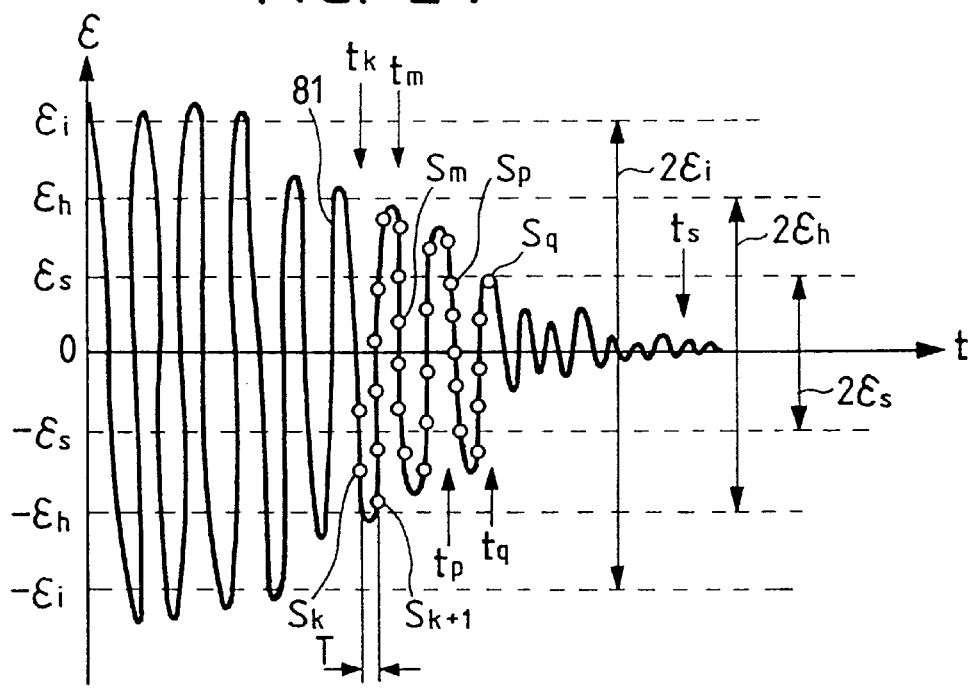
FIG. 24 is a graph showing an example of the variations in the positional relative difference between the reticle and the wafer when the positioning is effected in one embodiment of the present invention.

The wave-like curve 81 in FIG. 24 indicates one example of the fluctuations with passage of time of the relative difference $\epsilon$. The abscissa in FIG. 24 represents the time t and the ordinate the relative difference $\epsilon$. In addition, the symbol 0 on said curve 81 indicates each sampling point. In this FIG. 24, each sampling point is set at a predetermined time interval T (about 2 m sec in this embodiment), as indicated by a time interval between the sampling point $S_K$ and the sampling point $S_{+K1}$.

In FIG. 24, $\epsilon_i$ represents an allowable value for image deviation. If a quantity of a positional displacement between the wafer and the reticle during the exposure exceeds $\epsilon_i$ on the average or becomes smaller than $-\epsilon_i$ (i.e., exceeds $\pm\epsilon_i$), a chip pattern which is cut away from said wafer becomes defective. Also, in the present embodiment, a first allowable value $\epsilon_M$ is set for an average value $M_j$ thereof as a value when the exposure time is short, and the second allowable value $\epsilon_S$ is set for the standard deviation $\sigma_j$. Then, when the average value $M_j$ and the standard deviation $\sigma_j$ which are calculated for each sampling are within a range of $\pm\epsilon_n$ and not more than $\epsilon_S$, respectively, the positioning process is judged to be completed. In other words, an allowable range for the average $M_j$ is $-\epsilon_M$ to $\epsilon_M$ ($2\epsilon_M$ for the width), and an allowable range for the standard deviation $\sigma_j$ is 0 to $\epsilon_S$.

However, when the exposure time is long, said second allowable value $\epsilon_S$ is changed into $\epsilon_h$ ($\epsilon_i > \epsilon_h > \epsilon_S$). Note that $-\epsilon_S$ (or $-\epsilon_h$) is indicated, in addition to the second allowable value $\epsilon_S$ (or $\epsilon_h$) for the standard deviation $\sigma_j$ for convenience of the description, and the width $2\epsilon_S$ thereof (or $2\epsilon_h$) is considered to be substantially the allowable range for the standard deviation $\sigma_j$. In the same manner, the range of $\pm\epsilon_i$ is considered to be the allowable range for the image deviation.

That is, in the present embodiment, the allowable range for the standard deviation is set in accordance with an exposure time. A reason for this will be described with reference to FIG. 25.

FIG. 25 shows frequency distributions of the relative difference $\epsilon$ in two cases having different exposure times, and the abscissa represents the relative difference $\epsilon$ and the ordinate the frequency f. Referring to FIG. 25, the curve 83 indicates the frequency distribution function $g_1$ ($\epsilon$) when the exposure time is short, and the curve 84 indicates the frequency distribution function $g_2$ ($\epsilon$) when the exposure time is long. The exposure accuracy (alignment accuracy) is determined depending on a frequency rate in the allowable range $2\epsilon_i$ ($-\epsilon_i$ to $\epsilon_i$) for the image deviation during the exposure time.

More specifically, in FIG. 25, the exposure accuracy $E_1$ when the exposure time is short can be obtained by an equation: $E_1=k(A_{ST}-A_{SP})/A_{ST}$ by using a predetermined coefficient k, assuming that a total area which is formed between the frequency distribution function $g_1$ ($\epsilon$) and the axis $\epsilon$ is $A_{ST}$ and an area of a grating-like portion in which the relative difference $\epsilon$ of the frequency distribution function $g_1$ ($\epsilon$) exceeds $\pm\epsilon_i$ is $A_{SP}$. In the same manner, the exposure accuracy $E_2$ when the exposure time shown by the curve 84 is long can be obtained by an equation: $E_2=k(A_{HT}-A_{HP})/A_{HT}$, assuming that a total area which is formed between the frequency distribution function $g_2$ ($\epsilon$) and the axis $\epsilon$ is $A_{HT}$ and an area of a portion indicated by the oblique lines (including the grating-like portion) in which the relative difference $\epsilon$ of the frequency distribution function $g_2$ ($\epsilon$) exceeds $\pm\epsilon_i$ is $A_{HP}$.

In the exposure apparatus, as shown in FIG. 24, the relative difference $\epsilon$ is gradually converged usually unless external disturbances are generated or the hunting phenomenon or the like occurs after the tracking for positioning is started. In such a case, a rate of the frequency in the vicinity of the center ($\epsilon$=0) becomes larger as the exposure time becomes longer. In other words, as indicated by the curve 84, there is a peak around the center and a rate of the area of the central portion is large. Also, even when such external disturbance or hunting occurs, if the relative difference $\epsilon$ is converged finally, a rate of the frequency around the center becomes large in proportion to the exposure time. Accordingly, when the same allowable range $2\epsilon_i$ for the image deviation range is adopted when the exposure time is long or short, as stated above, the exposure accuracy is more enhanced as the exposure time is longer. That is, the exposure accuracy $E_2$ is higher than the exposure accuracy $E_1$ ($E_2>E_1$). For this reason, when the allowable value $\epsilon_i$ for the image deviation is constant, it is possible to change the second allowable range for the standard deviation of the, relative difference $\epsilon$ in accordance with the exposure time in order to attain the same exposure accuracy. That is, as shown in FIG. 25, as the second allowable range for the standard deviation when the exposure time indicated by the curve 84 is long, it is possible to employ as the second allowable range for the standard deviation when the exposure time indicated by the curve 84 is long a larger allowable range $2\epsilon_h$ than the second allowable range $2\epsilon_S$ for the standard deviation when the exposure time indicated by the curve 83 is short. Note that the foregoing description was made on the standard deviation of the relative difference $\epsilon$. However, the same can be applied to the average value of the relative difference $\epsilon$. The longer the exposure time is, the wider the first allowable range $2\epsilon_M$ which is an allowable range for the average value of the relative difference $\epsilon$ can be in accordance therewith.

In FIG. 24, two exposure times are set, for convenience of the description, by using abstract expressions such that when the exposure time is short and when the exposure time is long, in accordance with FIG. 25, and two allowable ranges, that is, the second allowable range $2\epsilon_S$ for the short exposure time and the second allowable range $2\epsilon_h$ for the long exposure time with respect to the standard deviation $\sigma_j$ in accordance with the above two cases. However, the second allowable range for the standard deviation in the present embodiment can be freely changed in accordance with the exposure time.

Referring back to FIG. 24, a description will be fully given based on numerical values which are measured actually. In this case, the first allowable value $\epsilon_M$ for the average value is set to, for example, 10 nm, the second allowable value $\epsilon_S$ for the standard deviation (in case that the exposure time is short) to 80 nm, and the second allowable range $\epsilon_h$ (in case that the exposure time is long) to 90 nm or around. As stated before, in the present embodiment, the determination of positioning completion is made based on the average value $M_j$ and the standard deviation $\sigma_j$ of the relative difference $\epsilon$ of ten consecutive sampling points. As shown in FIG. 24, after a tracking by the reticle stage 209 is started, the relative difference $\epsilon_j$ is stored in the buffer for calculation in the arithmetic processing system 264A for each sampling.

For example, it is assumed that measured value of the relative difference $\epsilon$ at the ten sampling points from the sampling point $S_k$ at the time $t_k$ to the sampling point $S_m$ at the time $t_m$ (hereinafter called the "sampling group A") be −100, −110, −105, −40, 20, 70, 110, 105, 80, 30 [nm], respectively. An average value $M_j$ of the relative difference $\epsilon$ of this sampling group A is 6 nm, and the standard deviation $\sigma_j$ is 83.72 nm.

Also, it is assumed that measured values of the relative difference $\epsilon$ at the ten sampling points from the sampling point $S_p$ at the time $t_p$, after passing through a several sampling points from the sampling point $S_m$, to the sampling point $S_q$ at the time $t_q$ (hereinafter called the "sampling group B") are 80, 40, 10, −30, −80, −100, −70, −20, 40, 80 [nm], respectively. An average value of the relative difference $\epsilon$ of this sampling group B is −5 nm, and the standard deviation is 62.01 nm.

As a result of the above measurements, when the exposure time is long, the average value and the standard deviation of the relative difference $\epsilon$ of the sampling group A fall respectively within the first allowable range $2\epsilon_M$ and the second allowable range $2\epsilon_h$, and the positioning process is judged to be completed at the time $t_m$, so as to start the exposure. However, when the exposure time is short, the standard deviation of the sampling group exceeds the second allowable range $2\epsilon_S$ so that the positioning process is not judged to be completed and the sampling of the relative difference $\epsilon$ is continued. Then, since the average value and the standard deviation of the relative difference $\epsilon$ of the sampling group B from the time $t_p$ to time $t_q$ fall within the allowable ranges when the exposure time is short, the positioning process is judged to be completed at the time $t_q$, so as to start the exposure. Then, the exposure for one shot is ended at the time $t_S$, and the process is moved to an operation for positioning the next shot.

In this case, the positioning is judged based on the average value and when the standard deviation of the relative difference $\epsilon$ of one of the ten sampling points slightly exceeds the allowable range $2\epsilon_i$ of the image deviation, the influence of such one point can be ignored. Conventionally, when, for example, even one point exceeded the predetermined allowable range due to external disturbances or the like, the measured values until then were ignored and a longer positioning time was required partly because a verification time was required after the relative difference $\epsilon$ comes within said predetermined allowable range for the second time. However, according to the method of the present embodiment, the verification time can be omitted and a throughput (productivity) of the exposure process can be improved.

Though the average value and the standard deviation of the relative difference $\epsilon$ are monitored in the present embodiment, a convergent value $D_j$ ($=\sigma_j-\sigma_{j-1}$) of the standard difference $\sigma_j$ may be monitored further. In this case, when the convergent value $D_j$ has a tendency to be diverged even if the average value and the standard deviation respectively come within the allowable ranges, that is, in the case of $D_j \geq 0$, the positioning process is not judged to be completed. The end of the positioning process is not judged until the convergent value $D_j$ is in a convergent state (when $D_j < 0$).

With respect to this, the convergent value changes to have a tendency to be divergent in some cases without being convergent from, for example, several points before the sampling point at which the end of the positioning process is judged. In these cases, even when the average value $M_j$ and the standard deviation $\sigma_j$ of the relative difference $\epsilon$ are respectively within the allowable ranges, the convergent value $D_j$ has a tendency to be divergent so that the positioning is not judged to be completed. This is because if the divergent tendency of the relative difference $\epsilon$ is prolonged as it is, such case can be considered in which the relative difference $\epsilon$ continuously exceeds the allowable range $2\epsilon_i$ for the image deviation. Since the convergent condition is always verified by the convergent value $D_j$ in the present embodiment, such risk is reduced.

Full description with respect to this will be given with reference to FIG. 26.

FIG. 26 shows one example of a fluctuation of the relative difference when the stage system is oscillated by hunting or the like. In FIG. 26, the abscissa represents the time t, and the ordinate the relative difference $\epsilon$. As shown in FIG. 26, if the positioning is judged based only on the average value and the standard deviation, the standard deviation becomes 80 nm immediately after the start of the sampling of FIG. 26 or around (when the exposure time is short), and the exposure is judged to be started. However, it is feared in this case that the image deviation may occur. Then, if the convergent tendency of the standard deviation is also judged, the positioning is judged to be completed by the relative difference $\epsilon$ which is measured at ten sampling points from the sampling point $S_r$ to the sampling point $S_W$ (time $t_W$), and the exposure is started without the fear of the image deviation.

Also, since the allowable range of the standard deviation (or the average value) of the relative difference is varied in accordance with the exposure time in this embodiment, if, for example, the exposure time is long, the width of the allowable range may be expanded. As a result, the positioning time can be reduced, thereby improving the throughput.

Though the standard deviation is used as a scatter of the relative difference $\epsilon$ in this embodiment, a difference between the maximum value and the minimum value of the sampling value of, for example, the n-th time until that time may be used as said scatter. In addition, the alignment method of the present invention can be applied to a case in which a final alignment is conducted by slightly moving the wafer stage side.

As described, the present invention is not confined to the present embodiment, but may take a variety of constructions within the scope of the present invention without departing from the gist of the present invention.

According to the present method, since the positioning is conducted based on the average value and the scatter of the deviation, even if, for example, said deviation slightly exceeds the allowable value of the image deviation at some point, the influence of said point is ignored and a verification time for positioning as required conventionally can be omitted, so as to reduce the time for alignment. As the substrate has a lot of shot areas, the alignment for each shot is repeated in order to conduct an exposure of one substrate. As a result, according to the present method, the total exposure time for conducting an exposure of one substrate can be extremely reduced and the throughput (productivity) can be improved.

Also, when a phenomenon such as hunting occurs, though an oscillation of the deviation is large, an average value for a predetermined time may fall within the allowable range is some cases, which may cause a large positioning error.

However, according to the present method, not only the average value of the deviation, but also the scatter thereof is used to judge the end of the positioning process, which brings about an advantage that a positioning can be conducted with a high accuracy. Also, when the total processing time for one shot is not reduced, or when the end of the positioning process is not judged, or when a large value continues for a long time as a value for the scatter of the deviation, the present method is effective for judging poor positioning characteristics of, for example, the substrate stage or the mask stage, or otherwise, finding malfunctional parts of the control system.

Also, when the first allowable range and the second allowable range are set in accordance with the exposure time for the substrate, the allowable range for the average value and the scatter of the deviation is set in accordance with the exposure time. As a result, a positioning time for confining the said value and scatter into an unnecessary range is no longer required and the throughput is improved.

Further, when the deviation from predetermined aimed value for a positional displacement quantity between the mask and the substrate has a tendency to be further converged, if the positioning process is judged to be completed, the exposure is not started when the deviation has a tendency to be diverged at the time of judgement of the positioning. As a result, a risk of causing an image deviation due to an oscillation of the deviation can be reduced.

It is to be noted also that the alignment apparatus of the present invention is applicable to a case of using an alignment sensor by an FIA (Field Image Alignment) method of making a measurement by image-processing an alignment mark illuminated with a beam having a wide wavelength band width with a halogen lamp serving as a light source without being limited to the heterodyne interference alignment sensor based on the TTR method described above.

As discussed above, the present invention is not confined to the above embodiments but may take a variety of constructions within the scope without departing from the gist of the present invention.

What is claimed is:

1. An exposure apparatus for positioning, for each shot provided on a wafer, a pattern formed on a mask with respect to said wafer and also for exposing said pattern on said wafer, comprising:
   a wafer stage carrying said wafer and movable stepwise for said each shot;
   a mask stage carrying said mask and movable;
   a stage control unit, connected to said wafer stage and said mask stage, which makes relative positioning between said wafer and said pattern of said mask and maintains said relative positioning, said stage control unit moving said mask stage to make said relative positioning before said wafer stage is positioned within a predetermined allowable range; and
   an exposure control unit, connected to said stage control unit, which performs exposure while said relative positioning is maintained.

2. The apparatus according to claim 1, wherein said exposure control unit is for performing said exposure when said wafer stage is set at a position in a range corresponding to moving characteristics of said mask stage.

3. An exposure apparatus according to claim 1, wherein at least one of said mask stage and said wafer stage is mechanically connected to said stage control unit.

4. A projection exposure apparatus for positioning, for each shot provided on a wafer, a pattern formed on a mask with respect to said wafer and also for exposing said pattern on said wafer, comprising:
   a wafer stage carrying said wafer and movable stepwise two-dimensionally;
   wafer stage position detecting means for detecting a position of said wafer stage;
   a mask stage carrying said mask and movable two-dimensionally;
   mask stage position detecting means for detecting a position of said mask stage;
   a projection optical system for projecting an image of said pattern of said mask on said wafer;
   first control means for moving stepwise said wafer stage to a predetermined position defined by said each shot;
   memory means for memorizing moving characteristics of said wafer stage according to which said mask stage is moved for said each shot;
   second control means for starting moving of said mask stage at a position of said wafer stage separated by a predetermined length from a predetermined position at which said wafer stage is to be positioned before said wafer stage stops at said predetermined position and also for initiating servo control of said mask stage and said wafer stage when said wafer stage substantially coincides with said mask stage; and
   exposure control means for initiating exposure substantially in synchronism with said servo control before said wafer stage completely stops at said predetermined position of said wafer stage.

5. The apparatus according to claim 4, wherein:
   said memory means is for memorizing drive parameters of said mask stage which are determined by a moving characteristic of said wafer stage per shot and deviation tolerance of said wafer stage from said predetermined position which deviation tolerance correspond to said moving characteristics of said mask stage; and
   said exposure control means is for performing said exposure when said wafer stage comes to a position deviated by less than deviation tolerance from said predetermined position before said wafer stage arrives at said predetermined position.

6. The apparatus according to claim 5, wherein said drive parameters are changeable.

7. The apparatus according to claim 6, said drive parameters allow said deviation tolerance to be changeable.

8. An exposure method of positioning, for each shot on a wafer, a pattern formed on a mask with respect to said wafer and exposing said pattern on said wafer, comprising:
   moving said masks, before said wafer stops at a predetermined exposure position when moving said wafer to said predetermined exposure position, in a direction opposite to a direction of movement of said wafer; and
   making relative positioning between said wafer and said pattern of said mask before said wafer stops and performing an exposure.

9. The method according to claim 8, wherein said exposure is performed when said wafer is positioned in a range corresponding to a moving characteristic of said mask.

10. An exposure method according to claim 8, wherein said pattern is projected onto said wafer by a projection optical system having a predetermined magnification.

11. An exposure method according to claim 10, wherein said mask is moved in accordance with the magnification of said projection optical system.

12. An exposure method according to claim 8, wherein said exposure is effected under a step-and-repeat operation scheme.

13. A wafer on which said pattern has been exposed by the method according to claim 8.

14. An exposure method of exposing a pattern of a mask on a substrate, comprising of:

mounting said substrate on a substrate stage which is movable stepwise two-dimensionally;

mounting said mask on a mask stage which is movable two-dimensionally;

stepwise moving said substrate stage to a predetermined position for each shot;

moving said mask stage based on a moving characteristic of said substrate stage;

making servo control of said mask stage and said substrate stage; and initiating exposure substantially in synchronism with said servo control.

15. The method according to claim 14, further comprising the step of moving said mask stage in a direction of deviation of said substrate stage from said predetermined position based on a moving characteristic of said substrate stage per shot and deviation tolerance between said substrate stage and said predetermined position, said deviation tolerance being defined by a moving characteristic of said mask stage.

16. The method according to claim 15, further comprising the step of interrupting said exposure when said deviation of said substrate stage exceeds said deviation tolerance.

17. An alignment method for conducting alignment between a mask and a substrate method, comprising:

driving at least one of a mask stage and a substrate stage in such a manner that a quantity of a positional displacement between said mask and said substrate reaches a predetermined aimed value; and judging the end of a positioning process when an average value of a deviation of the quantity of the positional displacement between said mask and said substrate with respect to said predetermined aimed value falls within a first allowable range and a scatter of said deviation falls within a second allowable range.

18. An alignment method according to claim 17, wherein said first allowable range and said second allowable range are set in accordance with an exposure time for said substrate.

19. An alignment method according to claim 17, wherein the end of the positioning process is judged when the deviation of the quantity of the positional displacement between said mask and said substrate with respect to said predetermined aimed value has a tendency to be further converged.

20. In an exposure apparatus including a mask stage for holding a mask formed with a transfer pattern and a substrate stage movable in a two-dimensional plane, for holding a substrate on which said transfer pattern is exposed, said exposure apparatus being for exposing said transfer pattern on each exposure area on said substrate by driving said substrate stage and positioning said exposure area on said substrate to an exposure position of said transfer pattern, said exposure apparatus further comprising:

moving system unit for moving said mask stage in directions in which said substrate stage is moved;

substrate stage side position detecting system unit for detecting a position of said substrate stage;

mask stage side position detecting system unit for detecting a position of said mask stage;

first driving system unit for driving said substrate stage to an aimed position to set said exposure area on said substrate to an exposure position;

calculating system unit for adding a substrate stage error which is a difference between said aimed position of said substrate stage and said position of said substrate stage measured by said substrate side position detecting system unit to a difference between an initial aimed position of said mask stage and said position of said mask stage measured by said mask stage side position detecting system unit to obtain an aimed position of said mask stage;

second driving system unit for driving said mask stage to said aimed position of said mask stage; and exposing system unit for exposing said transfer pattern on said substrate when a difference between said aimed position of said mask stage and said position of said mask stage measured by said mask stage side position detecting system unit is smaller than a predetermined tolerance.

21. The apparatus according to claim 20, further comprising starting system unit for causing said second driving system unit to start drive of said mask stage when a substrate stage error which is a difference between said aimed position of said substrate stage and said position of said substrate stage measured by said substrate stage side position detecting system unit is in said predetermined tolerance.

22. The apparatus according to claim 20, further comprising starting system unit for causing said second driving system unit to start drive of said mask stage when a substrate stage error which is a difference between said aimed position of said substrate stage and said position of said substrate stage measured by said substrate stage side position detecting system unit is first reduced to zero.

23. In an exposure apparatus including a mask stage for holding a mask formed with a transfer pattern and a substrate stage movable in a two-dimensional plane, for holding a substrate on which said transfer pattern is exposed, said exposure apparatus being for exposing said transfer pattern on each exposure area on said substrate by driving said substrate stage and positioning said exposure area on said substrate at an exposure position of said transfer pattern, said exposure apparatus further comprising:

moving system unit for moving said mask stage in directions in which said substrate stage is moved;

substrate stage side position detecting system unit for detecting a position of said substrate stage;

first driving system unit for driving said substrate stage to an aimed position to set said exposure area to an exposure position;

alignment system unit for detecting a positional displacement between said transfer pattern and said exposure area on said substrate;

second driving system unit for driving said mask stage to reduce said positional displacement detected by said alignment system unit; and exposing system unit for exposing said transfer pattern on said substrate when said positional displacement is smaller than a predetermined tolerance.

24. A method of positioning an exposure area on a substrate to an exposure position of a transfer pattern and exposing said transfer pattern on said substrate by arranging a mask formed with said transfer pattern and said substrate in this order with respect to an illuminating optical system, said method comprising:

(1) holding said mask on a movable mask stage;
(2) holding said substrate on a movable substrate stage;
(3) detecting a positional relationship between a position of a projection image of a pattern of said mask on said substrate before exposure and a position of said exposure area on said substrate and calculating an aimed position of said substrate state to match said exposure area with said exposure position;
(4) setting an initial aimed position of said mask stage;
(5) moving said substrate stage so that a present position of said substrate stage approaches said aimed position of said substrate stage;
(6) adding a substrate stage error which is a difference between said aimed position of said substrate stage and said present position of said substrate stage to a difference between said initial aimed position of said mask stage and said present position of said mask stage and calculating an aimed position of said mask stage;
(7) moving said mask stage so that a present position of said mask stage approaches said aimed position of said mask stage;
(8) repeating the steps (6) and (7); and
(9) exposing said transfer pattern on said substrate when a difference between said aimed position of said mask stage and said present position of said mask stage is smaller than a predetermined tolerance.

25. The method according to claim 24, wherein said moving of said mask stage is initiated after a substrate stage error which is a difference between said aimed position of said substrate stage and said present position of said substrate stage is in a predetermined allowance.

26. The method according to claim 24, wherein said moving of said mask stage is initiated after a substrate stage error which is a difference between said aimed position of said substrate stage and said present position of said substrate stage first crosses zero.

27. A method of positioning an exposure area on a substrate to an exposure position of a transfer pattern and exposing said transfer pattern on said substrate by arranging a mask formed with said transfer pattern and said substrate in this order with respect to an illuminating optical system, said method comprising:

(1) holding said mask on a movable mask stage;
(2) holding said substrate on a movable substrate stage;
(3) detecting a positional relationship between a position of a projection image of a pattern of said mask on said substrate before exposure and a position of said exposure area on said substrate and calculating an aimed position of said substrate stage to match said exposure area with said exposure position;
(4) moving said substrate stage so that a present position of said substrate stage approaches said aimed position of said substrate stage;
(5) detecting a positional displacement between said transfer pattern of said mask and said exposure area on said substrate to be exposed;
(6) moving said mask stage to reduce said positional displacement; and
(7) exposing said transfer pattern on said substrate when said positional displacement is smaller than a predetermined tolerance.

28. An exposure apparatus for exposing an image of a pattern of a mask to a substrate, said exposure apparatus comprising:

a first moving device which moves a mask stage which carries said mask;
a first detecting system, optically connected to said mask stage, which detects a position of said mask stage;
a second moving device which moves a substrate stage which carries said substrate;
a second detecting system, optically connected to said substrate stage, which detects a position of said substrate stage; and
a control unit, connected to said first and second detecting systems, which causes said mask stage and said substrate stage to move in directions opposite to each other before said mask stage and said substrate stage stop at their respective exposure positions, and performs an exposure when an alignment error which is a difference between said mask and said substrate falls within an allowance.

29. An exposure apparatus according to claim 28, further comprising:

a protection system which is disposed between said mask and said substrate, and which projects said pattern of said mask onto said substrate.

30. An exposure apparatus according to claim 29, wherein said control unit controls said mask stage based on a magnification of said projection system.

31. An exposure apparatus according to claim 29, wherein said projection system projects said pattern optically.

32. An exposure apparatus for exposing an image of a pattern of a mask to a substrate, said exposure apparatus comprising:

a first moving device which moves a mask stage which carries said mask;
a first detecting system, optically connected to said mask stage, which detects a position of said mask stage;
a second moving device which moves a substrate stage which carries said substrate;
a second detecting system, optically connected to said substrate stage, which detects a position of said substrate stage;
a controller, connected to said first and second detecting systems, which controls said mask stage via said first moving device in a direction opposite to a direction of movement of said substrate stage so that an error of a relative position between sail mask and said substrate is reduced; and
an exposure control unit which performs said exposure while moving said mask stage and said substrate stage, in response to a control of said controller.

33. An exposure apparatus according to claim 32, further comprising:

a projection system which is disposed between said mask and said substrate, and which projects said pattern of said mask onto said substrate.

34. An exposure apparatus according to claim 33, wherein said controller controls said mask stage based on a magnification of said projection system.

35. An exposure apparatus according to claim 33, wherein said projection system projects said pattern optically.

36. An exposure apparatus according to claim 32, wherein said exposure apparatus is a step-and-repeat type exposure apparatus.

37. An exposure apparatus according to claim 28, wherein said exposure apparatus is a step-and-repeat type exposure apparatus.

38. An alignment apparatus, mounted on a projection exposure apparatus for projecting an image through a projection optical system for an on-mask transfer pattern onto a photosensitive substrate placed on a two-dimensionally-movable substrate stage, for aligning the substrate with the mask, said apparatus comprising:

a sensor for detecting a relative positional deviation quantity between the mask and the substrate; and a calculator for sequentially obtaining an average value, per predetermined time, of the relative positional deviation quantity detected by said sensor, wherein when the average value falls within a predetermined allowable range, it is determined that a positioning process is completed.

39. The alignment apparatus according to claim 38, wherein said sensor has:

a mask-side laser interferometer for detecting a moving quantity of a mask stage mounted with the mask;

a substrate-side laser interferometer for detecting a moving quantity of a substrate stage; and said sensor obtaining a difference between a measured value of said mask-side laser interferometer and a mask-side converted measured value of said substrate-side laser interferometer.

40. The alignment apparatus according to claim 38, wherein said sensor is an alignment system for detecting a positional deviation quantity between an alignment mark formed on the mask and an alignment mark formed on the substrate through the projection optical system.

41. The alignment apparatus according to claim 38, wherein said sensor is an alignment system based on a heterodyne interference method, said alignment system comprising:

an irradiation optical system for irradiating a diffraction grating alignment mark formed on the mask and a diffraction grating alignment mark formed on the substrate with a couple of light beams having frequencies different from each other;

photoelectric detector for generating mask-side beat signals and substrate-side beat signals by converting heterodyne beams respectively generated by the diffractions at the mask-side alignment mark and the substrate-side alignment mark; and phase comparing system for detecting a phase difference between the mask-side beat signal and the substrate-side beat signal.

42. An alignment apparatus, mounted on a projection exposure apparatus for projecting an image through a projection optical system for an on-mask transfer pattern onto a photosensitive substrate placed on a two-dimensionally-movable substrate stage, for aligning the substrate with the mask, said apparatus comprising:

a sensor for detecting a relative positional deviation quantity between a mask and a substrate; and a calculator for sequentially obtaining a scatter and an average value, per predetermined time, of the relative positional deviation quantity detected by said sensor, wherein when the average value falls within a predetermined allowable range, and when the scatter comes to a predetermined allowable value or under, it is determined that the positioning process is completed.

43. The alignment apparatus according to claim 42, wherein said sensor has:

a mask-side laser interferometer for detecting a moving quantity of a mask stage mounted with the mask;

a substrate-side laser interferometer for detecting a moving quantity of a substrate stage; and said sensor obtaining a difference between a measured value of said mask-side laser interferometer and a mask-side converted measured value of said substrate-side laser interferometer.

44. The alignment apparatus according to claim 42, wherein said sensor is an alignment system for detecting a positional deviation quantity between an alignment mark formed on the mask and an alignment mark formed on the substrate through the projection optical system.

45. The alignment apparatus according to claim 42, wherein said sensor is an alignment system based on a heterodyne interference method, said alignment system comprising:

an irradiation optical system for irradiating a diffraction grating alignment mark formed on the mask and a diffraction grating alignment mark formed on the substrate with a couple of light beams having frequencies different from each other;

photoelectric detector for generating mask-side beat signals and substrate-side beat signals by converting heterodyne beams respectively generated by the diffractions at the mask-side alignment mark and the substrate-side alignment mark; and phase comparing system for detecting a phase difference between the mask-side beat signal and the substrate-side beat signal.

46. An exposure method of positioning, for each shot provided on a substrate, a pattern formed on a mask with respect to said substrate and also of exposing said pattern on said substrate, comprising the steps of:

moving said substrate to perform positioning of said substrate, when moving said mask before said substrate is positioned within a predetermined allowable range to make relative positioning between said pattern of said mask and said substrate; and initiating an exposure while moving said mask and said substrate.

47. An exposure method according to claim 46, wherein the movement of said mask is performed during a deceleration of said substrate.

48. A method for making an exposure apparatus which transfers a pattern of a mask onto an object, comprising:

providing a mask stage, which is movable, to hold said mask;

providing a first moving device which moves said mask stage;

providing a first detecting system, optically connected to said mask stage, which detects a position of said mask stage;

providing an object stage, which is movable, to hold said object;

providing a second moving device which moves said object stage;

providing a second detecting system, optically connected to said object stage, which detects a position of said object stage;

providing a controller, connected to said first and second detecting systems, which moves said mask stage and said object stage in directions opposite to each other via said first moving device and said second moving device;

providing an exposure control unit which performs an exposure while moving said mask stage and said object stage, in response to control of said controller.

49. A method according to claim 48, further comprising:
providing a projection system which is disposed between said mask stage and said object stage, and which projects said pattern of said task onto said object.

50. A method according to claim 49, wherein said control unit controls said mask stage based on a magnification of said projection system via said first moving device.

51. A method according to claim 49, wherein said projection system projects said pattern optically.

52. A method according to claim 48, wherein said exposure apparatus is a step-and-repeat type exposure apparatus.

53. An object on which said pattern has been transferred by an exposure apparatus manufactured by the method according to claim 48.

\* \* \* \* \*